United States Patent
Mikami et al.

(10) Patent No.: US 11,159,741 B2
(45) Date of Patent: Oct. 26, 2021

(54) IMAGING DEVICE AND METHOD, IMAGE PROCESSING DEVICE AND METHOD, AND IMAGING ELEMENT

(71) Applicant: Sony Group Corporation, Tokyo (JP)

(72) Inventors: Takuya Mikami, Tokyo (JP); Yoshitaka Miyatani, Tokyo (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 17/040,956

(22) PCT Filed: Mar. 15, 2019

(86) PCT No.: PCT/JP2019/010765
§ 371 (c)(1),
(2) Date: Sep. 23, 2020

(87) PCT Pub. No.: WO2019/188396
PCT Pub. Date: Oct. 3, 2019

(65) Prior Publication Data
US 2021/0029303 A1 Jan. 28, 2021

(30) Foreign Application Priority Data
Mar. 30, 2018 (JP) .............................. JP2018-068049

(51) Int. Cl.
*H04N 5/243* (2006.01)
*H04N 5/232* (2006.01)

(52) U.S. Cl.
CPC ......... *H04N 5/243* (2013.01); *H04N 5/23229* (2013.01)

(58) Field of Classification Search
CPC .... H04N 5/243; H04N 5/23229; H04N 5/225; H04N 5/335; H04N 9/04; H04N 5/30; H04N 5/232; H01L 27/146
See application file for complete search history.

(56) References Cited

U.S. PATENT DOCUMENTS

2005/0052561 A1 3/2005 Altice, Jr. et al.
2008/0002900 A1* 1/2008 Miki ...................... G06T 5/003
382/254
(Continued)

FOREIGN PATENT DOCUMENTS

WO 2018012492 A1 1/2018

OTHER PUBLICATIONS

Seung Ah Lee et al. "A Smartphone-Based Chip-Scale Microscope Using Ambient Illumination", Lab on a Chip, vol. 14, No. 16, Jan. 1, 2014 (Jan. 1, 2014), pp. 3056-3063, XP055680660, ISSN: 1473-0197, DOI: 10.1039/C4LC00523F.
(Continued)

*Primary Examiner* — Hung H Lam
(74) *Attorney, Agent, or Firm* — Michael Best & Friedrich LLP

(57) ABSTRACT

An imaging device and method with improved white balance control are disclosed. An image of an object is captured by an imaging element that includes a plurality of pixel output units that receives incident light that is incident without passing through either of an imaging lens and a pinhole. Each pixel output unit outputs one detection signal indicating an output pixel value modulated by an incident angle of the incident light, and on the basis of a detection signal acquired by the image capturing and acquired in the pixel output units, a white balance coefficient that is used for correcting a white balance of a restored image restored from the detection signal is set. The present disclosure can be applied to, for example, an imaging element, an imaging device, an image processing device, an electronic device, a system, or the like.

20 Claims, 35 Drawing Sheets

(56) References Cited

U.S. PATENT DOCUMENTS

2014/0085509 A1* 3/2014 Ichikawa ........... H04N 5/23229
                                                    348/231.99
2017/0013243 A1* 1/2017 Fujiwara ................ H04N 5/243
2017/0193642 A1* 7/2017 Naruse .................... H04N 9/646
2020/0314325 A1* 10/2020 Miyatani ............ H04N 5/23216

OTHER PUBLICATIONS

Extended European Search Report dated Mar. 11, 2021 for corresponding European Application No. 19776717.1.

* cited by examiner

IMAGING DEVICE AND METHOD, IMAGE PROCESSING DEVICE AND METHOD, AND IMAGING ELEMENT

TECHNICAL FIELD

The present technology relates to an imaging device and method, an image processing device and method, and an imaging element, and particularly to an imaging device and method, an image processing device and method, and an imaging element which enable white balance control to be performed more easily.

BACKGROUND ART

Conventionally, an imaging element is generally used in combination with an imaging lens that focuses light on the imaging element. The imaging lens guides light from an object plane to each pixel of the imaging element so as to reproduce a light intensity distribution of the object plane, so that the imaging element can acquire a detection signal of the level corresponding to the light intensity distribution in each pixel, and can acquire in its entirety a captured image of the object.

However, in this case, the physical size increases. Accordingly, an imaging element that does not use an imaging lens has been considered (see, for example, Patent Document 1, Patent Document 2, and Non-Patent Document 1). An imaging device to which such an imaging element is applied restores a restored image by performing, for example, a predetermined calculation on a detection image generated by the imaging element.

Incidentally, in the imaging device, in order to correct the color tone of a captured image, a process called white balance control is performed in some cases to correct a white reference in the captured image in consideration of influence of the color of light in the imaging environment. The white balance control is performed by using, for example, a ratio of integrated values acquired by integrating RGB pixel values for every color in a wide range to some extent.

CITATION LIST

Patent Document

Patent Document 1: WO 2016/123529
Patent Document 2: Japanese Translation of PCT International Application Publication No. 2016-510910

Non-Patent Document

Non-Patent Document 1: M. Salman Asif, four others, "Flatcam: Replacing lenses with masks and computation", "2015 IEEE International Conference on Computer Vision Workshop (ICCVW)", 2015, pp. 663 to 666.

SUMMARY OF THE INVENTION

Problems to be Solved by the Invention

However, in a case where the white balance control is performed by such a method in an imaging device to which an imaging element not using an imaging lens is applied as described in Patent Document 1, Patent Document 2, and Non-Patent Document 1, a restored image is restored from a detection image acquired with the imaging element, and the white balance is controlled by using a ratio of integrated values acquired by integrating RGB pixel values for every color in a wide range to some extent in the restored image, which requires complicated processing.

The present disclosure has been made in view of such circumstances, and is to make it possible to more easily perform white balance control.

Solutions to Problems

An imaging device according to one aspect of the present technology is an imaging device including an imaging element that includes a plurality of pixel output units that receives incident light that is incident without passing through either of an imaging lens and a pinhole and each outputs one detection signal indicating an output pixel value modulated by an incident angle of the incident light, and a coefficient setting unit that, on the basis of a detection signal acquired in the pixel output units of the imaging element, sets a white balance coefficient that is used for correcting a white balance of a restored image restored from the detection signal.

An imaging method according to one aspect of the present technology is an imaging method including capturing an image of an object by an imaging element that includes a plurality of pixel output units that receives incident light that is incident without passing through either of an imaging lens and a pinhole and each outputs one detection signal indicating an output pixel value modulated by an incident angle of the incident light, and on the basis of a detection signal acquired by the image capturing and acquired in the pixel output units of the imaging element, setting a white balance coefficient that is used for correcting a white balance of a restored image restored from the detection signal.

An image processing device according to another aspect of the present technology is an image processing device including a coefficient setting unit that sets a white balance coefficient on the basis of a detection signal acquired by capturing an image of an object by an imaging element that includes a plurality of pixel output units that receives incident light that is incident without passing through either of an imaging lens and a pinhole and each outputs one detection signal indicating an output pixel value modulated by an incident angle of the incident light, in which the detection signal is acquired in the pixel output units, and the white balance coefficient is used for correcting a white balance of a restored image restored from the detection signal.

An image processing method according to another aspect of the present technology is an image processing method including setting a white balance coefficient on the basis of a detection signal acquired by capturing an image of an object by an imaging element that includes a plurality of pixel output units that receives incident light that is incident without passing through either of an imaging lens and a pinhole and each outputs one detection signal indicating an output pixel value modulated by an incident angle of the incident light, in which the detection signal is acquired in the pixel output units, and the white balance coefficient is used for correcting a white balance of a restored image restored from the detection signal.

An imaging element according to still another aspect of the present technology is an imaging element including a plurality of pixel output units that receives incident light that is incident without passing through either of an imaging lens and a pinhole and each outputs one detection signal indicating an output pixel value modulated by an incident angle of the incident light, and a coefficient setting unit that, on the basis of a detection signal acquired in the pixel output units, sets a white balance coefficient that is used for correcting a white balance of a restored image restored from the detection signal.

In the imaging device and method according to one aspect of the present technology, an image of an object is captured by an imaging element that includes a plurality of pixel output units that receives incident light that is incident without passing through either of an imaging lens and a pinhole and each outputs one detection signal indicating an output pixel value modulated by an incident angle of the incident light, and on the basis of a detection signal acquired by the image capturing and acquired in the pixel output units of the imaging element, a white balance coefficient is set that is used for correcting a white balance of a restored image restored from the detection signal.

In the image processing device and method according to another aspect of the present technology, a white balance coefficient is set on the basis of a detection signal acquired by capturing an image of an object by an imaging element that includes a plurality of pixel output units that receives incident light that is incident without passing through either of an imaging lens and a pinhole and each outputs one detection signal indicating an output pixel value modulated by an incident angle of the incident light, in which the detection signal is acquired in the pixel output units, and the white balance coefficient is used for correcting a white balance of a restored image restored from the detection signal.

The imaging element according to still another aspect of the present technology includes a plurality of pixel output units that receives incident light that is incident without passing through either of an imaging lens and a pinhole and each outputs one detection signal indicating an output pixel value modulated by an incident angle of the incident light, and a coefficient setting unit that, on the basis of a detection signal acquired in the pixel output units, a white balance coefficient that is used for correcting a white balance of a restored image restored from the detection signal.

Effects of the Invention

According to the present technology, it is possible to capture an image of an object or process an image. Further, according to the present technology, white balance control can be performed more easily.

MODE FOR CARRYING OUT THE INVENTION

Hereinafter, modes for carrying out the present disclosure (hereinafter referred to as embodiments) will be described. Note that the description will be made in the following order.

1. White balance control
2. First embodiment (imaging element)
3. Second embodiment (imaging device)
4. Third embodiment (image processing device)

5. Fourth embodiment (image processing system)
6. Fifth embodiment (another configuration example of imaging element or imaging device)
7. Appendix 1. White Balance Control <White Balance Control>

Conventionally, as described in Patent Document 1, Patent Document 2, and Non-Patent Document 1 for example, there have been imaging elements that do not use an imaging lens (also referred to as imaging lens-free imaging element). An imaging device to which such an imaging lens-free imaging element is applied restores a restored image by performing, for example, a predetermined calculation on a detection image generated by the imaging element.

Incidentally, in the imaging device, in order to correct the color tone of a captured image, a process called white balance control (adjustment) is performed in some cases to correct a white reference in the captured image in consideration of influence of the color of light in the imaging environment. The white balance control is performed by using, for example, a ratio of integrated values acquired by integrating RGB pixel values for every color in a wide range to some extent.

Figure 1:
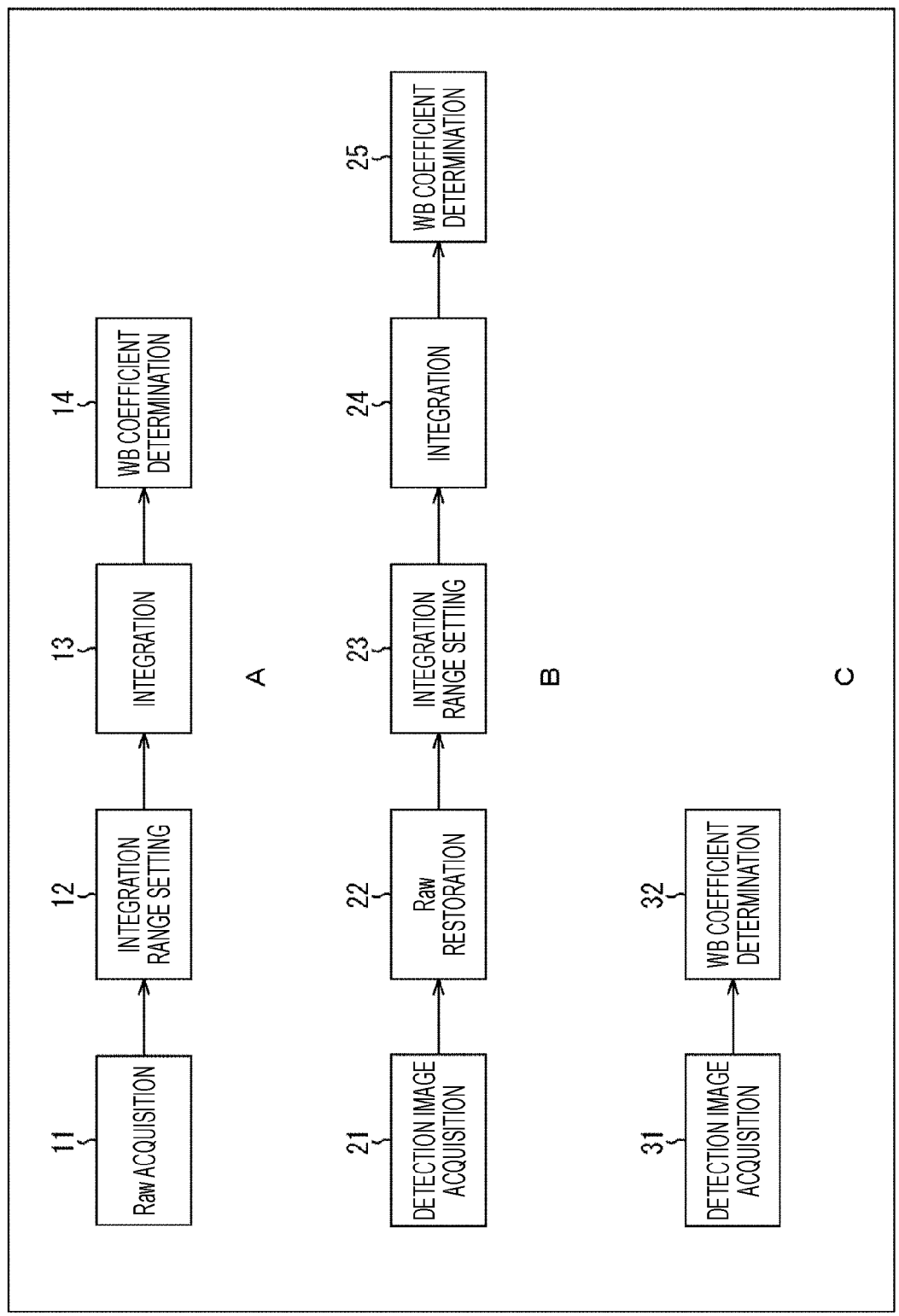
FIG. 1 is a diagram describing an example of a processing flow up to white balance control.

For example, in a case of an imaging element using a conventional imaging lens, as illustrated in A of FIG. 1, when a Raw image is acquired by the imaging element (Raw acquisition 11), on the Raw image, processes such as integration range setting 12 that is a process of setting a range for integrating pixel values, integration 13 that is a process of integrating pixel values for every color in a set range, and WB coefficient determination 14 that is a process of calculating a white balance coefficient (also referred to as WB coefficient) used for white balance control by using a ratio of acquired integrated values are performed on the Raw image. The white balance of the captured image (Raw image) is controlled using this WB coefficient.

On the other hand, in a case where the white balance control is performed by such a method in an imaging device to which the imaging lens-free imaging element is applied as described in Patent Document 1, Patent Document 2, and Non-Patent Document 1, a restored image is restored from a detection image acquired with the imaging element, and the white balance is controlled by using a ratio of integrated values acquired by integrating RGB pixel values for every color in a wide range to some extent in the restored image, which requires complicated processing.

For example, as illustrated in B of FIG. 1, when a detection image is acquired by the imaging element (detection image acquisition 21), a restored image (Raw image) is restored from the detection image (Raw restoration 22), and processes such as an integration range setting 23 that is a process similar to the integration range setting 12, integration 24 that is a process similar to the integration 13, and WB coefficient determination 25 that is a process similar to the WB coefficient determination 14 are performed on this Raw image. The white balance of the restored image (Raw image) is controlled using this WB coefficient. That is, in this case, it has been necessary to restore the restored image.

<White Balance Control in Imaging Element that does not Use Imaging Lens>

Accordingly, on the basis of a detection signal, the white balance coefficient used to correct the white balance of a restored image restored from a detection image formed by the detection signal is set.

For example, an imaging device includes an imaging element that includes a plurality of pixel output units that receives incident light that is incident without passing through either of an imaging lens and a pinhole and each outputs one detection signal indicating an output pixel value modulated by an incident angle of the incident light, and a coefficient setting unit that, on the basis of a detection signal acquired in the pixel output units of the imaging element, sets a white balance coefficient that is used for correcting a white balance of a restored image restored from a detection image formed by the detection signal.

In order to calculate the WB coefficient, information of an object in a sufficiently wide range within the angle of view is required. In a case of the imaging element using the conventional imaging lens, light from the object in a narrow range is detected in each pixel, and thus it is necessary to integrate pixel values in a sufficiently wide range.

For example, a pixel value R of a red (R) pixel (R pixel), a pixel value G of a green (G) pixel (G pixel), and a pixel value B of a blue (B) pixel (B pixel) are used to calculate the WB coefficient for the pixel value R and the WB coefficient for the pixel value B as in the following formulas (1) and (2).

$$\text{WB coefficient for pixel value } R = \text{integrated value of all pixel values } G/\text{integrated value of all pixel values } R \quad (1)$$

$$\text{WB coefficient for pixel value } B = \text{integrated value of all pixel values } G/\text{integrated value of all pixel values } B \quad (2)$$

Then, as in the following formulas (3) and (4), white balance control is performed by multiplying the captured image (pixel value R and pixel value B) by these WB coefficients.

$$\text{Pixel value } R \text{ after white balance control} = \text{pixel value } R \times WB \text{ coefficient for pixel value } R \quad (3)$$

$$\text{Pixel value } B \text{ after white balance control} = \text{pixel value } B \times WB \text{ coefficient for pixel value } B \quad (4)$$

On the other hand, in a case of an imaging lens-free imaging element, light from almost all objects within the angle of view is detected at each pixel. That is, each detection signal includes information that is substantially equivalent to the integrated value of all pixel values of the imaging element using an imaging lens. Therefore, in the case of this imaging element, the WB coefficient can be calculated from this detection signal (pixel value of the detection image) without restoring the restored image.

That is, it is not necessary to restore the restored image. Furthermore, since it is possible to acquire information that is substantially equivalent to the integrated value of all pixel values of the imaging element using an imaging lens from each detection signal, it is not necessary to integrate the detection signal (pixel value), and is it not necessary to set the integration range. In other words, the processing required for calculating the WB coefficient is only processing for detection image acquisition 31 and WB coefficient determination 32, as in C of FIG. 1. Therefore, the WB coefficient can be calculated more easily. That is, the white balance control can be performed more easily.

Therefore, it is possible to suppress an increase in processing load related to the white balance control. Thus, not only an increase in processing time and power consumption can be suppressed, but also a utilization rate of hardware resources can be reduced. Therefore, it is possible to suppress an increase in hardware manufacturing cost. Moreover, it can be expected to facilitate development and design of a device or the like to which the white balance control is applied. Therefore, it is possible to suppress an increase in development period and cost.

In addition, since it is unnecessary to restore the restored image, the WB coefficient can be calculated earlier and the white balance control can be performed earlier. For example, it is possible to respond (provide a control result) to a white balance control instruction from the user or the like at higher speed. Therefore, it is possible to suppress a decrease in user satisfaction due to a time lag from the input of an instruction to the response.

2. First Embodiment

<Imaging Element>

Figure 2:
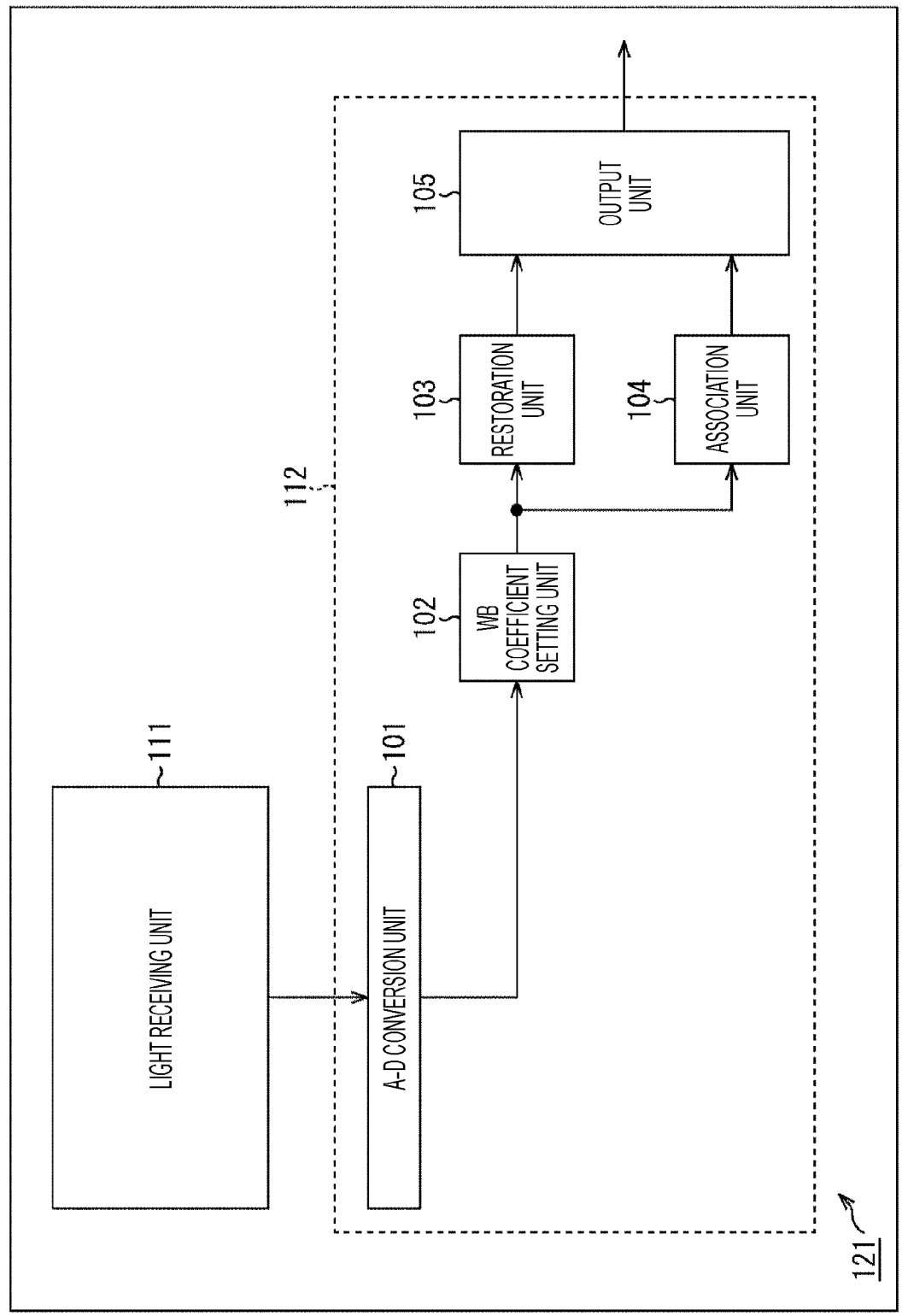
FIG. 2 is a block diagram illustrating a main configuration example of an imaging element to which a technique of the present disclosure is applied.

FIG. 2 is a block diagram illustrating a main configuration example of an imaging element to which the present technology as described above is applied. The imaging element 121 illustrated in FIG. 2 is configured to perform processing related to imaging of an object. For example, the imaging element 121 captures an image of an object and acquires data (electronic data) related to the captured image. At this time, the imaging element 121 can capture the image of the object without passing through an imaging lens, an optical filter or the like such as a diffraction grating, or a pinhole or the like, and can acquire data with respect to the captured image. For example, the imaging element 121 captures the image of the object, and acquires data (detection signal or the like) from which data of the captured image can be acquired by a predetermined calculation.

Note that in the present description, the captured image is an image that is formed by pixel values with which an image of the object is formed and that can be visually observed and recognized as an image by the user. On the other hand, an image (referred to as a detection image) formed by a detection signal that is a detection result of incident light in a pixel unit output of the imaging element 121 is an image that cannot be recognized as an image when visually observed by the user (that is, the object cannot be visually recognized) because the image of the object is not formed. That is, the detection image is an image different from the captured image. However, as described above, by performing a predetermined calculation on data of the detection image, it is possible to restore the captured image, that is, the image in which an image of the object is formed and which can be visually observed and recognized as an image (that is, the object can be visually recognized) by the user. This restored captured image is referred to as a restored image. That is, the detection image is different from the restored image.

Further, in the present description, an image that constitutes the restored image and is an image before synchronization processing, color separation processing, and the like (for example, demosaic processing or the like) is also referred to as a Raw image. This Raw image is also an image that can be visually observed and recognized as an image (that is, the object can be visually recognized) by the user, similarly to the captured image. In other words, the detection image is an image according to the color filter array, but is different from the raw image.

However, in a case where the imaging element 121 has sensitivity only to invisible light such as infrared light or ultraviolet light for example, the restored image (Raw image or captured image) is an image that cannot be visually observed and recognized as an image (the object cannot be visually recognized) by the user. However, since this is due to the wavelength range of the detected light, the restored image can be changed to an image in which the object can be visually recognized by converting the wavelength range to a visible light range. On the other hand, in the detection image, since the image of the object is not formed, it is not possible to be changed to an image in which the object is visually recognizable by simply changing the wavelength range. Therefore, even when the imaging element 121 has sensitivity only to invisible light, an image acquired by performing a predetermined operation on the detection image as described above is referred to as a restored image. Note that in the following, unless otherwise specified, the present technology will be described using an example of a case where basically the imaging element 121 receives visible light.

That is, the imaging element 121 can capture the image of an object and acquire data related to the detection image.

In such an imaging element 121, there is provided a plurality of pixel output units that receives incident light that is incident without passing through either of an imaging lens and a pinhole and each outputs one detection signal indicating an output pixel value modulated by an incident angle of the incident light, and there is provided a coefficient setting unit that, on the basis of the detection signals acquired in the pixel output units, sets a white balance coefficient that is used for correcting a white balance of a restored image restored from a detection image formed by the detection signal.

In this manner, as described above, the white balance control can be performed more easily.

As illustrated in FIG. 2, the imaging element 121 has a light receiving unit 111 and another processing unit 112. The light receiving unit 111 and the other processing unit 112 may be formed on the same semiconductor substrate or may be formed on different semiconductor substrates from each other. For example, a semiconductor substrate on which the light receiving unit 111 is formed and a semiconductor substrate on which the other processing unit 112 is formed may be stacked.

The light receiving unit 111 has a pixel matrix formed by a plurality of pixels (pixel output units) and, in each pixel, receives light from an object and photoelectrically converts the light, accumulates charges according to the incident light, and outputs the charges as a detection signal at a predetermined timing. The plurality of pixels includes three types of pixels, for example, R pixels, G pixels, and B pixels.

As illustrated in FIG. 2, the other processing unit 112 includes an A-D conversion unit 101, a WB coefficient setting unit 102, a restoration unit 103, an association unit 104, and an output unit 105.

The A-D conversion unit 101 performs A-D conversion of the detection signal of an analog signal output from the light receiving unit 111 and supplies it to the WB coefficient setting unit 102 as a detection signal of digital data. Note that a configuration of this A-D conversion unit 101 is arbitrary. For example, the A-D conversion unit 101 may be configured by one A-D conversion unit, and the detection signals of all pixels of the light receiving unit 111 may be A-D converted by this one A-D conversion unit. Further, for example, the A-D conversion unit 101 may have an A-D conversion unit for every column or every row of the pixel matrix of the light receiving unit 111, and may perform A-D conversion of detection signals read from pixels in each column or each row by using the A-D conversion unit of the column or row. Further, for example, the A-D conversion unit 101 may have an A-D conversion unit for every area of the pixel matrix of the light receiving unit 111, and may perform A-D conversion of detection signals read from pixels in each area by using the A-D conversion unit of this area. Furthermore, for example, the A-D conversion unit 101 may have an A-D conversion unit for every pixel of the light receiving unit 111, and may perform A-D conversion of a detection signal read from each pixel by using the A-D conversion unit of this pixel.

The WB coefficient setting unit 102 sets a WB coefficient on the basis of the supplied detection signal. For example, using a detection signal R of an R pixel, a detection signal G of a green G pixel, and a detection signal B of a B pixel, a WB coefficient WB_R for the pixel value R and the WB coefficient WB_B for the pixel value B are calculated as in the following formulas (5) and (6).

$$WB\_R = \text{detection signal } G/\text{detection signal } R \quad (5)$$

$$WB\_B = \text{detection signal } G/\text{detection signal } B \quad (6)$$

For example, when G=200, R=160, and B=100, WB_R=1.25 and WB_B=2. In this manner, the WB coefficient can be calculated from detection signals by a simple calculation.

Further, as indicated in formulas (5) and (6), in this case, integration of the detection signals is unnecessary. That is, the WB coefficient can be calculated from a (single) detection signal of each pixel of each color (each of RGB).

Of course, the detection signals of a plurality of pixels for every color (that is, a plurality of detection signals R, a plurality of detection signals G, and a plurality of detection signals B) may be used for calculating the WB coefficient. In that case, it is only required to apply integrated values of these detection signals to the detection signals of the above-described formulas (5) and (6).

That is, the WB coefficient setting unit 102 can set the white balance coefficient on the basis of the detection signal acquired in a part of the plurality of pixels (pixel output units) included in the imaging element 121 (light receiving unit 111). The pixels (pixel output units) of this part may include at least one pixel output unit for each color.

Further, for calculating this WB coefficient, detection signals of not only the RGB pixels but also pixels to which filters of other wavelengths such as cyan and yellow for example are applied may be used. Also in that case, similarly to the case of RGB described above, the WB coefficient for each color can be acquired using a ratio of detection signals for every color as in formula (5) and formula (6). That is, the WB coefficient can be calculated by a simple calculation. Note that in a case where the detection signals of a plurality of pixels for every color are used for calculating the WB coefficient, it is only required to calculate an integrated value of detection signals for every color, similarly to those of RGB, and apply the integrated value for every color to formula (5) and formula (6). That is, the WB coefficient can be calculated by a simple calculation using the ratio of the integrated value for every color. Further, in a case of using detection signals of pixels to which filters of a complementary color system such as cyan, magenta, and yellow are applied, the WB coefficients may be calculated using formula (5) or (6) after converting detection signals of respective colors of the complementary color system into detection signals of RGB.

The WB coefficient setting unit 102 sets a value calculated as described above as a WB coefficient, and supplies the set WB coefficient to the restoration unit 103 and the association unit 104 together with the detection signal (detection image).

The restoration unit 103 is configured to perform processing related to generation of the restored image. For example, the restoration unit 103 generates the restored image by performing a predetermined calculation on data (detection signal or the like) related to the supplied detection image, using a restoration matrix that is included in advance.

At that time, the restoration unit 103 uses the WB coefficient set by the WB coefficient setting unit 102 to perform white balance control of the restored image. For example, the restoration unit 103 may correct a coefficient of the restoration matrix using the WB coefficient set by the WB coefficient setting unit 102 (for example, multiply the coefficient of the restoration matrix by the WB coefficient), and may restore the restored image with a corrected white balance from the detection image by using the restoration matrix with the corrected coefficient.

Further, for example, the restoration unit 103 may restore the restored image from the detection image using the restoration matrix, and correct a pixel value of the restored image, which has been restored, using the WB coefficient set by the WB coefficient setting unit 102 (for example, multiply each pixel value of the restored image by the WB coefficient), to thereby perform the white balance control of the restored image.

The restoration unit 103 supplies the restored image on which the white balance control has been performed as output data to the output unit 105. Note that the restoration unit 103 may further perform, for example, arbitrary image processing such as gamma correction ($\gamma$ correction) on the restored image. Further, the restoration unit 103 may convert the format of data of the restored image or, for example, compress the restored image by a predetermined compression method such as Joint Photographic Experts Group (JPEG), Tagged Image File Format (TIFF), or Graphics Interchange Format (GIF).

The association unit 104 is configured to perform processing related to data association. For example, the association unit 104 associates the WB coefficient supplied from the WB coefficient setting unit 102 with data (detection signal or the like) related to the detection image supplied from the WB coefficient setting unit 102.

Here, the term "associate" means that, for example, when one piece of information (data, command, program, or the like) is processed, the other piece of information can be used (linked). That is, the pieces of information associated with each other may be combined as one file or the like, or may each be individual information. For example, information B associated with information A may be transmitted on a transmission path different from that for the information A. Further, for example, information B associated with information A may be recorded in a recording medium different from that for the information A (or another recording area of the same recording medium). Note that the "association" may be for a part of information instead of the entire information. For example, an image and information corresponding to the image may be associated with each other in an arbitrary unit such as a plurality of frames, one frame, or a part of the frame.

The association unit 104 supplies the associated data as output data to the output unit 105. Note that the association unit 104 may further associate data related to the detection image with information used in a predetermined calculation for generating the restored image, such as the restoration matrix for example.

The output unit 105 outputs the output data supplied from the restoration unit 103 or the output data supplied from the association unit 104 to the outside of the imaging element 121.

In this manner, the imaging element 121 can more easily acquire the WB coefficient, and can more easily perform the white balance control of the detection image.

Note that either one of the restoration unit 103 and the association unit 104 may be omitted. That is, only one of the restoration unit 103 and the association unit 104 may be formed in the imaging element 121.

<On Imaging Element>

Next, the imaging element 121 will be described with reference to FIGS. 3 to 21.

<Pixel and Pixel Output Unit>

In the present description, the present technology will be described using the term "pixel" (or "pixel output unit"). In the present description, a "pixel" (or a "pixel output unit") refers to a divided unit of a region (also referred to as a pixel region) in which a physical configuration for receiving incident light of the imaging element 121 is formed, the divided unit including at least one physical configuration capable of receiving light independent from other pixels. The physical configuration capable of receiving light is, for example, a photoelectric conversion element and is, for example, a photodiode (PD). The number of physical configurations (for example, photodiodes) formed in one pixel is arbitrary, and may be one or more. The type, size, shape, and the like thereof are also arbitrary.

Further, the physical configuration of this "pixel" unit includes not only the above-mentioned "physical configuration capable of receiving light" but also includes, for example, all physical configurations related to reception of incident light, such as an on-chip lens, a light shielding film, a color filter, a flattening film, an anti-reflection film, and the like. Moreover, a configuration such as a readout circuit may be included. That is, this physical configuration of the pixel unit may be any configuration.

Further, a detection signal read from the "pixel" (that is, the physical configuration of the pixel unit) may also be referred to as "detection signal of pixel unit (or pixel output unit)" or the like. Moreover, this detection signal of the pixel unit (or pixel output unit) will also be referred to as "pixel unit detection signal (or pixel output unit detection signal)". Further, this pixel unit detection signal will also be referred to as "pixel output". Furthermore, the value will also be referred to as "output pixel value".

The imaging element 121 includes a plurality of pixel output units that receives incident light that is incident without passing through either of an imaging lens and a pinhole, and each outputs one detection signal indicating an output pixel value modulated by an incident angle of the incident light. Therefore, the value of the detection signal of the pixel unit (output pixel value) of the imaging element 121 can have an incident angle directivity indicating a directivity with respect to an incident angle of incident light from an object independently of others. For example, each pixel unit (pixel output unit) of the imaging element 121 has a configuration in which the incident angle directivity indicating a directivity of the output pixel value with respect to an incident angle of incident light from an object is independently settable. In other words, in the imaging element 121, the incident angle directivities of the output pixel values of at least two pixel units can be different from each other.

Note that since the number of "physical configurations capable of receiving light" included in the "pixel (or pixel output unit)" is arbitrary as described above, the pixel unit detection signal may be a detection signal acquired by a single "physical configuration capable of receiving light" or may be detection signals acquired by a plurality of "physical configurations capable of receiving light".

Further, a plurality of the pixel unit detection signals (output pixel values) can be combined into one at an arbitrary stage. For example, the output pixel values of a plurality of pixels may be added in a state of an analog signal, or may be converted into a digital signal and then added.

Further, after this detection signal is read from the imaging element 121, that is, in the detection image, a plurality of detection signals can be combined into a single detection signal, or a single detection signal can be converted into a plurality of detection signals. That is, the resolution (the number of data) of the detection image is variable.

Incidentally, in the following description, for convenience of description, unless otherwise specified, the imaging element 121 will be described as having a pixel region (that is, a light receiving unit 111) in which a plurality of pixels is arranged in a matrix (a pixel array is formed). Note that the arrangement pattern of the pixels (or pixel output units) of the imaging element 121 is arbitrary, and is not limited to this example. For example, the pixels (or pixel output units) may be arranged in a honeycomb structure. Further, for example, the pixels (or pixel output units) may be arranged in one row (or one column). That is, the imaging element 121 may be a line sensor.

Note that the wavelength range to which (the pixels of) the imaging element 121 have sensitivity is arbitrary. For example, (the pixels of) the imaging element 121 may have sensitivity to visible light, or may have sensitivity to invisible light such as infrared light or ultraviolet light, or may have sensitivity to both visible light and invisible light. For example, in a case where the imaging element detects far-infrared light that is invisible light, a thermograph (an image representing a heat distribution) can be generated using a captured image acquired by the imaging element. However, in a case of an imaging element with an imaging lens, since it is difficult for glass to transmit far-infrared light, an expensive imaging lens including a special material is required, which may increase the manufacturing cost. Since the imaging element 121 can capture an image of an object without passing through an imaging lens or the like and can acquire data related to the captured image, by having the pixels capable of detecting far-infrared light, increase in the manufacturing cost can be suppressed. That is, far-infrared light imaging can be performed at lower cost (a thermograph can be acquired at lower cost). Note that in a case where (the pixels of) the imaging element 121 have sensitivity to invisible light, the restored image does not become an image in which the user can visually observe and recognize an object, but becomes an image in which the user cannot visually recognize the object. In other words, the restored image may be an image of visible light or an image of invisible light (for example, (far) infrared light, ultraviolet light, or the like).

<Incident Angle Directivity>

As described above, the imaging element 121 can acquire detection signals of a plurality of pixel output units (a plurality of pixel output unit detection signals). Then, the incident angle directivities of at least two pixel output unit detection signals may be different from each other.

Here, the "incident angle directivity" refers to light receiving sensitivity characteristics according to the incident angle of incident light, that is, detection sensitivity to the incident angle of incident light. For example, even if the incident light has the same light intensity, the detection sensitivity may change depending on the incident angle.

Such a bias in the detection sensitivity (including cases where there is no bias) is referred to as "incident angle directivity".

For example, when incident lights having the same light intensity are incident on the physical configuration of the two pixel output units at the same incident angles as each other, the signal levels (detection signal levels) of the detection signals of respective pixel output units may be values different from each other depending on the respective incident angle directivities. The imaging element 121 (each pixel output unit thereof) has a physical configuration having such characteristics.

This incident angle directivity may be achieved by any method. For example, the incident angle directivity may be achieved by providing a general, for example, light shielding film on a front side (light incident side) of a photoelectric conversion element (photodiode or the like) of an imaging element having a basic structure similar to an imaging element such as a complementary metal oxide semiconductor (CMOS) imaging sensor, or the like.

When an image is captured only by a general imaging element including pixels having the same incident angle directivities, light having substantially the same light intensity is incident on all pixels of the imaging element, and a formed image of an object cannot be acquired. Therefore, in general, an imaging lens or a pinhole is provided on a front side (light incident side) of the imaging element. For example, by providing an imaging lens, light from the object plane can be formed on the imaging plane of the imaging element. Therefore, the imaging element can acquire a detection signal of a level corresponding to the formed image of the object at each pixel (that is, the imaging element can acquire a captured image of the object whose image is formed). However, in this case, the size becomes physically large, and it may be difficult to reduce the size of the device. Further, in a case where the pinhole is provided, the size can be reduced as compared with a case where the imaging lens is provided. However, since the amount of light incident on the imaging element is reduced, measures such as elongating the exposure time or increasing the gain are necessary. Therefore, it has been possible that blurring is likely to occur in high-speed imaging of an object, or color expression becomes unnatural.

On the other hand, the imaging element 121 includes a plurality of pixel output units that receives incident light that is incident without passing through either of an imaging lens and a pinhole, and each outputs one detection signal indicating an output pixel value modulated by an incident angle of the incident light. Note that the incident angle directivities of respective pixel output units may be different from each other (the light receiving sensitivity characteristic according to the incident angle of incident light is different for every pixel output unit), or ones having the same light receiving sensitivity characteristics may be included in part of pixels, or part of pixels may have different light receiving sensitivity characteristics.

Figure 3:
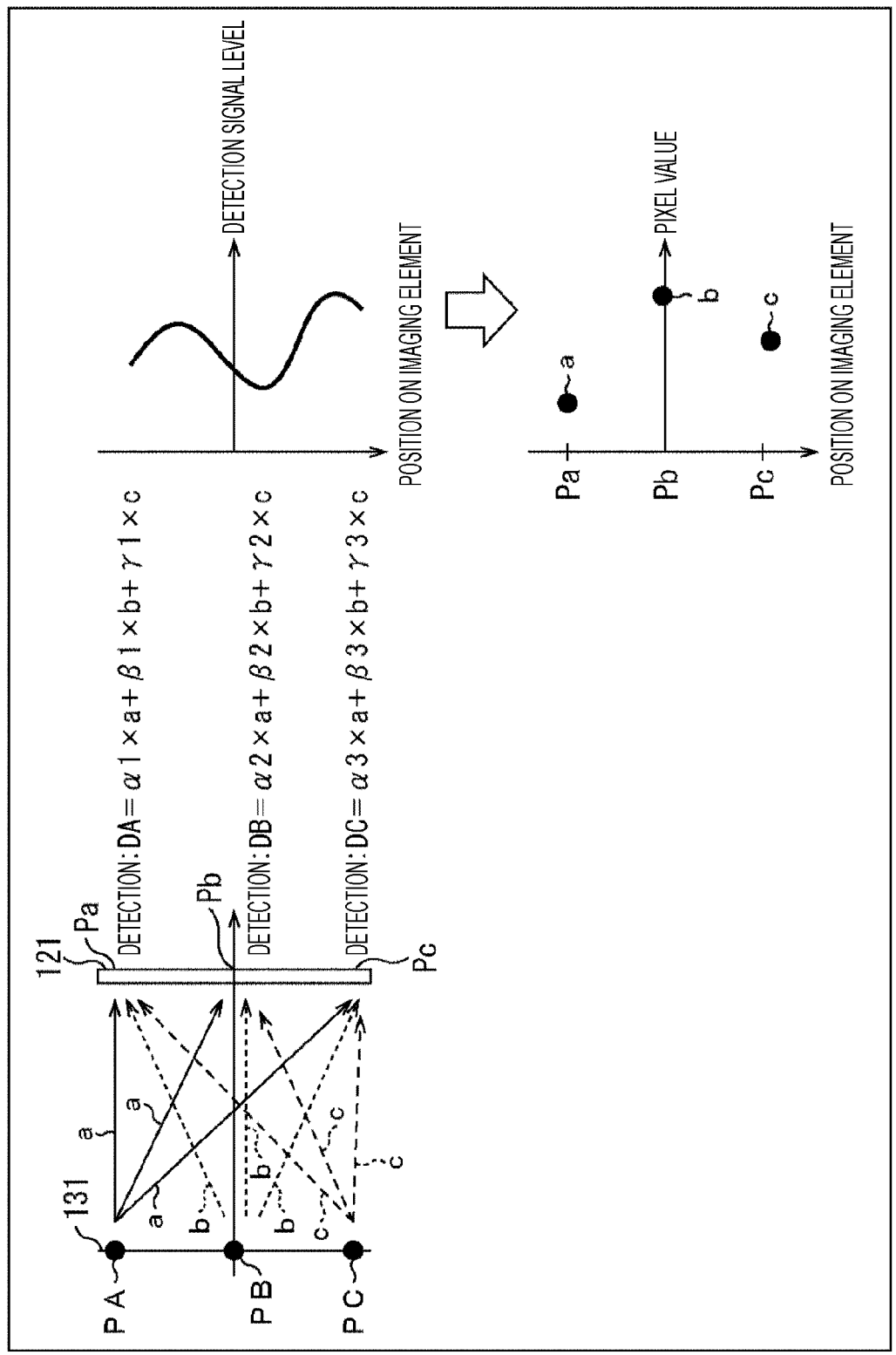
FIG. 3 is a diagram describing a principle of imaging by the imaging element.

For example, in FIG. 3, assuming that a light source forming an object plane 131 is a point light source, in the imaging element 121, light rays of the same light intensity emitted from the same point light source are incident on all the pixels, but they are incident at different incident angles in every pixel. Then, since the respective pixels of the imaging element 121 have different incident angle directivities, the light rays having the same light intensity are detected with different sensitivity. That is, a detection signal having a different signal level is detected for every pixel.

More specifically, the sensitivity characteristic according to the incident angle of incident light received at each pixel of the imaging element 121, that is, the incident angle directivity according to the incident angle at each pixel is represented by a coefficient representing the light receiving sensitivity according to the incident angle, and the signal level of the detection signal according to the incident light at each pixel (also referred to as a detection signal level) is acquired by multiplying by a coefficient set according to the light receiving sensitivity according to the incident angle of the incident light.

More specifically, as illustrated in the upper left part of FIG. 3, detection signal levels DA, DB, and DC at positions Pa, Pb, and Pc are represented by the following formulas (7) to (9), respectively.

[Mathematical Formula 1]

$$DA = \alpha 1 \times a + \beta 1 \times b + \gamma 1 \times c \tag{7}$$

$$DB = \alpha 2 \times a + \beta 2 \times b + \gamma 2 \times c \tag{8}$$

$$DC = \alpha 3 \times a + \beta 3 \times b + \gamma 3 \times c \tag{9}$$

Here, α1 is a coefficient that is set according to the incident angle of a light ray from a point light source PA on the object plane 131 to be restored at the position Pa on the imaging element 121. Further, β1 is a coefficient that is set according to the incident angle of a light ray from a point light source PB on the object plane 131 to be restored at the position Pa on the imaging element 121. Moreover, γ1 is a coefficient that is set according to the incident angle of a light ray from a point light source PC on the object plane 131 to be restored at the position Pa on the imaging element 121.

As illustrated in formula (7), the detection signal level DA at the position Pa is represented by the sum (combined value) of the product of light intensity "a" of the light ray from the point light source PA at the position Pa and the coefficient α1, the product of light intensity "b" of the light ray from the point light source PB at the position Pa and the coefficient β1, and the product of light intensity "c" of the light ray from the point light source PC at the position Pa and the coefficient γ1. In the following, coefficients αx, βx, and γx (x is a natural number) are collectively referred to as a coefficient set.

Similarly, a coefficient set α2, β2, and γ2 of formula (8) is a coefficient set that is set according to the incident angles of light rays from the point light sources PA, PB, and PC on the object plane 131 to be restored at the position Pb on the imaging element 121. That is, the detection signal level DB at the position Pb is, as in the above formula (8), represented by the sum (combined value) of the product of light intensity "a" of the light ray from the point light source PA at the position Pb and the coefficient α2, the product of light intensity "b" of the light ray from the point light source PB at the position Pb and the coefficient β2, and the product of light intensity "c" of the light ray from the point light source PC at the position Pb and the coefficient γ2. Further, coefficients α3, β3, and γ3 of formula (9) are a coefficient set that is set according to the incident angles of light rays from the point light sources PA, PB, and PC on the object plane 131 to be restored at the position Pc on the imaging element 121. That is, the detection signal level DC at the position Pc is, as in the above formula (9), represented by the sum (combined value) of the product of light intensity "a" of the light ray from the point light source PA at the position Pc and the coefficient α3, the product of light intensity "b" of the light ray from the point light source PB at the position Pc and the coefficient β3, and the product of light intensity "c" of the light ray from the point light source PC at the position Pc and the coefficient γ3.

As described above, these detection signal levels are different from those for an image in which an image of the object is formed because light intensities of the light rays emitted from the respective point light sources PA, PB, and PC are intermingled. That is, the detection signal level illustrated in an upper right part of FIG. 3 is not a detection signal level corresponding to an image (captured image) in which an image of the object is formed, and thus is different from that of a pixel value illustrated in a lower right part of FIG. 3 (generally the two do not match).

However, by forming a simultaneous equation using the coefficient set α1, β1, and γ1, the coefficient set α2, β2, and γ2, and the coefficient set α3, β3, and γ3 and the detection signal levels DA, DB, and DC, and solving a simultaneous equation of above-described formulas (7) to (9) using a, b, and c as variables, pixel values at the respective positions Pa, Pb, and Pc as illustrated in the lower right part of FIG. 3 can be acquired. Thus, the restored image (the image in which the image of the object is formed), which is a set of pixel values, is restored.

With such a configuration, the imaging element 121 can output one detection signal indicating an output pixel value modulated by an incident angle of the incident light in each pixel without requiring an imaging lens, an optical filter including a diffraction grating or the like, a pinhole, or the like. As a result, an imaging lens, an optical filter including a diffraction grating or the like, a pinhole, or the like is not a necessary component, and thus it is possible to lower the height of the imaging device, that is, reduce the thickness in the light incident direction in a configuration for achieving an imaging function.

<Formation of Incident Angle Directivity>

Figure 4:
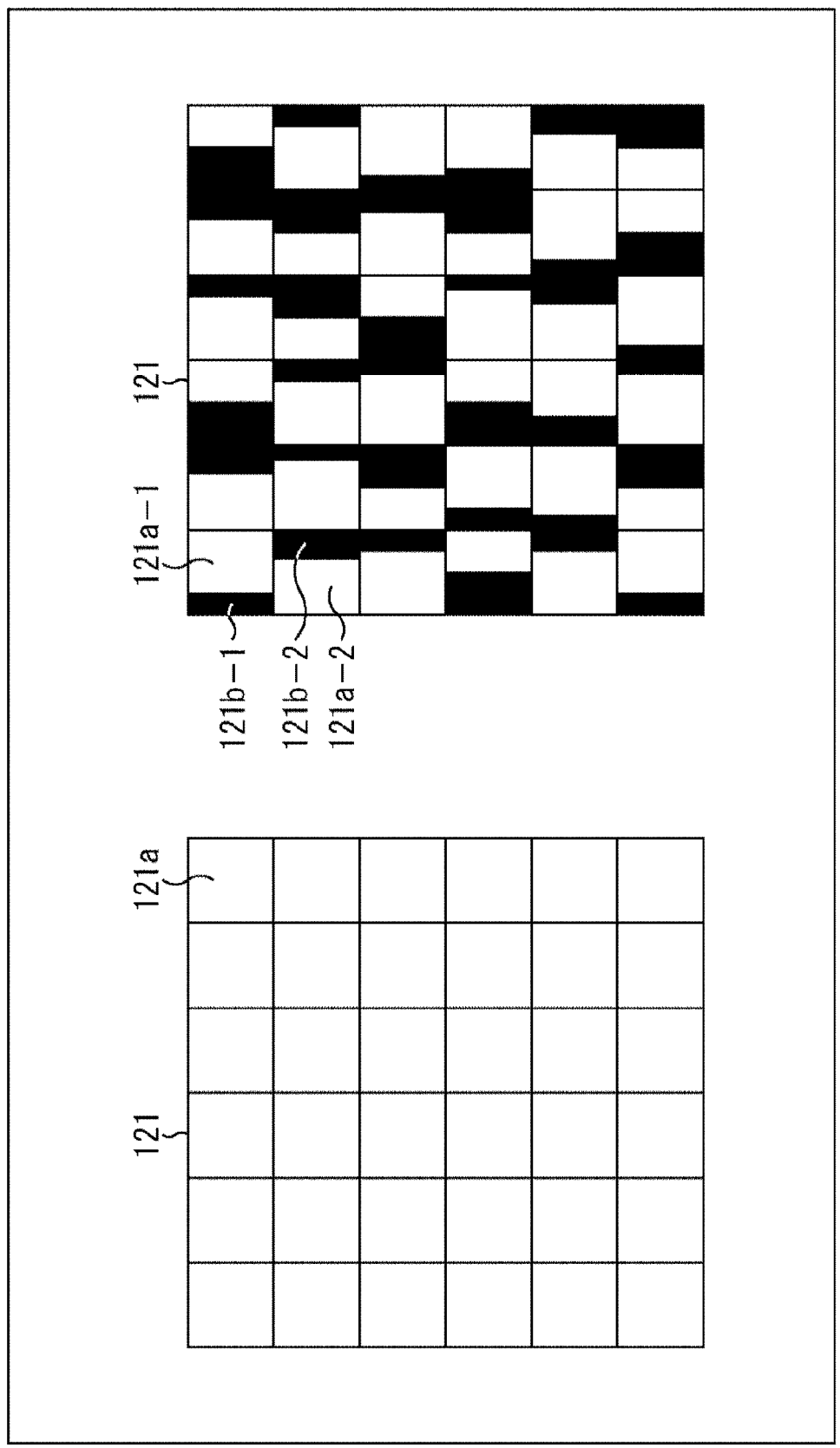
FIG. 4 is a diagram describing a difference in configuration between a conventional imaging element and the imaging element of the present disclosure.

A left part of FIG. 4 illustrates a front view of a portion of a pixel array unit of a general imaging element, and a right part of FIG. 4 illustrates a front view of a portion of the pixel array part of the imaging element 121. Note that although FIG. 4 illustrates an example in which the pixel array unit has a configuration in which the number of pixels in each of the horizontal direction×vertical direction is 6 pixels×6 pixels, but the configuration of the number of pixels is not limited to this.

The incident angle directivity can be formed by, for example, a light shielding film. It is illustrated that in the general imaging element 121, pixels 121a having the same incident angle directivities are arranged in an array, as in the example on the left part of FIG. 4. On the other hand, the imaging element 121 in the example on the right side of FIG. 4 is provided with a light shielding film 121b, which is one of modulation elements, so as to cover a part of a light receiving region of a photodiode in every pixel 121a. The incident light that is incident on each pixel 121a is optically modulated according to an incident angle. Then, for example, by providing the light shielding film 121b in a different range in every pixel 121a, light receiving sensitivity with respect to an incident angle of incident light is different in every pixel 121a, and each pixel 121a has a different incident angle directivity.

For example, the pixel 121a-1 and the pixel 121a-2 have different light-shielding ranges (at least either light-shielding regions (positions) or light shielding areas are different) due to the light shielding films 121b-1 and 121b-2 provided. That is, in the pixel 121a-1, the light shielding film 121b-1 is provided so as to shield a part of a left side in the light receiving region of the photodiode by a predetermined width, and in the pixel 121a-2, the light shielding film 121b-2 is provided so as to shield a part of a right side in the light receiving region by a width wider in the horizontal direction than the light shielding film 121b-1. In the other pixels 121a, similarly, the light shielding films 121b are provided so as to shield different ranges in the light receiving region in every pixel, and are randomly arranged in the pixel array.

Note that the range of the light shielding film 121b desirably has an area to a degree that a desired amount of light can be ensured because as the ratio of covering the light receiving region of each pixel becomes larger, it becomes a state that the amount of light that can be received is smaller, and thus the area of the light shielding film 121b may be limited to, for example, about ¾ at the maximum of an entire light receivable range. In this manner, it is possible to secure a light amount equal to or more than a desired amount. However, if each pixel is provided with an unshielded range having a width corresponding to the wavelength of light to be received, it is possible to receive a minimum amount of light. That is, for example, in a case of a B pixel (blue pixel), the wavelength is about 500 nm, but it is possible to receive a minimum amount of light unless the light is shielded by a width corresponding to this wavelength or more.

<Configuration Example of Imaging Element>

Figure 5:
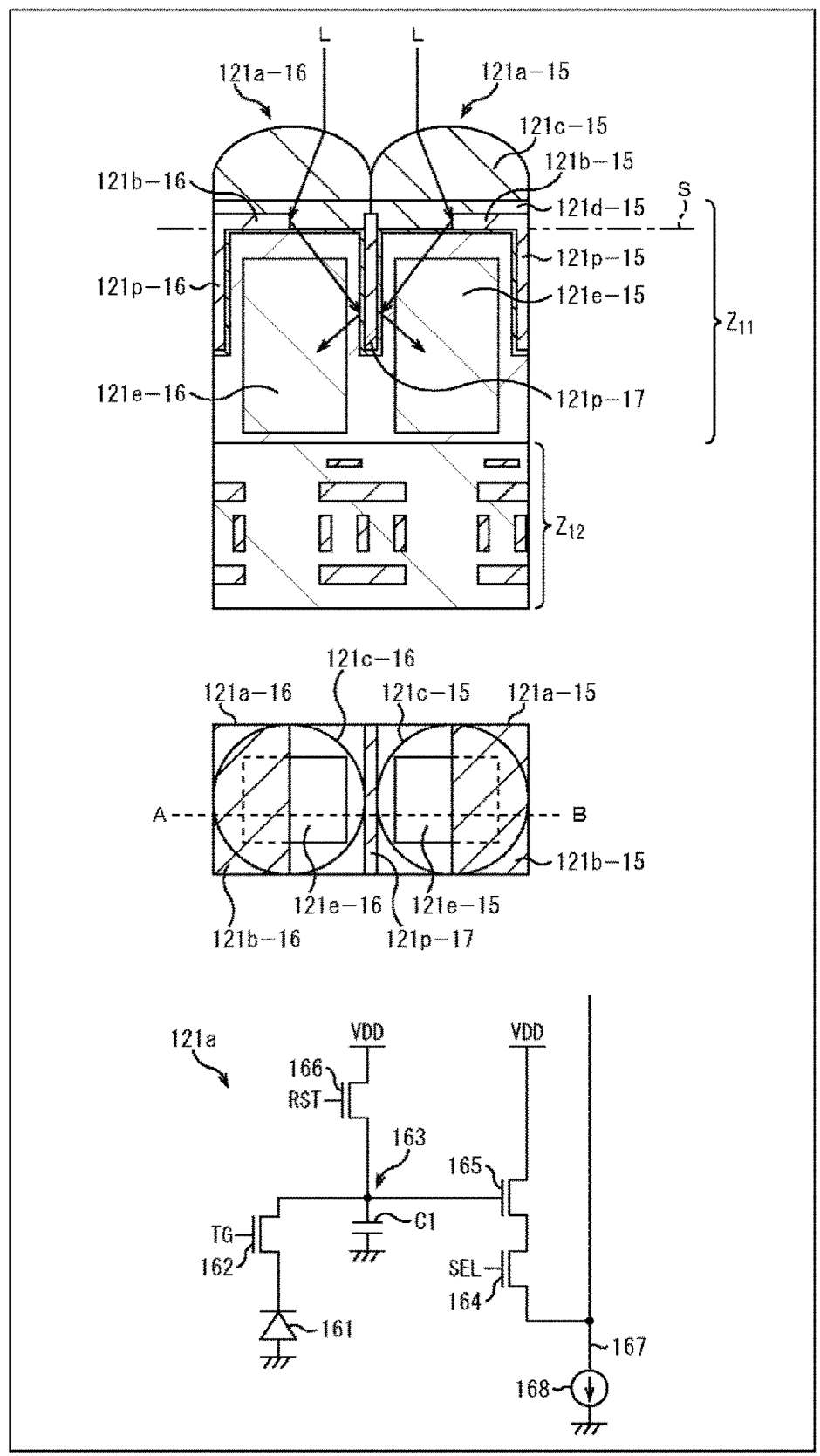
FIG. 5 is a diagram describing a first configuration example of the imaging element.

A configuration example of the imaging element 121 in this case will be described with reference to FIG. 5. An upper part of FIG. 5 is a side cross-sectional view of the imaging element 121, and a middle part of FIG. 5 is a top view of the imaging element 121. Further, the side cross-sectional view in the upper part of FIG. 5 is an AB cross section in the middle part of FIG. 5. Moreover, a lower part of FIG. 5 is a circuit configuration example of the imaging element 121.

The imaging element 121 having the configuration illustrated in FIG. 5 has a plurality of pixel output units that receives incident light that is incident without passing through either of an imaging lens and a pinhole, and each outputs one detection signal indicating an output pixel value modulated by an incident angle of the incident light. For example, the imaging element 121 has a configuration in which incident angle directivities indicating directivities of the output pixel values of at least two pixel output units of the plurality of pixel output units with respect to an incident angle of incident light from an object are different characteristics from each other. Furthermore, the imaging element 121 in this case has a configuration such that, in the plurality of pixel output units, an incident angle directivity indicating a directivity with respect to the incident angle of the incident light from the object can be set independently in every pixel output unit.

In the imaging element 121 in the upper part of FIG. 5, incident light is incident from an upper side to a lower side in the view. Adjacent pixels 121a-15 and 121a-16 are of what is called back-illuminated type in each of which a wiring layer Z12 is provided in a lowermost layer in the view and a photoelectric conversion layer Z11 is provided thereon.

Note that when it is not necessary to distinguish the pixels 121a-15 and 121a-16, they are simply referred to as a pixel 121a, and other configurations are also referred to in a similar manner. Further, although FIG. illustrates a side view and a top view of two pixels forming the pixel array of the imaging element 121, it goes without saying that a larger number of pixels 121a are arranged but are omitted in the views.

Moreover, the pixels 121a-15 and 121a-16 include photodiodes 121e-15 and 121e-16 in the photoelectric conversion layer Z11, respectively. Further, on the photodiodes 121e-15 and 121e-16, on-chip lenses 121c-15 and 121c-16 and color filters 121d-15 and 121d-16 are respectively formed from above.

The on-chip lenses 121c-15 and 121c-16 focus incident light on the photodiodes 121e-15 and 121e-16, respectively.

The color filters 121d-15, 121d-16 are, for example, optical filters that transmit light having specific wavelengths such as red, green, blue, infrared, and white. Note that in a case of white, the color filters 121d-15 and 121d-16 may be transparent filters or may be omitted.

Light shielding films 121p-15 to 121p-17 are formed on a boundary between the respective pixels in the photoelectric conversion layer Z11 of the pixels 121a-15 and 121a-16, and suppress crosstalk between adjacent pixels.

Further, light shielding films 121b-15 and 121b-16, which are one of modulation elements, shield a part of a light receiving surface S from light, as illustrated in the upper and middle parts of FIG. 5. Since a part of the light receiving surface S is shielded from light by the light shielding film 121b, incident light that is incident on the pixel 121a is optically modulated according to the incident angle. Since the pixel 121a detects the optically modulated incident light, the pixel 121a has an incident angle directivity. On the light receiving surface S of the photodiodes 121e-15 and 121e-16 in the pixels 121a-15 and 121a-16, different ranges are shielded from light by the light shielding films 121b-15 and 121b-16, thereby setting incident angle directivities different for every pixel. However, the range shielded from light is not limited to a case of being different in each of all the pixels 121a of the imaging element 121, and pixels 121a in which the same ranges are shielded from light may be partially included.

With the configuration as illustrated in the upper part of FIG. 5, a right end of the light shielding film 121p-15 and an upper end of the light shielding film 121b-15 are connected, and a left end of the light shielding film 121b-16 and an upper end of the light shielding film 121p-16 are connected, forming an L shape when viewed from the side.

Moreover, the light shielding films 121b-15 to 121b-17 and the light shielding films 121p-15 to 121p-17 include metal, for example, tungsten (W), aluminum (Al), or an alloy of Al and copper (Cu). Further, the light shielding films 121b-15 to 121b-17 and the light shielding films 121p-15 to 121p-17 may be formed simultaneously with the same metal as the wiring in the same process as a process of forming the wiring in the semiconductor process. Note that the light shielding films 121b-15 to 121b-17 and the light shielding films 121p-15 to 121p-17 do not need to have the same thicknesses depending on the position.

Further, as illustrated in the lower part of FIG. 5, the pixel 121a includes a photodiode 161 (which corresponds to the photodiode 121e), a transfer transistor 162, a floating diffusion (FD) unit 163, a selection transistor 164, an amplification transistor 165, and a reset transistor 166, and is connected to a current source 168 via a vertical signal line 167.

The photodiode 161 has a configuration in which an anode electrode is each grounded and a cathode electrode is connected to a gate electrode of the amplification transistor 165 via the transfer transistor 162.

The transfer transistor 162 is each driven according to a transfer signal TG. For example, when the transfer signal TG supplied to a gate electrode of the transfer transistor 162 becomes high level, the transfer transistor 162 turns on. Thus, charges accumulated in the photodiode 161 are transferred to the FD unit 163 via the transfer transistor 162.

The amplification transistor 165 serves as an input unit of a source follower that is a reading circuit that reads out a signal acquired by photoelectric conversion in the photodiode 161, and outputs a pixel signal at a level corresponding to charges accumulated in the FD unit 163 to the vertical signal line 167. That is, the amplification transistor 165 has a drain terminal connected to a power supply voltage VDD and a source terminal connected to the vertical signal line 167 via the selection transistor 164, thereby forming a source follower with the current source 168 connected to one end of the vertical signal line 167.

The FD (Floating Diffusion) unit 163 is a floating diffusion region having a charge capacitance C1 provided between the transfer transistor 162 and the amplification transistor 165, and temporarily accumulates charges transferred from the photodiode 161 via the transfer transistor 162. The FD unit 163 is a charge detection unit that converts charges into a voltage, and the charges accumulated in the FD unit 163 are converted into a voltage in the amplification transistor 165.

The selection transistor 164 is driven according to a selection signal SEL and is turned on when the selection signal SEL supplied to the gate electrode becomes high level, and connects the amplification transistor 165 and the vertical signal line 167.

The reset transistor 166 is driven according to a reset signal RST. For example, the reset transistor 166 turns on when the reset signal RST supplied to the gate electrode becomes high level, and discharges the charges accumulated in the FD unit 163 to the power supply voltage VDD to reset the FD unit 163.

With the circuit configuration as described above, the pixel circuit illustrated in the lower part of FIG. 5 operates as follows.

That is, as a first operation, the reset transistor 166 and the transfer transistor 162 are turned on, and the charges accumulated in the FD unit 163 are discharged to the power supply voltage VDD to reset the FD unit 163.

As a second operation, the reset transistor 166 and the transfer transistor 162 are turned off, exposure period starts, and the photodiode 161 accumulates charges according to the amount of incident light.

As a third operation, the reset transistor 166 is turned on, the FD unit 163 is reset, and then the reset transistor 166 is turned off. By this operation, the FD unit 163 is reset and set to a reference potential.

As a fourth operation, a potential of the FD unit 163 in the reset state is output from the amplification transistor 165 as the reference potential.

As a fifth operation, the transfer transistor 162 is turned on, and the charges accumulated in the photodiode 161 are transferred to the FD unit 163.

As a sixth operation, the potential of the FD unit 163 to which the charges of the photodiode are transferred is output from the amplification transistor 165 as a signal potential.

By the above processing, the reference potential is subtracted from the signal potential, and is output as a detection signal by correlated double sampling (CDS). The value of the detection signal (output pixel value) is modulated according to the incident angle of the incident light from the object, and has a different characteristic (directivity) depending on the incident angle (has an incident angle directivity).

As described above, in the pixel 121a in the case of FIG. 5, one photodiode 121e is provided for each pixel, a different range is shielded in every pixel 121a by the light shielding film 121b, and by optical modulation using the light shielding film 121b, the detection signal of one pixel of the detection image having the incident angle directivity can be expressed by one pixel 121a.

<Another Configuration Example of Imaging Element>

Further, the incident angle directivity can be formed by, for example, a position, a size, a shape, and the like of a light receiving element (for example, a photodiode) in a pixel. Pixels for which these parameters are different have different sensitivity to incident light having the same light intensity from the same direction. That is, by setting these parameters for every pixel, the incident angle directivity can be set to every pixel.

For example, a plurality of light receiving elements (for example, photodiodes) may be provided in a pixel, and these may be selectively used. In this manner, it becomes possible to set the incident angle directivity to every pixel by selecting the light receiving element.

Figure 6:
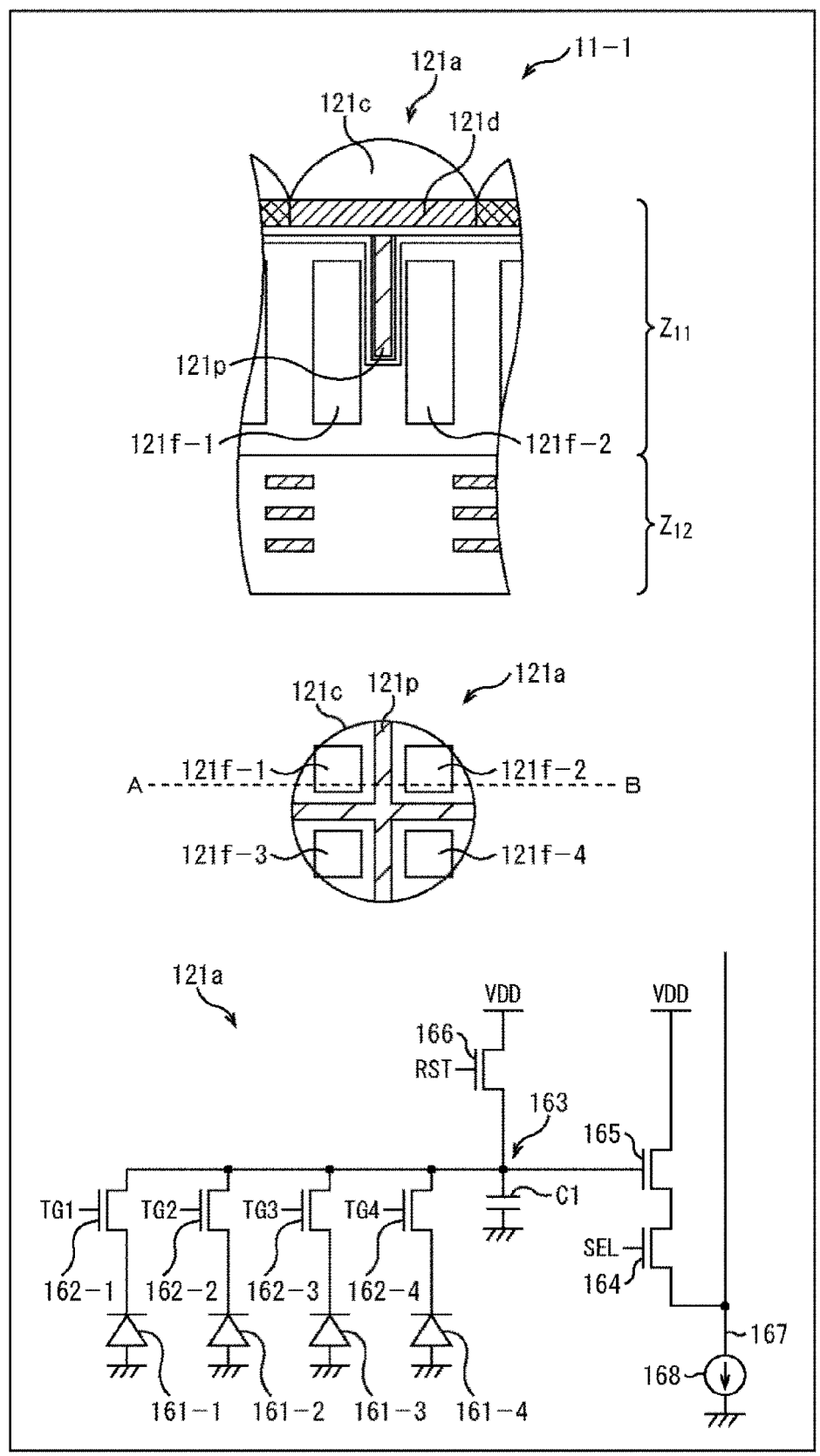
FIG. 6 is a diagram describing the first configuration example of the imaging element.

FIG. 6 is a diagram illustrating another configuration example of the imaging element 121. A side cross-sectional view of the pixel 121a of the imaging element 121 is illustrated in an upper part of FIG. 6, and a top view of the imaging element 121 is illustrated in a middle part of FIG. 6. Further, the side cross-sectional view of the upper part of FIG. 6 is an AB cross section in the middle part of FIG. 6. Moreover, a lower part of FIG. 6 is a circuit configuration example of the imaging element 121.

The imaging element 121 having the configuration illustrated in FIG. 6 has a plurality of pixel output units that receives incident light that is incident without passing through either of an imaging lens and a pinhole, and each outputs one detection signal indicating an output pixel value modulated by an incident angle of the incident light. For example, the imaging element 121 has a configuration in which incident angle directivities indicating directivities of the output pixel values of at least two pixel output units of the plurality of pixel output units with respect to an incident angle of incident light from an object are different characteristics from each other. Furthermore, in the imaging element 121 in this case, by making the plurality of pixel output units have different photodiodes (PD) from each other that contribute to output, an incident angle directivity indicating a directivity of the output pixel value with respect to an incident angle of incident light from an object is independently settable in each of the pixel output units.

As illustrated in FIG. 6, the imaging element 121 differs in configuration from the imaging element 121 in FIG. 6 in that four photodiodes 121f-1 to 121f-4 are formed in the pixel 121a, and the light shielding film 121p is formed in a region that separates the photodiodes 121f-1 to 121f-4 from each other. That is, in the imaging element 121 of FIG. 6, the light shielding film 121p is formed in a "+" shape when viewed from the top surface. Note that their common components are denoted by the same reference numerals, and detailed description thereof is omitted.

In the imaging element 121 configured as illustrated in FIG. 6, by separating the photodiodes 121f-1 to 121f-4 by the light shielding film 121p, electrical and optical crosstalk among the photodiodes 121f-1 to 121f-4 can be prevented. That is, the light shielding film 121p in FIG. 6 is for preventing crosstalk as in the light shielding film 121p of the imaging element 121 in FIG. 5, and is not for giving incident angle directivity.

Although details will be described later, the photodiodes 121f-1 to 121f-4 have different incident angles at which the light receiving sensitivity characteristics increase. That is, the output pixel value of the pixel 121a can be given a desired incident angle directivity depending on which of the photodiodes 121f-1 to 121f-4 the charges are read from. That is, it is possible to control the incident angle directivity of the output pixel value of the pixel 121a.

In the configuration example of the imaging element 121 of FIG. 6, one FD unit 163 is shared by the four photodiodes 121f-1 to 121f-4. The lower part of FIG. 6 illustrates a circuit configuration example in which the one FD unit 163 is shared by the four photodiodes 121f-1 to 121f-4. Note that in the lower part of FIG. 6, description of the same configurations as in the lower part of FIG. 5 is omitted.

The lower part of FIG. 6 differs from the lower part of the circuit configuration of FIG. 5 in that instead of the photodiode 161 and the transfer transistor 162, photodiodes 161-1 to 161-4 (corresponding to the photodiodes 121f-1 to 121f-4 in the upper part of FIG. 6) and transfer transistors 162-1 to 162-4 are provided, and the FD unit 163 is shared.

In the circuit illustrated in the lower part of FIG. 6, the photodiodes 161-1 to 161-4 are referred to as a photodiode 161 when it is not necessary to distinguish them from each other. Furthermore, the transfer transistors 162-1 to 162-4 are referred to as a transfer transistor 162 when it is not necessary to distinguish them from each other.

In the circuit illustrated in the lower part of FIG. 6, when one of the transfer transistors 162 is turned on, charges of the photodiode 161 corresponding to the transfer transistor 162 are read out and transferred to the common FD unit 163. Then, a signal corresponding to level of the charges held in the FD unit 163 is read as a detection signal of the pixel output unit. That is, charges of each photodiode 161 can be read out independently of each other, and it is possible to control from which photodiode 161 the charges are read out depending on which transfer transistor 162 is turned on. In other words, the degree of contribution of each photodiode 161 to the output pixel value can be controlled depending on which transfer transistor 162 is turned on. For example, by making the photodiodes 161 that read out charges different from each other between at least two pixels, the photodiodes 161 that contribute to the output pixel value can be made different from each other. That is, the output pixel value of the pixel 121a can be given a desired incident angle directivity by selecting the photodiode 161 that reads out charges. That is, the detection signal output from each pixel 121a can have a value (output pixel value) modulated according to the incident angle of the incident light from the object.

For example, in FIG. 6, by transferring charges of the photodiode 121f-1 and the photodiode 121f-3 to the FD unit 163 and adding signals acquired by reading the respective charges, the output pixel value of the pixel 121a can be given an incident angle directivity in the horizontal direction in the view. Similarly, by transferring charges of the photodiode 121f-1 and the photodiode 121f-2 to the FD unit 163 and adding signals acquired by reading the respective charges, the output pixel value of the pixel 121a can be given an incident angle directivity in the vertical direction in the view.

Note that signals acquired on the basis of respective charges of the respective photodiodes 121f of the pixel 121a in FIG. 6 may be added after being read from the pixel, or may be added in the pixel (for example, the FD unit 163).

Further, the combination of the photodiodes 121f for adding charges (or signals corresponding to the charges) is arbitrary, and is not limited to the above example. For example, charges of three or more photodiodes 121f (or signals corresponding to the charges) may be added. Furthermore, for example, charges of one photodiode 121*f* may be read out without performing the addition.

Note that by resetting a detection value (charges) accumulated in the photodiode 161 (photodiode 121*f*) before reading the charges to the FD unit 163 using an electronic shutter function, or the like, (detection sensitivity of) the pixel 121*a* may be given a desired incident angle directivity.

For example, in a case of using the electronic shutter function, if reset is performed immediately before charges of the photodiode 121*f* are read out to the FD unit 163, the photodiode 121*f* can be brought to a state of having no contribution to the detection signal level of the pixel 121*a*, or can be made to contribute partially by giving a time between resetting and reading to the FD unit 163.

As described above, in the pixel 121*a* of FIG. 6, four photodiodes 121*f* are provided for one pixel, and although the light shielding film 121*b* is not formed on the light receiving surface, it is divided by the light shielding film 121*p* into a plurality of regions to form four photodiodes 121*f*-1 to 121*f*-4, so as to represent the detection signal of one pixel of a detection image having the incident angle directivity. In other words, for example, of the photodiodes 121*f*-1 to 121*f*-4, a range that does not contribute to output functions similarly to a light-shielded region, and represents the detection signal of one pixel of the detection image having the incident angle directivity. Note that in a case where the detection signal of one pixel is represented using the photodiodes 121*f*-1 to 121*f*-4, the light shielding film 121*b* is not used, and thus the detection signal is not a signal acquired by optical modulation.

Although an example in which four photodiodes are arranged in a pixel has been described above, the number of photodiodes arranged in a pixel is arbitrary and is not limited to the above example. That is, the number of partial regions in which the photodiodes are arranged in the pixel is also arbitrary.

Further, the photodiodes are described above as being arranged in four partial regions acquired by dividing the inside of the pixel into four equal portions, but it is not necessary that the partial regions are equally divided. That is, it is not necessary to unify all sizes and shapes of respective partial regions (partial regions having different sizes and shapes may be included). Alternatively, positions (positions in the partial regions), sizes, shapes, and the like of the photodiodes arranged in respective partial regions may be different for every photodiode (every partial region). At that time, the sizes and shapes of the respective partial regions may all be unified or may not be unified.

Moreover, these parameters do not have to be unified for all pixels of the imaging element 121. That is, in one or more pixels of the imaging element 121, one or more of these parameters may be different from those of other pixels.

For example, a pixel in which dividing positions for forming partial regions where photodiodes are arranged in the pixel are different from those in another pixel may be included in the pixel group of the imaging element 121. That is, the imaging element 121 may have one or more pixels in which the sizes and shapes of the partial regions are different from those of other pixels. For example, by making the dividing positions different for every pixel, even if only an upper left photodiode is used in a plurality of pixels, the incident angle directivity of the detection signal detected in each of the plurality of pixels may be different from one another.

Further, for example, a pixel group of the imaging element 121 may include a pixel in which positions, sizes, shapes, and the like of the plurality of photodiodes arranged in the pixel are different from those of other pixels. That is, the imaging element 121 may have one or more pixels in which at least one of the positions, sizes, or shapes of the plurality of photodiodes arranged are different from those of other pixels. For example, by making the positions, sizes, shapes, or the like of the photodiode different for every pixel, even if only the upper left photodiodes are used in a plurality of pixels, incident angle directivities of detection signals detected respectively in the plurality of pixels can be different from each other.

Moreover, for example, one or more pixels in which both the parameters (sizes, shapes) of the partial regions and the parameters (positions, sizes, shapes) of the photodiodes are different from those of other pixels may be included.

Further, for example, a pixel in which the number of divisions for forming partial regions in which photodiodes are arranged in the pixel is different from that of another pixel may be included in the pixel group of the imaging element 121. That is, the imaging element 121 may have one or more pixels in which the number of photodiodes arranged is different from those of other pixels. For example, by making the number of divisions (the number of photodiodes) different for every pixel, the incident angle directivities can be set more freely.

<On Principles of Generating Incident Angle Directivity>

Figure 7:
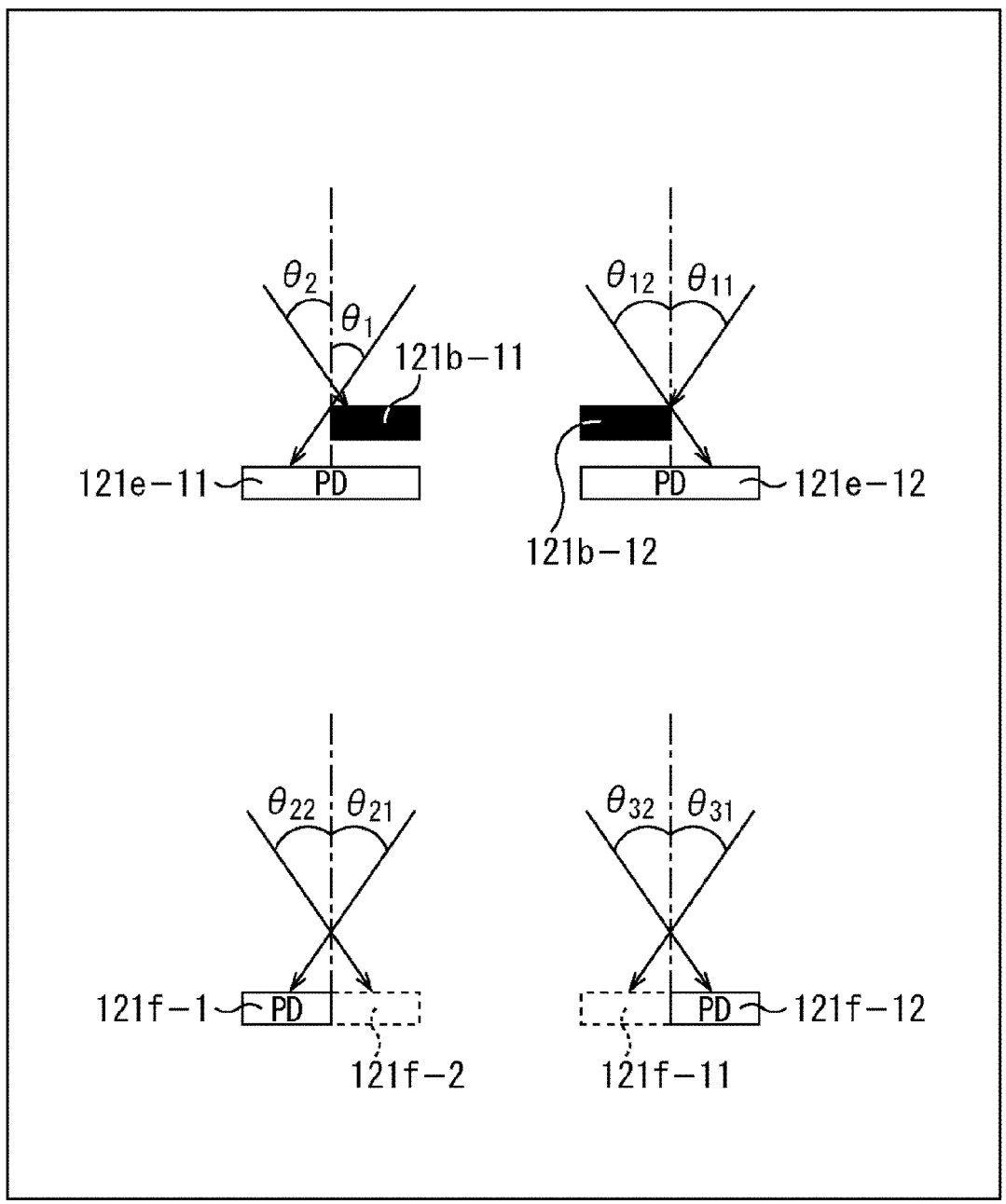
FIG. 7 is a diagram describing principles of generation of an incident angle directivity.

The incident angle directivity of each pixel in the imaging element 121 is generated, for example, according to principles illustrated in FIG. 7. Note that an upper left part and an upper right part of FIG. 7 are diagrams for describing principles of incident angle directivity generation of the imaging element 121 in FIG. 5, and a lower left part and a lower right part of FIG. 7 are diagrams for describing principles of incident angle directivity generation of the imaging element 121 in FIG. 6.

Further, one pixel in either of the upper left part and the upper right part of FIG. 7 is formed by one photodiode 121*e*. On the other hand, one pixel in either of the lower left part and the lower right part in FIG. 7 is formed by two photodiodes 121*f*. Note that although an example in which one pixel is formed by two photodiodes 121*f* is described here, this is for convenience of description, and the number of photodiodes 121*f* that forms one pixel may be another number.

In the upper left part of FIG. 7, a light shielding film 121*b*-11 is formed so as to shield a right half of a light receiving surface of a photodiode 121*e*-11 when incident light is incident from an upper side to a lower side in the diagram. Further, in the upper right part of FIG. 7, a light shielding film 121*b*-12 is formed so as to shield a left half of a light receiving surface of a photodiode 121*e*-12. Note that an alternate long and short dash line in the diagram represents being at a center position in the horizontal direction in the diagram of the light receiving surface of the photodiode 121*e* and in a direction perpendicular to the light receiving surface.

For example, in a case of the configuration in the upper left part of FIG. 7, incident light from the upper right direction in the diagram, which is indicated by an arrow forming an incident angle $\theta 1$ with respect to the alternate long and short dash line in the diagram, is easily received in a left half range not shielded by the light shielding film 121*b*-11 of the photodiode 121*e*-11, but incident light from the upper left direction in the diagram, which is indicated by an arrow forming an incident angle $\theta 2$ with respect to the alternate long and short dash line in the diagram, is difficult to receive in the left half range not shielded by the light shielding film 121*b*-11 of the photodiode 121*e*-11.

Therefore, in the case of the configuration as illustrated in the upper left part of FIG. 7, the incident angle directivity is provided such that the light receiving sensitivity characteristic is high for the incident light from the upper right of the diagram and the light receiving sensitivity characteristic is low for the incident light from the upper left.

On the other hand, for example, in a case of the configuration in the upper right part of FIG. 7, incident light from the upper right direction in the diagram, which is indicated by an arrow forming an incident angle θ11 with respect to the alternate long and short dash line in the diagram, is difficult to receive in a left half range shielded by the light shielding film 121b-12 of the photodiode 121e-12, but incident light from the upper left direction in the diagram, which is indicated by an arrow forming an incident angle θ12 with respect to the alternate long and short dash line in the diagram, is easily received in a right half range not shielded by the light shielding film 121b-12 of the photodiode 121e-12. Therefore, in the case of the configuration as illustrated in the upper right part of FIG. 7, the incident angle directivity is provided such that the light receiving sensitivity characteristic is low for the incident light from the upper right of the diagram, and the light receiving sensitivity characteristic is high for the incident light from the upper left.

Further, in a case of the lower left part of FIG. 7, photodiodes 121f-1 and 121f-2 are provided on the left and right in the diagram, and have an incident angle directivity without providing the light shielding film 121b by reading one of the detection signals.

That is, as illustrated in the lower left part of FIG. 7, in a case where two photodiodes 121f-1 and 121f-2 are formed in the pixel 121a, by making the detection signal of the photodiode 121f-1 provided on the left side of the diagram contribute to the detection signal level of this pixel 121a, it is possible to have an incident angle directivity similar to that of the configuration in the upper left part of FIG. 7. That is, incident light from the upper right direction in the diagram, which is indicated by an arrow forming an incident angle θ21 with respect to the alternate long and short dash line in the diagram, is incident on the photodiode 121f-1 and received, and a detection signal thereof is read out and contributes to the detection signal level of the pixel 121a. On the other hand, incident light from the upper left direction in the diagram, which is indicated by an arrow forming an incident angle θ22 with respect to the alternate long and short dash line in the diagram, is incident on the photodiode 121f-2, but a detection signal thereof is not read out and does not contribute to the detection signal level of the pixel 121a.

Similarly, as illustrated in the lower right part of FIG. 7, in a case where two photodiodes 121f-11 and 121f-12 are formed in the pixel 121a, by making the detection signal of the photodiode 121f-12 provided on the left side in the diagram contribute to the detection signal level of this pixel 121a, it is possible to have an incident angle directivity similar to that of the configuration in the upper right part of FIG. 7. That is, incident light from the upper right direction in the diagram, which is indicated by an arrow forming an incident angle θ31 with respect to the alternate long and short dash line in the diagram, is incident on the photodiode 121f-11, but a detection signal thereof is not read out and does not contribute to the detection signal level of this pixel 121a. On the other hand, incident light from the upper left direction in the diagram, which is indicated by an arrow forming an incident angle θ32 with respect to the alternate long and short dash line in the diagram, is incident on the photodiode 121f-12 and received, and a detection signal thereof is read out and contributes to the detection signal level of this pixel 121a.

Note that, in FIG. 7, an example in which the alternate long and short dash line in the vertical direction is the center position in the horizontal direction in the diagram of the light receiving surface of the photodiode 121e has been described, but it is for convenience of description and may be other positions. By the horizontal position of the light shielding film 121b indicated by the alternate long and short dash line in the vertical direction being different, different incident angle directivities can be generated.

<On Incident Angle Directivity in Configuration Including On-Chip Lens>

In the above, the generation principles of the incident angle directivity have been described. Here, an incident angle directivity in a configuration including an on-chip lens 121c will be described.

Figure 8:
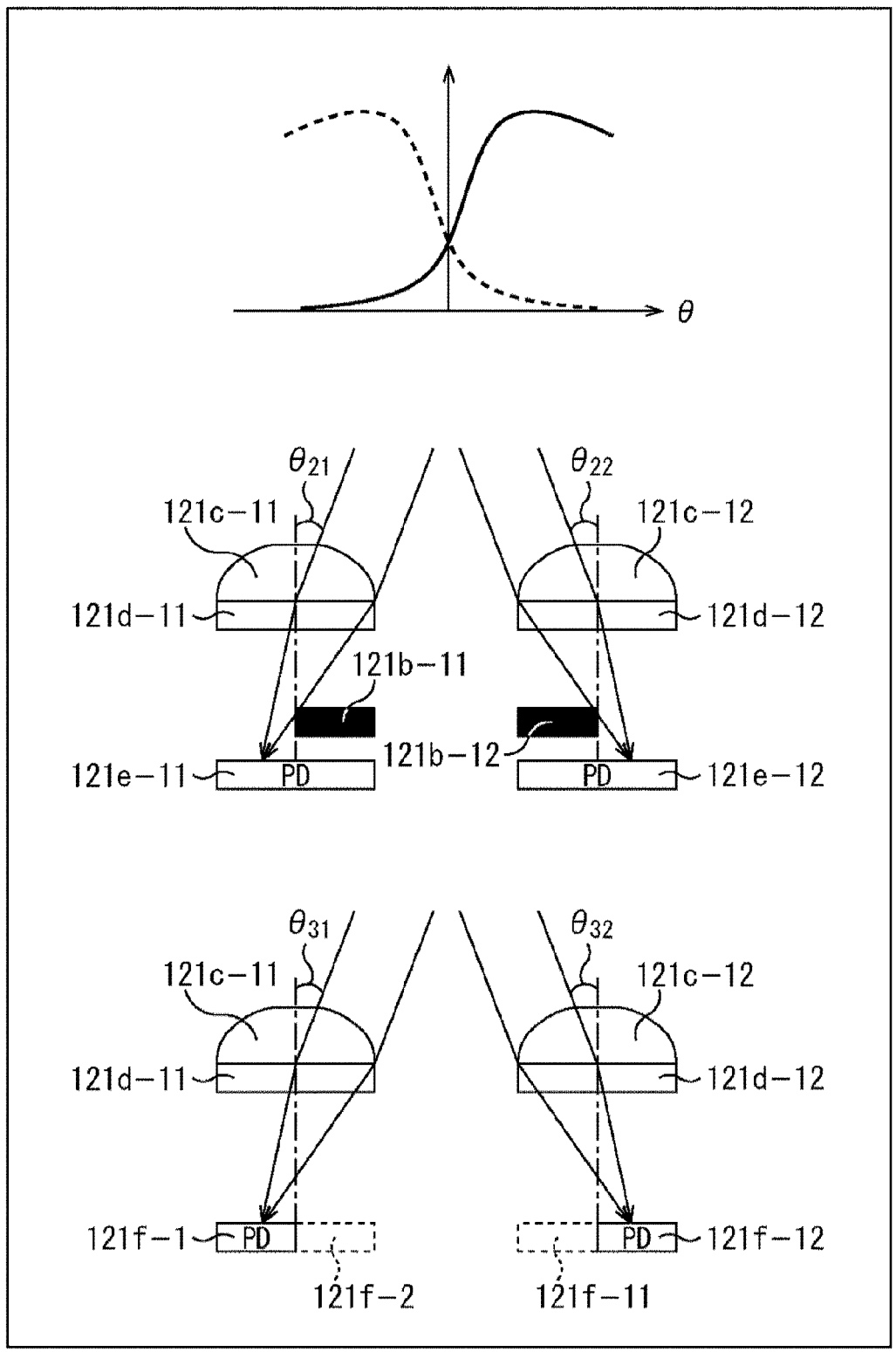
FIG. 8 is a diagram describing a change in the incident angle directivity using an on-chip lens.

That is, the incident angle directivity of each pixel in the imaging element 121 is set as illustrated in FIG. 8, for example, by using the on-chip lens 121c in addition to the one with the light shielding film 121b described above. That is, in a middle left part of FIG. 8, an on-chip lens 121c-11 that focuses incident light from an incident direction in an upper part of the diagram, a color filter 121d-11 that transmits light of a predetermined wavelength, and photodiodes 121e-11 that generate a pixel signal by photoelectric conversion are stacked in this order, and in a middle right part of FIG. 8, an on-chip lens 121c-12, a color filter 121d-12, and a photodiode 121e-12 are formed in this order from the incident direction in the upper part of the diagram.

Note that if it is not necessary to distinguish between the on-chip lenses 121c-11 and 121c-12, the color filters 121d-11 and 121d-12, and the photodiodes 121e-11 and 121e-12, they will be simply referred to as an on-chip lens 121c, a color filter 121d, and a photodiode 121e.

In the imaging element 121, moreover, as illustrated respectively in the middle left part and the middle right part of FIG. 8, light shielding films 121b-11 and 121b-12 that partially shield a region that receives incident light are provided.

As illustrated in the middle left part of FIG. 8, in a case where the light shielding film 121b-11 that shields a right half of the photodiode 121e-11 in the diagram is provided, as indicated by a waveform of a solid line in the upper part of FIG. 8, the detection signal level of the photodiode 121e-11 changes according to the incident angle θ of the incident light.

That is, when the incident angle θ, which is an angle formed by the incident light with respect to the alternate long and short dash line that is at center positions of the photodiode 121e and the on-chip lens 121c and is perpendicular to each of them, becomes large (the incident angle θ becomes large in a positive direction (inclines rightward in the diagram)), the light is focused in a range where the light shielding film 121b-11 is not provided, thereby increasing the detection signal level of the photodiode 121e-11. Conversely, the smaller the incident angle θ is (the larger the incident angle θ is in a negative direction (inclines leftward in the diagram)), the more the light is focused in a range where the light shielding film 121b-11 is provided, thereby decreasing the detection signal level of the photodiode 121e-11.

Note that the incident angle θ here is zero degrees when the direction of the incident light coincides with the alternate long and short dash line, and the incident angle θ on the incident angle θ21 side on the middle left side of FIG. 8 where incident light from the upper right side in the diagram is incident is set to a positive value, and the incident angle θ on the incident angle θ22 side on the middle right side of FIG. 8 is set to a negative value. Therefore, in FIG. 8, the incident light that is incident on the on-chip lens 121c from the upper right side has a larger incident angle than the incident light that is incident from the upper left side. That is, in FIG. 8, the incident angle θ increases as the traveling direction of the incident light inclines to the right (increases in the positive direction) and decreases as it inclines to the left (increases in the negative direction).

Further, as illustrated in the middle right part of FIG. 8, when the light shielding film 121b-12 that shields the left half of the photodiode 121e-12 in the diagram is provided, as indicated by a waveform of a dotted line in the upper part of FIG. 8, the detection signal level of the photodiode 121e-12 changes according to the incident angle θ of the incident light.

That is, as indicated by the waveform of dotted line in the upper part of FIG. 8, the larger the incident angle θ, which is an angle formed by the incident light with respect to the alternate long and short dash line that is at center positions of the photodiode 121e and the on-chip lens 121c and is perpendicular to each of them (the larger the incident angle θ in the positive direction), the more the light is focused in a range where the light shielding film 121b-12 is provided, thereby decreasing the detection signal level of the photodiode 121e-12. Conversely, the smaller the incident angle θ (the larger the incident angle θ in the negative direction), the more the light is incident on the range where the light shielding film 121b-12 is not provided, thereby increasing the detection signal level of the photodiode 121e-12.

Note that in the upper part of FIG. 8, the horizontal axis represents the incident angle θ and the vertical axis represents the detection signal level in the photodiode 121e.

Since the waveforms depicted by the solid line and the dotted line illustrating the detection signal level according to the incident angle θ illustrated in the upper part of FIG. 8 can be changed according to the range of the light shielding film 121b, it is possible to give (set) different incident angle directivities which are different from each other in pixel units. Note that the solid-line waveform in the upper part of FIG. 8 corresponds to the solid-line arrow illustrating how the incident light in the middle left part and the lower left part of FIG. 8 is focused while changing the incident angle θ. Furthermore, the dotted waveform in the upper part of FIG. 8 corresponds to the dotted arrow illustrating how the incident light in the middle right part and the lower right part of FIG. 8 is focused while changing the incident angle θ.

The incident angle directivity referred to here is a characteristic of the detection signal level of each pixel (light receiving sensitivity characteristic) according to the incident angle θ, but in the case of the example in the middle of FIG. 8, it can be said that it is a characteristic of the light shielding value on the incident angle θ. That is, the light shielding film 121b shields against incident light in a specific direction at a high level, but cannot sufficiently shields against incident light from directions other than the specific direction. This change in shieldable level causes different detection signal levels depending on the incident angle θ as illustrated in the upper part of FIG. 8. Therefore, if the direction in which light can be shielded at the highest level in each pixel is defined as a light-shielding direction of each pixel, having incident angle directivities mutually different in pixel units means, in other words, having light-shielding directions mutually different in pixel units.

Moreover, as illustrated in the lower left part of FIG. 8, by providing the two photodiodes 121f-1 and 121f-2 for one on-chip lens 121c-11 (the pixel output unit includes the two photodiodes 121f-1 and 121f-2), using the detection signal of only the photodiode 121f-1 in the left part of the diagram makes it possible to acquire the same detection signal level as in the state that the right side of the photodiode 121e-11 is shielded from light in the middle left part of FIG. 8.

In other words, when the incident angle θ, which is an angle formed by the incident light with respect to the alternate long and short dash line that is at a center position of the on-chip lens 121c and is perpendicular to each of it, becomes large (the incident angle θ becomes large in the positive direction), the light is focused in a range of the photodiode 121f-1 from which the detection signal is read, thereby increasing the detection signal level. Conversely, the smaller the incident angle θ (the larger the incident angle θ in the negative direction), the more the light is focused in the range of the photodiode 121f-2 where the detection value is not read, thereby decreasing the detection signal level.

Further, similarly, as illustrated in the lower right part of FIG. 8, by providing the two photodiodes 121f-11 and 121f-12 for one on-chip lens 121c-12, using the detection signal of only the photodiode 121f-12 in the middle right part makes it possible to acquire a detection signal of an output pixel unit of the same detection signal level as in the state that the left side of the photodiode 121e-12 is shielded from light in the middle right part of FIG. 8.

In other words, when the incident angle θ, which is an angle formed by the incident light with respect to the alternate long and short dash line that is at a center position of the on-chip lens 121c and is perpendicular to each of it, becomes large (the incident angle θ becomes large in the positive direction), the light is focused in a range of the photodiode 121f-11 in which the detection signal does not contribute to the detection signal of the output pixel unit, thereby decreasing the detection signal level of the detection signal in the output pixel unit. Conversely, the smaller the incident angle θ is (the larger the incident angle θ is in the negative direction), the more the light is focused on the range of the photodiode 121f-12 where the detection signal contributes to the detection signal of the output pixel unit, thereby increasing the detection signal level of the detection signal of the output pixel unit.

Note that regarding the incident angle directivity, it is desirable that the randomness is high. This is because, for example, if adjacent pixels have the same incident angle directivities, there is a possibility that the above formulas (7) to (9) or formulas (10) to (12) as described later become the same formulas, and there is a possibility that the relationship between an unknown number that is the solution of the simultaneous equations and the number of formulas cannot be satisfied, and the pixel values that form the restored image cannot be acquired. Further, in the configuration illustrated in the middle of FIG. 8, one photodiode 121e-11 and one photodiode 121e-12 are formed in the pixel 121a. On the other hand, in the configuration illustrated in the lower part of FIG. 8, two photodiodes 121f-1 and 121f-2 and photodiodes 121f-11 and 121f-12 are formed in the pixel 121a. Therefore, for example, in the lower part of FIG. 8, one pixel is not configured by the photodiode 121f alone.

Further, as illustrated in the lower part of FIG. 8, in a case where one pixel output unit is configured from a plurality of photodiodes 121f, it can be considered that the output pixel value of the pixel output unit is modulated according to the incident angle. Therefore, it is possible to make the characteristics of the output pixel values (incident angle directivities) different in the pixel output units, and the incident angle directivity is set in one pixel output unit. Moreover, in a case where one pixel output unit is formed by a plurality of photodiodes 121f, one on-chip lens 121c is a necessary component for one pixel output unit in order to generate the incident angle directivity in one pixel output unit.

Further, as illustrated in the upper part of FIG. 8, in a case where each of one photodiode 121e-11 or photodiode 121e-12 forms one pixel output unit, the incident light on one photodiode 121e-11 or photodiode 121e-12 forming one pixel output unit is modulated according to the incident angle, and consequently, the output pixel value is modulated. Therefore, it is possible to make the characteristics (incident angle directivities) of the output pixel values different, and the incident angle directivity in one pixel output unit is set. Moreover, in a case where each of one photodiode 121e-11 or photodiode 121e-12 constitutes one pixel output unit, the incident angle directivity is independently set when manufactured by the light shielding film 121b provided in every one pixel output unit.

Further, as illustrated in the lower part of FIG. 8, in a case where one pixel output unit is formed by a plurality of photodiodes 121f, the number of the plurality of photodiodes 121f for setting the incident angle directivity of every one pixel output unit (the number of divisions of the photodiode 121f constituting one pixel output unit) and the position thereof are set independently at a time of manufacturing in one pixel output unit, and moreover, which photodiode 121f among them is used to set the incident angle directivity can be switched at a time of image capturing.

<Setting of Incident Angle Directivity>

Figure 9:
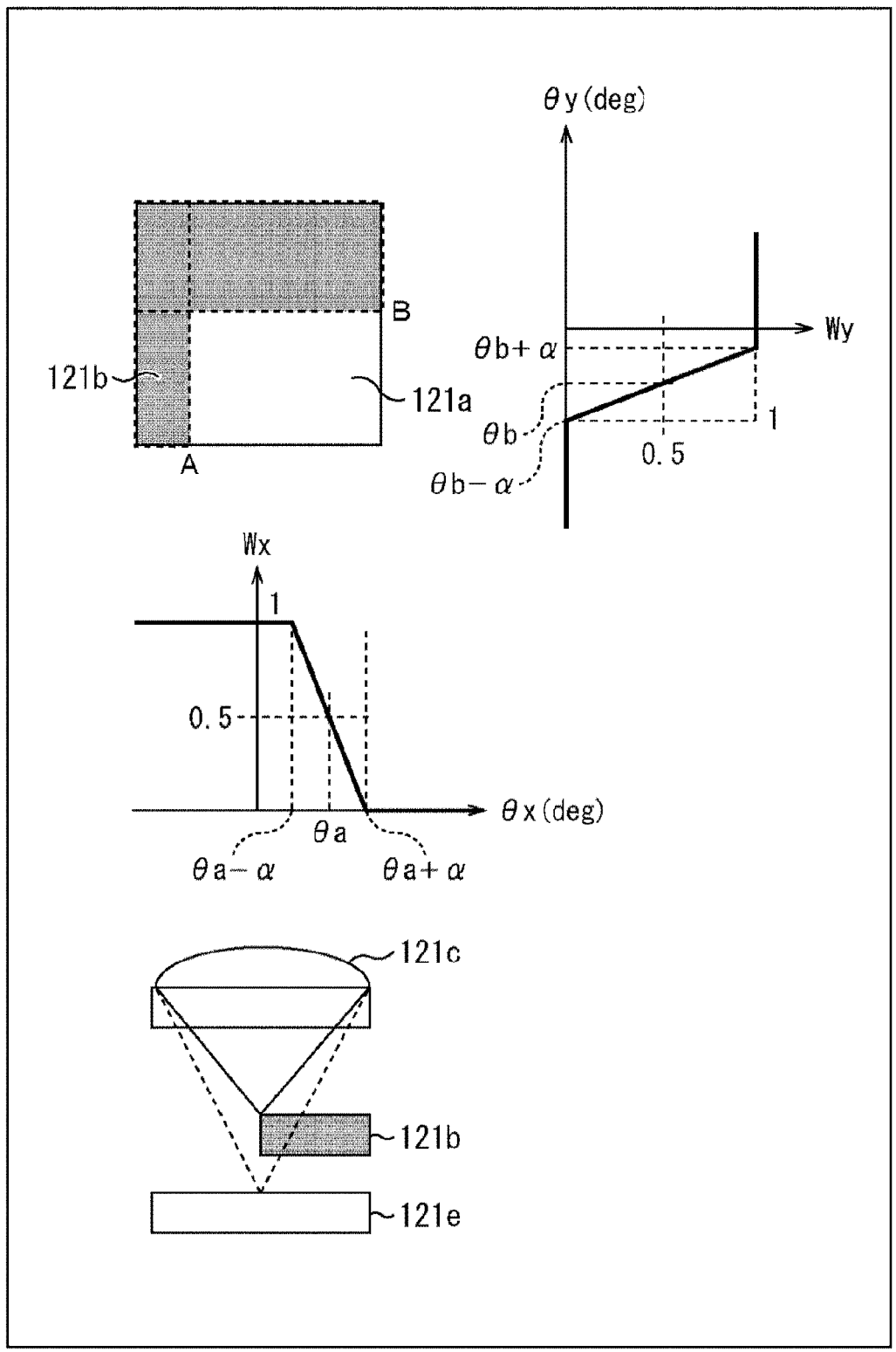
FIG. 9 is a diagram describing a design of the incident angle directivity.

For example, as illustrated in an upper part of FIG. 9, the setting range of the light shielding film 121b is a range from a left end to a position A in a horizontal direction in the pixel 121a, and a range from an upper end to a position B in a vertical direction.

In this case, a weight Wx of 0 to 1 in the horizontal direction, which is an index of the incident angle directivity, is set according to the incident angle θx (deg) from a horizontal center position of each pixel. More specifically, assuming that the weight Wx is 0.5 for an incident angle θx=θa corresponding to the position A, the weight Wh is set so that the weight Wx is 1 for incident angle θx<θa−α, the weight Wx is (−(θx−θa)/2α+½) for θa−α≤incident angle θx≤θa+α, and the weight Wx is 0 for incident angle θx>θa+α. Note that here an example in which the weight Wh is 0, 0.5, and 1 will be described, but the weight Wh is 0, 0.5, and 1 when ideal conditions are satisfied.

Similarly, a weight Wy of 0 to 1 in the vertical direction, which is an index of the incident angle directivity, is set according to the incident angle θy (deg) from a vertical center position of each pixel. More specifically, assuming that the weight Wv is 0.5 at an incident angle θy=θb corresponding to the position B, the weight Wy is set so that the weight Wy is 0 for incident angle θy<θb−α, the weight Wy is ((θy−θb)/2α+½) for θb−α≤incident angle θy≤θb+α, and the weight Wy is 1 for incident angle θy>θb+α.

Then, by using the weights Wx and Wy acquired in this manner, it is possible to acquire a coefficient (coefficient set) corresponding to the incident angle directivity, that is, the light receiving sensitivity characteristic of each pixel 121a.

Further, at this time, an inclination (½α) indicating a change of weight in a range where the horizontal weight Wx and the vertical weight Wy are around 0.5 is set by using the on-chip lenses 121c having different focal lengths.

In other words, different focal lengths can be acquired by using the on-chip lenses 121c having different curvatures.

For example, by using the on-chip lenses 121c having different curvatures, as depicted by a solid line in a lower part of FIG. 9, when the light is focused so that the focal length is on the light shielding film 121b, the inclination (½α) becomes steep. That is, in the upper part of FIG. 9, the horizontal weight Wx and the vertical weight Wy abruptly change to 0 or 1 near a boundary between the horizontal incident angle θx=θa and the vertical incident angle θy=θb, where they are near 0.5.

Further, for example, by using the on-chip lens 121c having different curvatures, as depicted by a dotted line in the lower part of FIG. 9, when the light is focused so that the focal length is on the photodiode 121e, the inclination (½α) becomes gentle. That is, in the upper part of FIG. 9, the horizontal weight Wx and the vertical weight Wy gradually change to 0 or 1 near the boundary between the horizontal incident angle θx=θa and the vertical incident angle θy=θb, where they are near 0.5.

As described above, by using the on-chip lenses 121c having different curvatures and using different focal lengths, different incident angle directivities, that is, different light receiving sensitivity characteristics can be acquired.

Therefore, the incident angle directivity of the pixel 121a can be set to a different value by making the range in which the photodiode 121e is shielded from light by the light shielding film 121b different from the curvature of the on-chip lens 121c. Note that the curvature of the on-chip lens may be the same in all pixels in the imaging element 121, or may be different in part of the pixels.

<Difference Between On-Chip Lens and Imaging Lens>

As described above, the imaging element 121 does not require an imaging lens. However, the on-chip lens 121c is necessary at least in a case where the incident angle directivity is achieved by using a plurality of photodiodes in a pixel as described with reference to FIG. 6. The on-chip lens 121c and the imaging lens have different physical operations.

The imaging lens has a light focusing function for causing incident light incident from the same direction to be incident on a plurality of pixels adjacent to each other. On the other hand, light passing through the on-chip lens 121c is incident only on the light receiving surface of the photodiode 121e or 121f forming one corresponding pixel. In other words, the on-chip lens 121c is provided for each pixel output unit, and focuses the object light incident on itself only on the corresponding pixel output unit. That is, the on-chip lens 121c does not have a light focusing function for causing diffused light emitted from a virtual point light source to be incident on a plurality of pixels adjacent to each other.

<Relationship of Distance Between Object Plane and Imaging Element>

Next, with reference to FIG. 10, a relationship of distance between an object plane and the imaging element 121 will be described.

Figure 10:
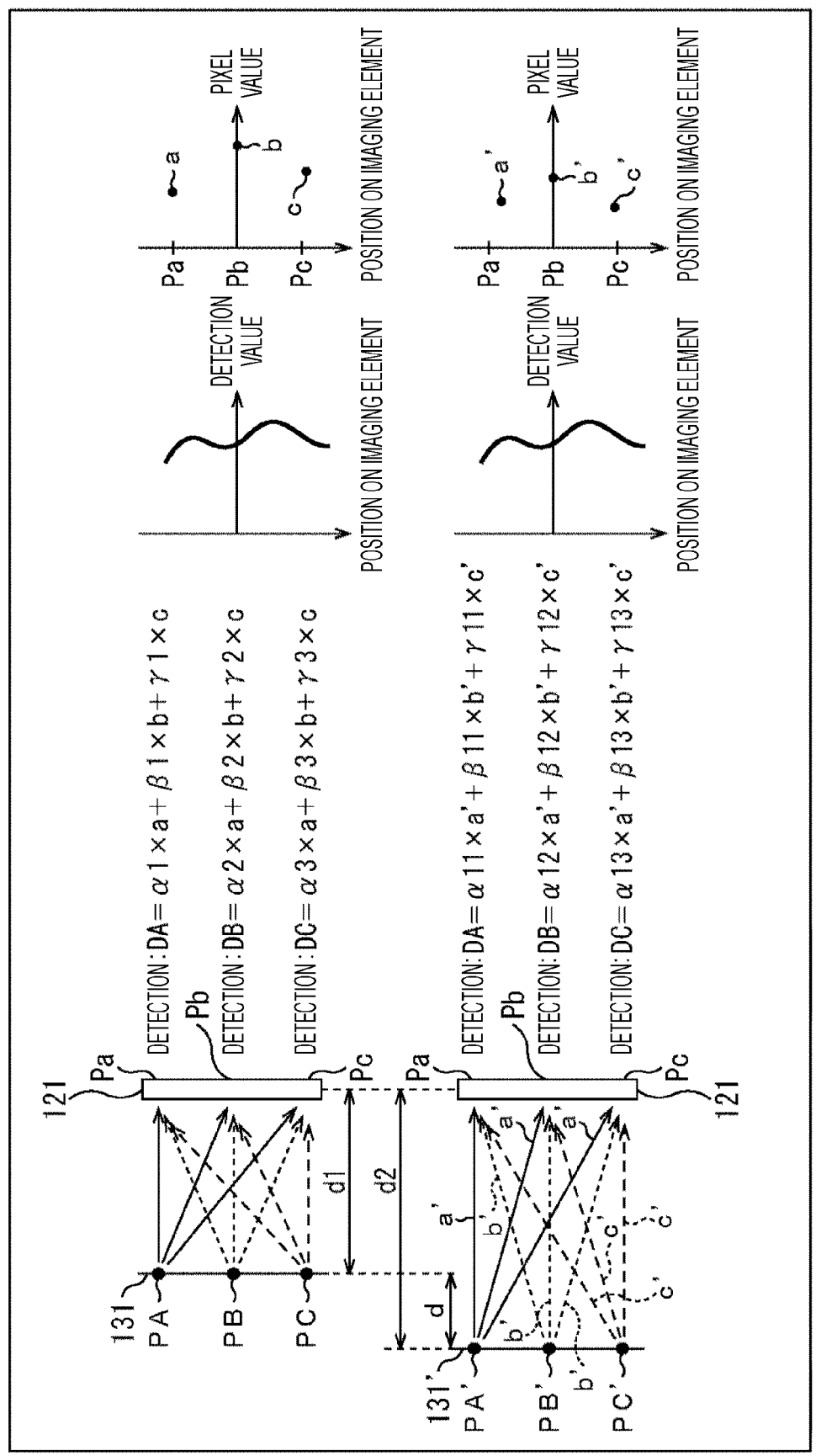
FIG. 10 is a diagram describing a relationship between an object distance and coefficients representing the incident angle directivity.

As illustrated in an upper left part of FIG. 10, in a case where an object distance between the imaging element 121 and the object plane 131 is a distance d1, for example, when setting point light sources PA, PB, and PC on the object plane 131, it is assumed that detection signal levels DA, DB, and DC at corresponding positions Pa, Pb, and Pc on the imaging element 121 are expressed by the same formulas as the above formulas (7) to (9).

$$DA = \alpha 1 \times a + \beta 1 \times b + \gamma 1 \times c \tag{7}$$

$$DB = \alpha 2 \times a + \beta 2 \times b + \gamma 2 \times c \tag{8}$$

$$DC = \alpha 3 \times a + \beta 3 \times b + \gamma 3 \times c \tag{9}$$

On the other hand, as illustrated in a lower left part of FIG. 10, in a case of an object plane 131' whose object distance to the imaging element 121 is a distance d2 larger than a distance d1 by d, that is, a case of an object plane 131' that is deeper than the object plane 131 as viewed from the imaging element 121, the detection signal levels are similar for all the detection signal levels DA, DB, and DC as illustrated in an upper center portion and a lower center portion of FIG. 10.

However, in this case, light rays having light intensities a', b', and c' from the point light sources PA', PB', and PC' on the object plane 131' are received by respective pixels of the imaging element 121. At this time, since the incident angles of the light rays of light intensities a', b', and c' received on the imaging element 121 are different (change), respective different coefficient sets are required, and the detection signal levels DA, DB, and DC at the respective positions Pa, Pb, and Pc are expressed as illustrated in the following formulas (10) to (12), for example.

[Mathematical Formula 2]

$$DA = \alpha 11 \times a' + \beta 11 \times b' + \gamma 11 \times c' \quad (10)$$

$$DB = \alpha 12 \times a' + \beta 12 \times b' + \gamma 12 \times c' \quad (11)$$

$$DC = \alpha 13 \times a' + \beta 13 \times b' + \gamma 13 \times c' \quad (10)$$

Here, a coefficient set group including a coefficient set $\alpha 11$, $\beta 11$, and $\gamma 11$, a coefficient set $\alpha 12$, $\beta 12$, and $\gamma 12$, and a coefficient set $\alpha 13$, $\beta 13$, and $\gamma 13$ is a coefficient set group of the object plane 131' corresponding to a coefficient set $\alpha 1$, $\beta 1$, and $\gamma 1$, a coefficient set $\alpha 2$, $\beta 2$, and $\gamma 2$, and a coefficient set $\alpha 3$, $\beta 3$, and $\gamma 3$, respectively, in the object plane 131.

Therefore, by solving formulas (10) to (12) using the preset coefficient set groups all, $\beta 11$, and $\gamma 11$, $\alpha 12$, $\beta 12$, and $\gamma 12$, and $\alpha 13$, $\beta 13$, and $\gamma 13$, it can be acquired as the light intensities (a', b', c') of the light rays from the point light sources PA', PB', and PC' as illustrated in a lower right part of FIG. 10, by a method similar to the method of acquiring the light intensities (a, b, c) of the light rays at the point light sources PA, PB, and PC in a case of the object plane 131 illustrated in an upper right part of FIG. 10, and consequently, it is possible to acquire the restored image of the object on the object plane 131'.

That is, a coefficient set group for every distance from the imaging element 121 of FIG. 2 to the object plane is stored in advance, a simultaneous equation is formed by switching the coefficient set group, and by solving the formed simultaneous equation, it is possible to acquire restored images of the object plane at various object distances on the basis of one detection image.

That is, by capturing the detection image only once, it is possible to generate a restored image at an arbitrary distance by switching a coefficient set group according to the distance to the object plane in a subsequent process to acquire the restored image.

Further, when it is desired to acquire characteristics of the object other than a visible image in image recognition, it is possible to apply machine learning such as deep learning or the like on a detection signal of the imaging element and perform image recognition or the like using the detection signal itself, without performing image recognition on the basis of a restored image after acquiring the restored image.

Further, in a case where the object distance and the angle of view can be specified, the restored image may be generated using the detection image formed by detection signals of pixels having incident angle directivities suitable for capturing an image of the object plane corresponding to the specified object distance and angle of view, without using all pixels. In this manner, the restored image can be acquired using a detection signal of a pixel suitable for capturing the image of the object plane corresponding to the specified object distance and angle of view.

Figure 11:
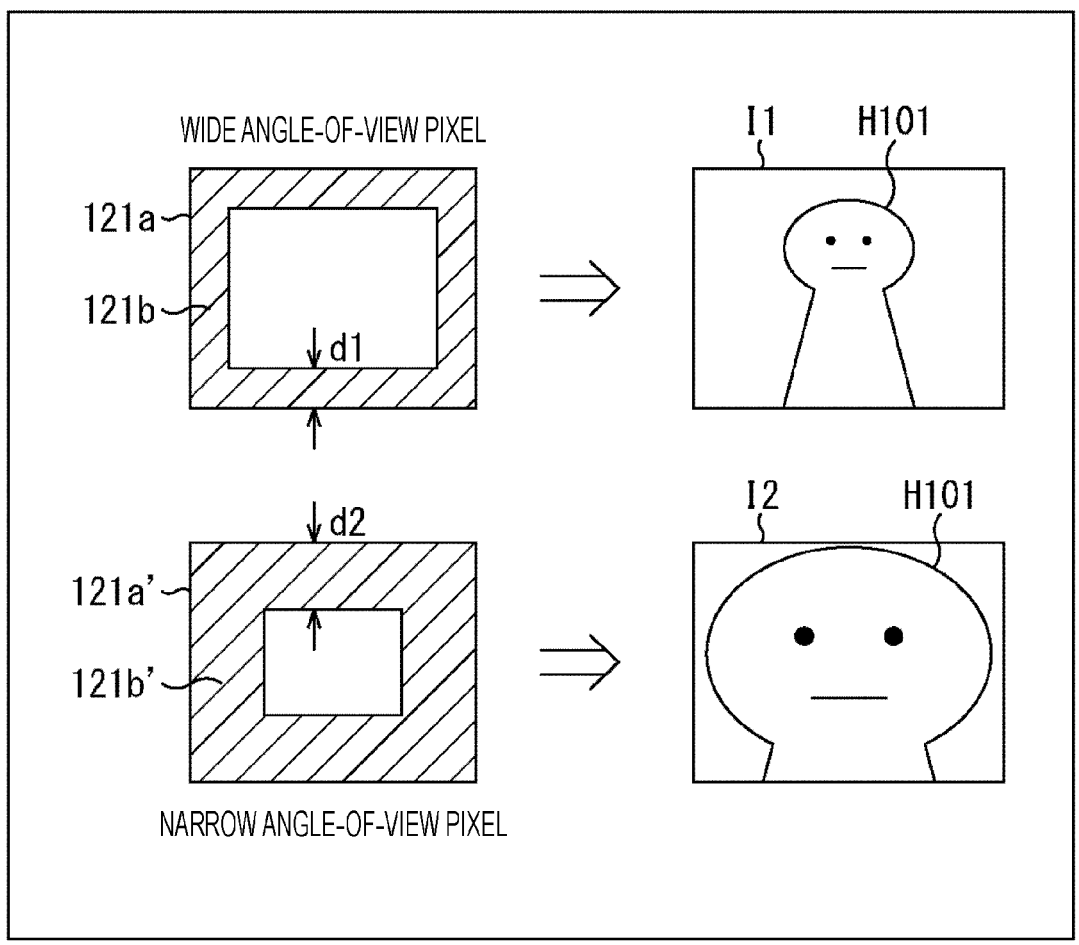
FIG. 11 is a diagram describing the relationship between narrow angle-of-view pixels and wide angle-of-view pixels.

For example, let us consider a pixel 121a that is shielded from light by a light shielding film 121b from respective ends of four sides by a width d1 as illustrated in an upper part of FIG. 11, and a pixel 121a' that is shielded from light by a light shielding film 121b from respective ends of four sides by a width d2 (>d1) as illustrated in a lower part of FIG. 11.

Figure 12:
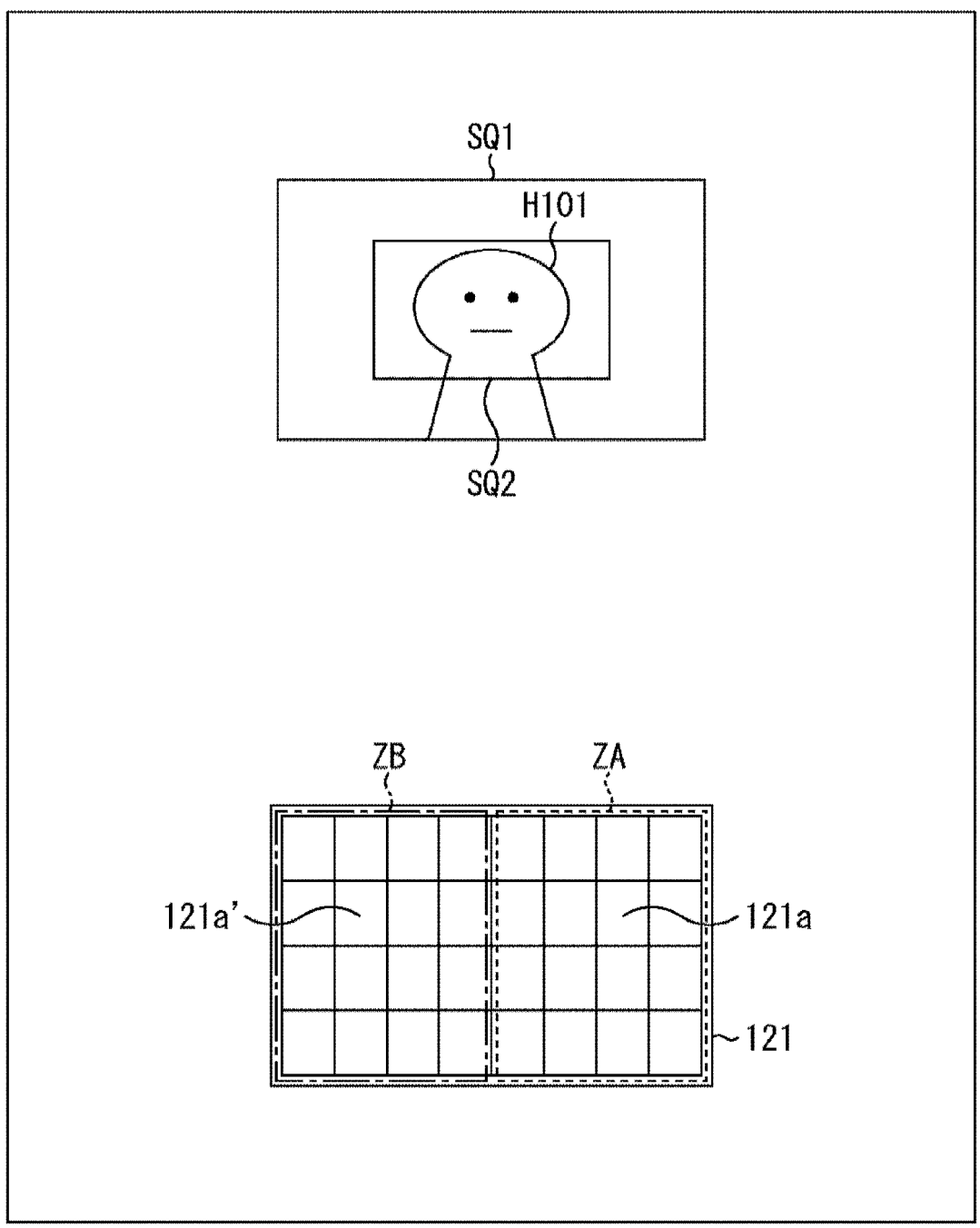
FIG. 12 is a diagram describing the relationship between the narrow angle-of-view pixels and the wide angle-of-view pixels.

The pixel 121a is used to restore an image I1 in FIG. 11 corresponding to an angle of view SQ1 including an entire person H101 as an object, as illustrated in an upper part of FIG. 12, for example. On the other hand, the pixel 121a' is used to restore an image I2 in FIG. 11 corresponding to an angle of view SQ2 in which a periphery of the face of the person H101 as the object is zoomed up, as illustrated in the upper part of FIG. 12, for example.

Figure 13:
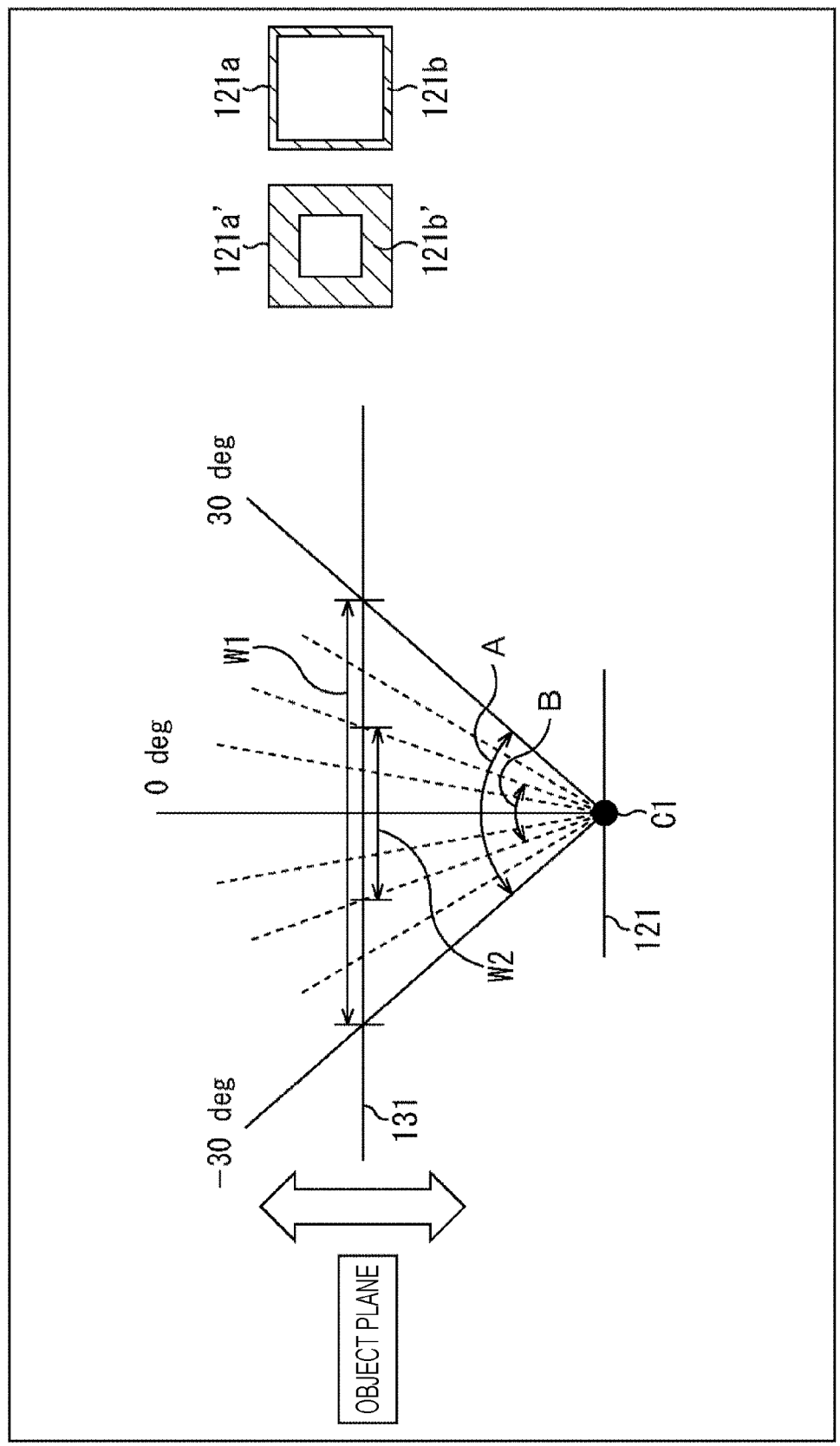
FIG. 13 is a diagram describing the relationship between the narrow angle-of-view pixels and the wide angle-of-view pixels.

This is because the pixel 121a in FIG. 11 has, as illustrated in a left part of FIG. 13, an incident possible angle range A of incident light with respect to the imaging element 121, and thus can receive incident light of the amount of an object width W1 in a horizontal direction on the object plane 131.

On the other hand, this is because the pixel 121a' in FIG. 11 has a wider light-shielded range than the pixel 121a in FIG. 11 and thus has, as illustrated in the left part of FIG. 13, an incident possible angle range B (<A) of incident light with respect to the imaging element 121, and hence receives incident light of the amount of an object width W2 (<W1) in the horizontal direction on the object plane 131.

That is, the pixel 121a in FIG. 11 having a narrow light-shielding range is a wide angle-of-view pixel suitable for capturing an image of a wide range on the object plane 131, whereas the pixel 121a' in FIG. 11 having a wide light-shielding range is a narrow angle-of-view pixel suitable for capturing an image of a narrow range on the object plane 131. Note that the wide angle-of-view pixel and the narrow angle-of-view pixel mentioned here are expressions to compare both the pixels 121a and 121a' in FIG. 11, and are not limited thereto when comparing pixels with other angles of view.

Note that FIG. 13 illustrates the relationship between positions on the object plane 131 with respect to a center position C1 of the imaging element 121 and incident angles of incident light from the respective positions. Further, in FIG. 13, the relationship between the positions on the object plane 131 and incident angles of incident light from the respective positions on the object plane 131 with respect to the horizontal direction is illustrated, but there is a similar relationship with respect to a vertical direction. Moreover, the pixels 121a and 121a' in FIG. 11 are illustrated on a right part of FIG. 13.

With such a configuration, as illustrated in a lower part of FIG. 12, in a case where a predetermined number of the pixels 121a of FIG. 11 is collected in a range ZA surrounded by a dotted line in the imaging element 121 and a predetermined number of the pixels 121a' of FIG. 11 is collected in a range ZB surrounded by an alternate long and short dash line, when an image of the angle of view SQ1 corresponding to the object width W1 is restored, an image with the object width W1 on the object plane 131 can be appropriately restored by using the pixels 121a of FIG. 11 that capture an image of the angle of view SQ1.

Similarly, when an image of the angle of view SQ2 corresponding to the object width W2 is to be restored, an image of the object width W2 can be appropriately restored by using the detection signal level of the pixel 121a' of FIG. 11 that captures an image of the field angle SQ2.

Note that, in the lower part of FIG. 12, the configuration is illustrated in which the pixel 121a' is provided on the left side in the diagram by a predetermined number of pixels and the pixel 121a is provided on the right side by a predetermined number of pixels, but this is presented as an example for simplicity of description. It is desirable that the pixels 121a and the pixels 121a' are randomly mixed and arranged.

As described above, since the angle of view SQ2 is narrower than the angle of view SQ1, in a case where restoring the images of the angle of view SQ2 and the angle of view SQ1 with the same predetermined number of pixels, restoring the image of the angle of view SQ2 that is narrower in angle of view than the image of the angle of view SQ1 can provide the restored image with higher quality.

That is, in a case of considering acquiring the restored image using the same number of pixels, restoring an image with a narrower angle of view can provide the restored image with higher quality.

Note that in a case of acquiring an image with a wide angle of view as the restored image, all the wide angle-of-view pixels may be used, or a part of the wide angle-of-view pixels may be used. Further, in a case of acquiring an image with a narrow angle of view as the restored image, all the narrow angle-of-view pixels may be used, or a part of the narrow angle-of-view pixels may be used.

By using the imaging element 121 as described above, consequently, an imaging lens, an optical element including a diffraction grating or the like, a pinhole, or the like is not required (it is imaging-lens free). Thus, it is possible to increase the degree of freedom in designing the device, It is possible to achieve reduction in size of the device in the incident direction of incident light, and it is possible to reduce the manufacturing cost. Further, a lens corresponding to an imaging lens for forming an optical image, such as a focus lens, is also not required.

Moreover, by using the imaging element 121, just acquiring the detection image enables, thereafter, restored images with various object distances and angles of view to be generated by acquiring a restored image by solving a simultaneous equation composed by selectively using a coefficient set group according to the object distance and the angle of view.

Moreover, since the imaging element 121 can have incident angle directivity in pixel units, it is possible to achieve a multi-pixel configuration as compared with an optical filter that includes a diffraction grating and a conventional imaging element, and the like, and the restored image with a high resolution and also with a high angle-of-view resolution can be acquired. On the other hand, in an imaging device including an optical filter and a conventional imaging element, even if pixels are miniaturized, it is difficult to miniaturize the optical filter, and thus it is difficult to achieve the high resolution of the restored image, or the like.

Further, since the imaging element 121 does not require an optical filter including a diffraction grating, or the like, the use environment does not become hot and the optical filter is not distorted by heat. Therefore, by using such an imaging element 121, it is possible to achieve a device with high environmental resistance.

<First Modification Example>

In the right part of FIG. 4, an example is described in which, as a configuration of the light shielding film 121b in each pixel 121a of the imaging element 121, an overall light shielding is provided in the vertical direction and a light-shielding width and position in the horizontal direction are changed, and thus differences in incident angle directivity in the horizontal direction are given. However, the configuration of the light shielding film 121b is not limited to this example. For example, an overall light shielding may be provided in the horizontal direction, and a width (height) and position in the vertical direction may be changed, so as to give a difference in the incident angle directivity in the vertical direction.

Note that, as in the example illustrated in the right part of FIG. 4, the light shielding film 121b that shields the entire pixel 121a in the vertical direction and shields the pixel 121a with a predetermined width in the horizontal direction is referred to as a horizontal strip-type light shielding film 121b. On the other hand, a light shielding film 121b that shields the entire pixel 121a in the horizontal direction and shields the pixel 121a with a predetermined height in the vertical direction is referred to as a vertical strip-type light shielding film 121b.

Figure 14:
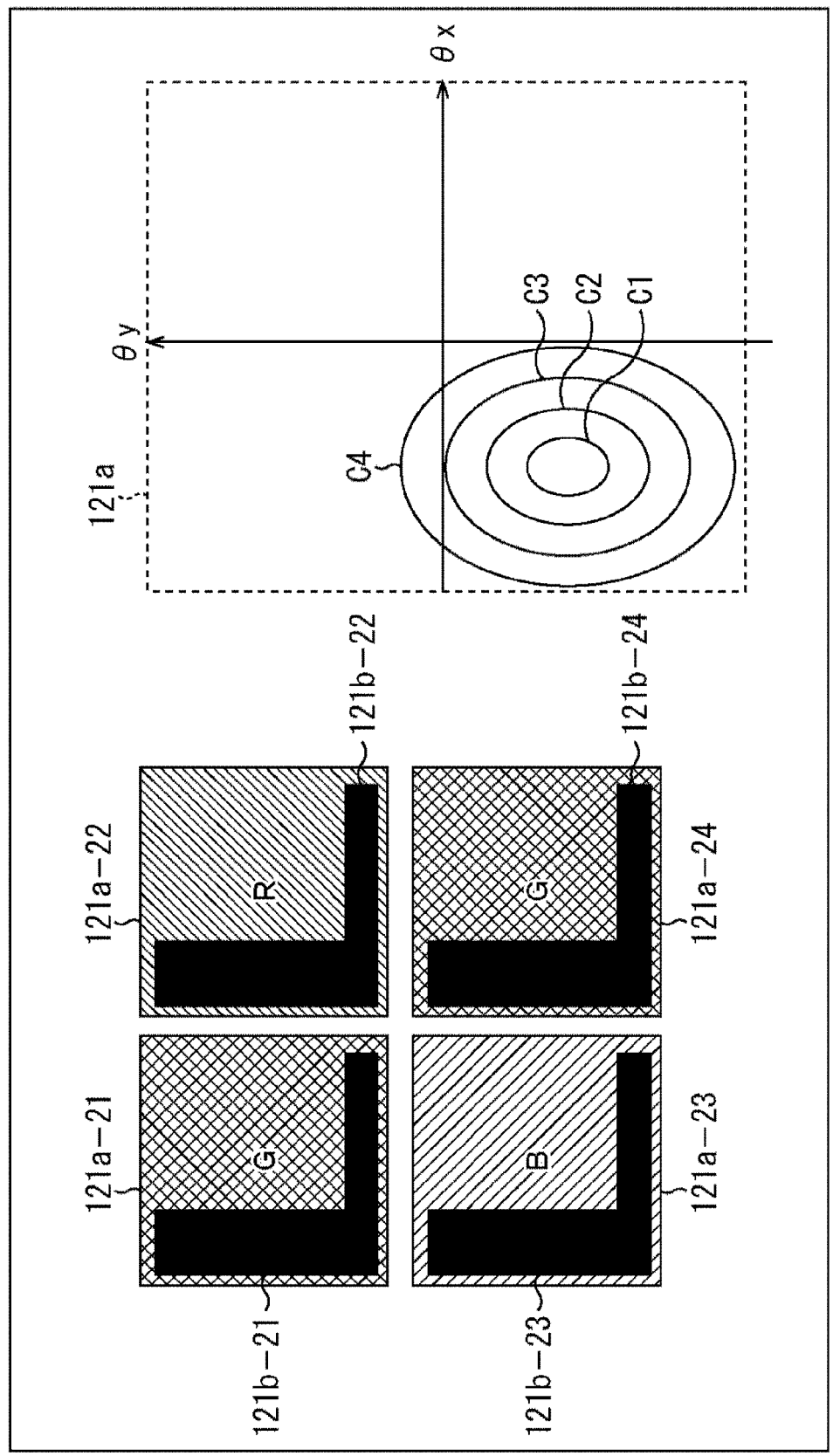
FIG. 14 is a diagram describing a modification example.

Further, as in an example illustrated in a left part of FIG. 14, vertical strip-type and horizontal strip-type light shielding films 121b may be combined to provide pixels 121a with L-shaped light shielding films 121b. In the left part of FIG. 14, parts illustrated in black are the light shielding films 121b. That is, light shielding films 121b-21 to 121b-24 are light shielding films of pixels 121a-21 to 121a-24, respectively.

Each of these pixels (pixels 121a-21 to 121a-24) has an incident angle directivity as illustrated in a right part of FIG. 14. A graph illustrated on the right part of FIG. 14 illustrates light receiving sensitivity in respective pixels. The horizontal axis represents an incident angle $\theta x$ of incident light in the horizontal direction (x direction), and the vertical axis represents an incident angle $\theta y$ of incident light in the vertical direction ($\gamma$ direction). Then, a light receiving sensitivity in a range C4 is higher than an outside of the range C4, a light receiving sensitivity in a range C3 is higher than an outside of the range C3, a light receiving sensitivity in a range C2 is higher than an outside of the range C2, and a light receiving sensitivity within a range C1 is higher than an outside of the range C1.

Therefore, for each pixel, it is illustrated that a detection signal level of incident light that satisfies conditions of the incident angle $\theta x$ in the horizontal direction (x direction) and the incident angle $\theta y$ in the vertical direction ($\gamma$ direction) to be within the range C1 becomes the highest, and the detection signal level decreases in the order of the conditions within the range C2, the range C3, the range C4, and a range other than the range C4. Such intensity of the light receiving sensitivity is determined by the range shielded from light by the light shielding film 121b.

Further, in the left part of FIG. 14, an alphabet in each pixel 121a indicates the color of the color filter (illustrated for convenience of description, not actually depicted). A pixel 121a-21 is a G pixel on which a green color filter is arranged, a pixel 121a-22 is an R pixel on which a red color filter is arranged, a pixel 121a-23 is a B pixel on which a blue color filter is arranged, and a pixel 121a-24 is a G pixel on which a green color filter is arranged. That is, these pixels form a Bayer array. Of course, this is an example, and the arrangement pattern of the color filters is arbitrary. The arrangement of the light shielding films 121b and the color filters are irrelevant. For example, a filter other than the color filters may be provided in some or all of the pixels, or no filter may be provided.

In the left part of FIG. 14, an example is illustrated in which the "L-shaped" light shielding film 121b shields a left side and a lower side of the pixel 121a in the diagram, but the orientation of the "L-shaped" light shielding film 121b is arbitrary and is not limited to the example of FIG. 14. For example, the "L-shaped" light shielding film 121b may shield the lower side and a right side of the pixel 121a from light in the diagram, or may shield the right side and an upper side of the pixel 121a from light in the diagram, or may shield the upper side and the left side of the pixel 121a from light in the diagram. Of course, the direction of the light shielding film 121b can be set independently for every pixel. Note that the "L-shaped" light shielding film 121b is also referred to as "L-type light shielding film 121b".

Although the light shielding film has been described above, the description of this example can also be applied to a case where the incident angle directivity is provided by selectively using a plurality of photodiodes arranged in the pixel. That is, for example, by appropriately setting a dividing position (size and shape of each partial region), a position, a size, a shape, and the like of each photodiode, and appropriately selecting a photodiode, an incident light directivity equivalent to the incident light directivity by the L-type light shielding film 121b described above can be achieved.

<Second Modification Example>

In the above, an example has been described in which each of the horizontal strip-type, vertical strip-type, and L-type light shielding films is arranged in each pixel so that the light-shielded range changes randomly. However, for example, in a case where a rectangular aperture is provided as illustrated by an imaging element 121' in FIG. 15, a light shielding film 121b may be formed that shields from light other than a range near a position where a light ray is received in each individual pixel (range illustrated in black in the diagram).

That is, in a case where a rectangular opening is provided for each pixel, among light rays emitted from point light sources forming an object plane at a predetermined object distance, the light shielding film 121b may be provided so as to have an incident angle directivity so as to receive only light rays that are transmitted through the rectangular opening and received.

Figure 15:
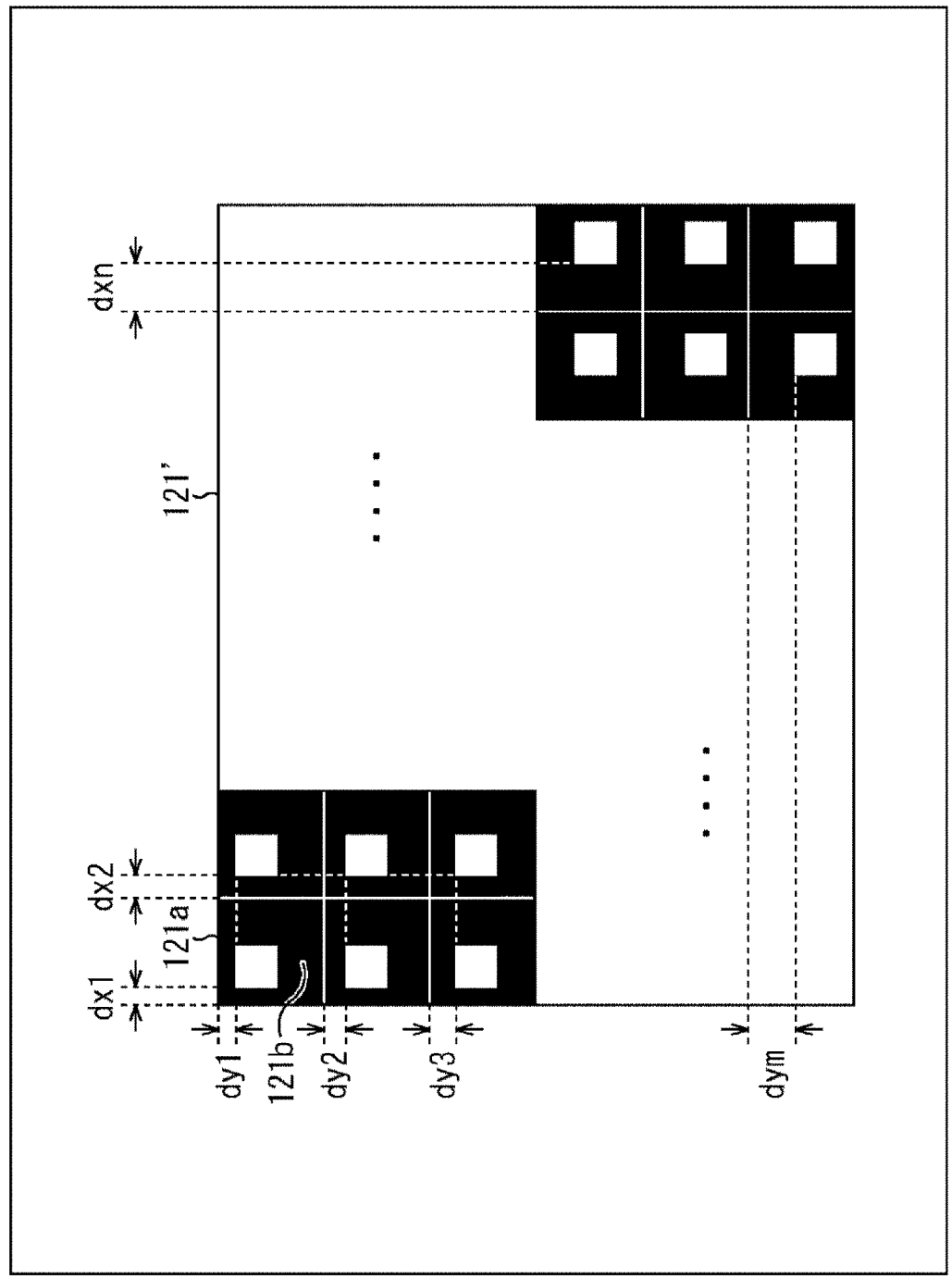
FIG. 15 is a diagram describing a modification example.

Note that, in FIG. 15, for example, with respect to a horizontal pixel array, a horizontal width of the light shielding film 121b changes to widths dx1, dx2, . . . , and dxn, which are in the relationship of dx1<dx2< . . . <dxn. Similarly, with respect to a vertical pixel array, a vertical height of the light shielding film 121b changes to heights dy1, dy2, . . . , and dym, which are in the relationship of dy1<dy2< . . . <dxm. Furthermore, intervals between respective changes in the horizontal width and the vertical width of the light shielding film 121b depend on an object resolution (angular resolution) to be restored.

In other words, it can be said that the configuration of each pixel 121a in the imaging element 121' of FIG. 15 is given an incident angle directivity such that the light shielding range is changed so as to correspond to a pixel arrangement in the imaging element 121' in the horizontal direction and the vertical direction.

Figure 16:
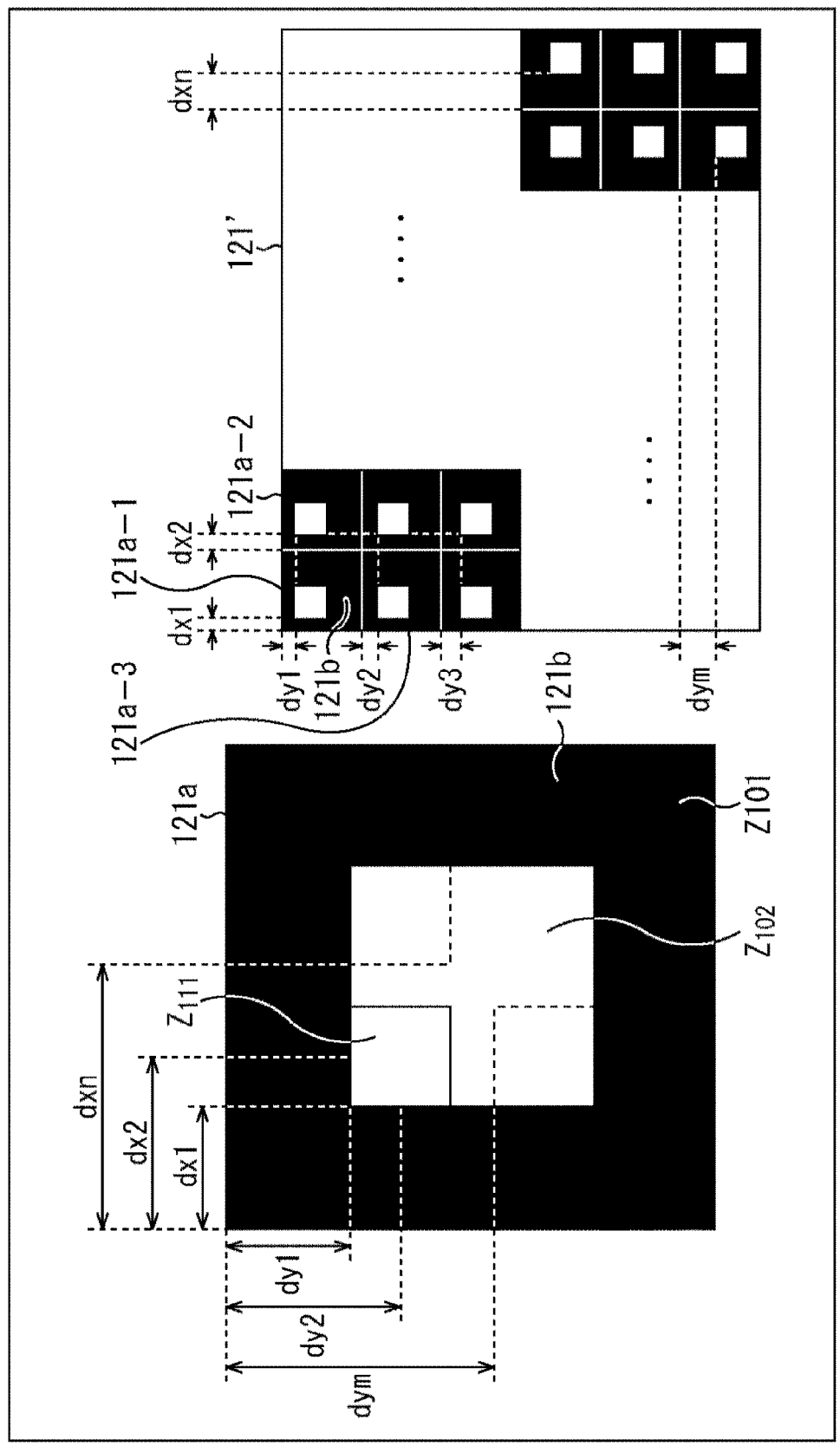
FIG. 16 is a diagram describing a modification example.

More specifically, the light-shielding range of each pixel 121a in FIG. 15 is determined according to a rule described by using a pixel 121a illustrated in a left part of FIG. 16, for example.

Note that a right part of FIG. 16 illustrates the same configuration of the imaging element 121' as that of FIG. 15. Further, the left part of FIG. 16 illustrates a configuration of the pixel 121a of the imaging element 121' in the right part of FIG. 16 (the same as FIG. 15).

As illustrated in the left part of FIG. 16, the light shielding film 121b shields from light by the width dx1 from respective ends of an upper side and a lower side of the pixel 121a toward an inside of the pixel 121a, and the light shielding film 121b shields from light by the height dy1 from respective ends of a left side and a right side of the pixel 121a toward the inside of the pixel 121a. Note that in FIGS. 16 and 17, the light shielding film 121b is in a range illustrated in black.

In the left part of FIG. 16, the range that is shielded from light by forming the light shielding film 121b in this manner will be hereinafter referred to as a main light-shielding part 2101 of the pixel 121a (black part of the left part of FIG. 16), and the range of the square shape other than that will be referred to as a range 2102.

It is assumed that a rectangular opening 2111 that is not shielded from light by the light shielding film 121b is provided in the range 2102 in the pixel 121a. Therefore, in the range 2102, a range other than the rectangular opening 2111 is shielded from light by the light shielding film 121b.

In a pixel array in the imaging element 121' of FIG. 15, as illustrated in the right part of FIG. 16 (the same as FIG. 15), a pixel 121a-1 at a left end and at an upper end has the rectangular opening 2111 arranged so that a left side thereof is at the width dx1 from the left side of the pixel 121a, and an upper side thereof is at the distance of dy1 from the upper side of the pixel 121a.

Similarly, a pixel 121a-2 on the right of the pixel 121a-1 has the rectangular opening 2111 arranged so that the left side thereof is at the width dx2 from the left side of the pixel 121a, and the upper side thereof is at the distance of the height dy1 from the upper side of the pixel 121a, and a range other than the rectangular opening 2111 is shielded from light by the light shielding film 121b.

Thereafter, similarly, in the pixels 121a that are adjacent in the horizontal direction, a right side of the rectangular opening 2111 moves from the right side of the pixel 121a to the widths dx1, dx2, . . . , and dxn as the arrangement proceeds rightward in the diagram. Note that a rectangular portion of a dotted line in an upper right part of the range 2102 in FIG. 16 illustrates a state that the rectangular opening 2111 is arranged so that the left side thereof is at the width dxn from the left side of the pixel 121a, and the upper side thereof is at the distance of the height dy1 from the upper side of the pixel 121a. Further, each interval of the widths dx1, dx2, . . . , and dxn is a value acquired by dividing a width acquired by subtracting the width of the rectangular opening 2111 from a horizontal width of the range 2102 by the number n of pixels in the horizontal direction. That is, the interval between changes in the horizontal direction is determined by dividing by the number n of pixels in the horizontal direction.

Further, the horizontal position of the rectangular opening 2111 in the pixel 121a in the imaging element 121' is the same in the pixels 121a whose horizontal positions in the imaging element 121' are the same (the pixels 121a in the same column).

Moreover, a pixel 121a-3 immediately below the pixel 121a-1 has the rectangular opening 2111 arranged so that the left side thereof is at the width dx1 from the left side of the pixel 121a, and the upper side thereof is at the distance of the height dy2 from the upper side of the pixel 121a, and a range other than the rectangular opening 2111 is shielded from light by the light shielding film 121b.

Thereafter, similarly, in the pixels 121a that are adjacent in the vertical direction, the upper side of the rectangular opening 2111 moves from the upper side of the pixel 121a to the heights dy1, dy2, . . . , and dyn as the arrangement proceeds downward in the diagram. Note that a rectangular portion of a dotted line in a lower left portion of the range 2102 in FIG. 16 illustrates a state that the rectangular opening 2111 is arranged so that the left side thereof is at the width dx1 from the left side of the pixel 121a, and the upper side thereof is at the distance of the height dym from the upper side of the pixel 121a. Further, each interval of the heights dy1, dy2, . . . , and dym is a value acquired by dividing a height acquired by subtracting the height of the rectangular opening 2111 from a vertical height of the range 2102 by the number m of pixels in the vertical direction. That is, the interval between changes in the vertical direction is determined by dividing by the number m of pixels in the vertical direction.

Further, the vertical position of the rectangular opening 2111 in the pixel 121a in the imaging element 121' is the same in the pixels 121a whose vertical positions in the imaging element 121' are the same (the pixels 121a in the same row).

Moreover, the angle of view can be changed by changing the main light-shielding part 2101 and the rectangular opening 2111 of each pixel 121a that form the imaging element 121' illustrated in FIG. 16 (FIG. 15).

Figure 17:
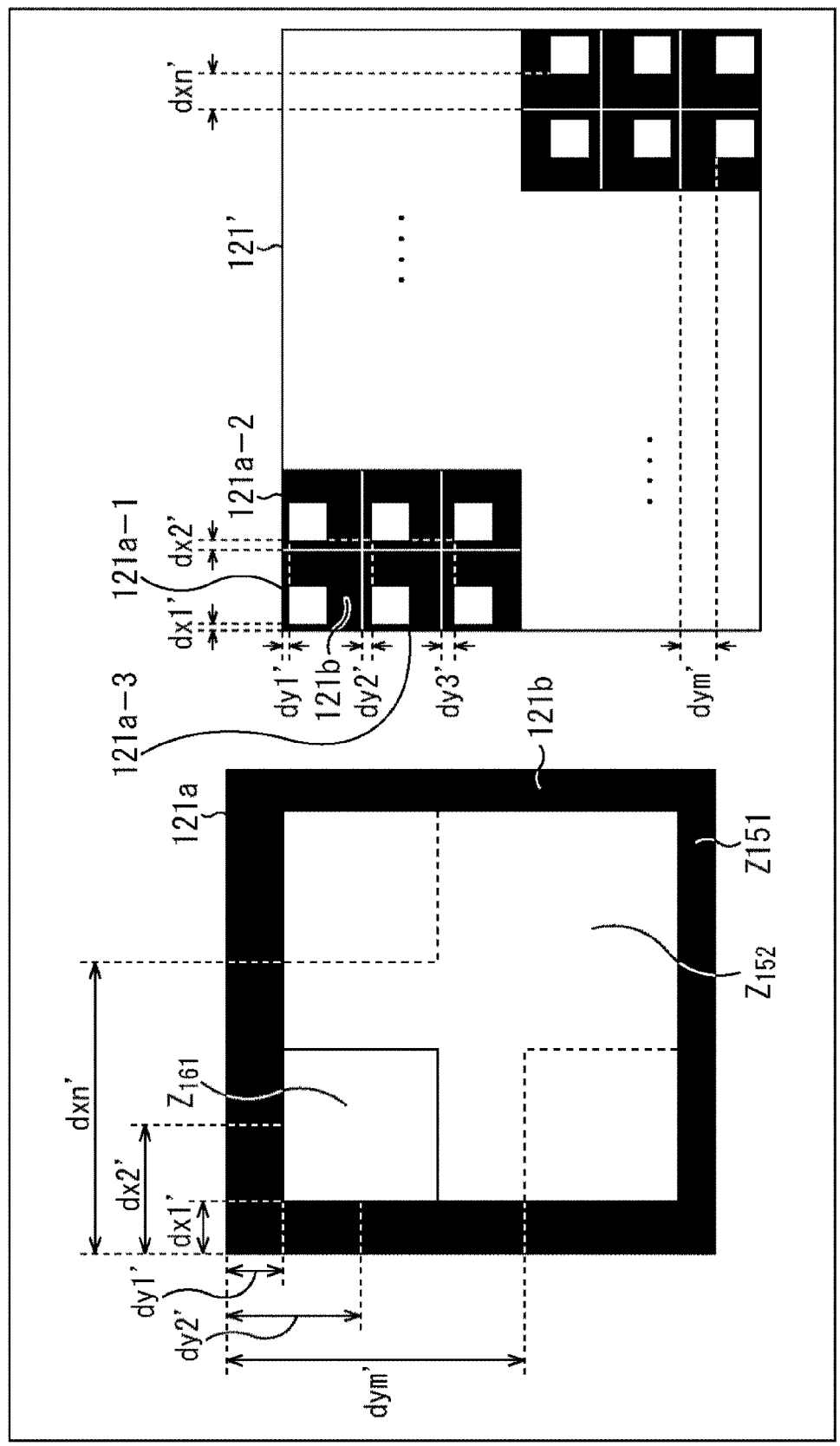
FIG. 17 is a diagram describing an example of changing an angle of view by applying a modification example.

A right part of FIG. 17 illustrates a configuration of the imaging element 121' in a case where the angle of view is wider than that of the imaging element 121' of FIG. 16 (FIG. 15). Further, a left part of FIG. 17 illustrates a configuration of the pixel 121a of the imaging element 121' in the right part of FIG. 17.

That is, as illustrated in the left part of FIG. 17, for example, in the pixel 121a, a main light shielding part 2151 (black part on the left part of FIG. 17) having a light shielding range narrower than that of the main light-shielding part 2101 in FIG. 16 is set, and a range other than that is set to a range 2152. Moreover, a rectangular opening 2161 having a larger opening area than the rectangular opening 2111 is set within the range 2152.

More specifically, as illustrated in the left part of FIG. 17, the light shielding film 121b shields from light by a width dx1' (<dx1) from respective ends of an upper side and a lower side of the pixel 121a toward an inside of the pixel 121a, and the light shielding film 121b shields light by a height dy1' (<dy1) from respective ends of a left side and a right side of the pixel 121a toward the inside of the pixel 121a, thereby forming the rectangular opening 2161.

Here, as illustrated in the right part of FIG. 17, a pixel 121a-1 at a left end and an upper end has the rectangular opening 2161 arranged so that a left side thereof is at the width dx1' from the left side of the pixel 121a, and an upper side thereof is at the distance of the height dy1' from the upper side of the pixel 121a, and a range other than the rectangular opening 2161 is shielded from light by the light shielding film 121b.

Similarly, a pixel 121a-2 on the right of the pixel 121a-1 has the rectangular opening 2161 arranged so that a left side thereof is at a width dx2' from the left side of the pixel 121a, and an upper side thereof is at the distance of the height dy1' from the upper side of the pixel 121a, and a range other than the rectangular opening 2161 is shielded from light by the light shielding film 121b.

Thereafter, similarly, in the pixels 121a that are adjacent in the horizontal direction, a right side of the rectangular opening 2161 moves from the right side of the pixel 121a to the widths dx1', dx2', . . . , and dxn' as the arrangement proceeds rightward in the diagram. Here, each interval of the widths dx1', dx2', . . . , and dxn' is a value acquired by dividing a width acquired by subtracting the horizontal width of the rectangular opening 2161 from a horizontal width of the range 2152 by the number n of pixels in the horizontal direction. That is, the interval between changes in the vertical direction is determined by dividing by the number n of pixels in the horizontal direction. Therefore, the interval between changes in the widths dx1', dx2', . . . , and dxn' is larger than the interval between changes in the widths dx1, dx2, . . . , and dxn.

Further, the horizontal position of the rectangular opening 2161 in the pixel 121a in the imaging element 121' of FIG. 17 is the same in the pixel 121a (pixel 121a in the same column) whose horizontal position in the imaging element 121' is the same.

Moreover, a pixel 121a-3 immediately below the pixel 121a-1 has a rectangular opening 2161 arranged so that a left side thereof is at a width dx1' from the left side of the pixel 121a, and an upper side thereof is at a height dy2' from the upper side of the pixel 121a, and a range other than the rectangular opening 2161 is shielded from light by the light shielding film 121b.

Thereafter, similarly, in the pixels 121a that are adjacent in the vertical direction, the upper side of the rectangular opening 2161 changes from the upper side of the pixel 121a to the heights dy1', dy2', . . . , and dym' as the arrangement proceeds downward in the diagram. Here, an interval of changes of the heights dy1', dy2', . . . , and dym' is a value acquired by dividing a height acquired by subtracting the height of the rectangular opening 2161 from a vertical height of the range 2152 by the number m of pixels in the vertical direction. That is, the interval between changes in the vertical direction is determined by dividing by the number m of pixels in the vertical direction. Therefore, the interval between changes in the heights dy1', dy2', . . . , and dym' is larger than the interval between changes in the widths dy1, dy2, . . . , and dym.

Further, the vertical position of the rectangular opening 2161 in the pixel 121a in the imaging element 121' of FIG. 17 is the same in the pixel 121a whose vertical position in the imaging element 121' is the same (pixel 121a in the same row).

As described above, by changing the combination of the light shielding range of the main light-shielding part and the opening range of the opening, the imaging element 121' including the pixels 121a having various angles of view (having various incident angle directivities) can be achieved.

Moreover, not only the pixels 121a having the same angle of view but also the pixels 121a having various angles of view may be combined to achieve the imaging element 121.

Figure 18:
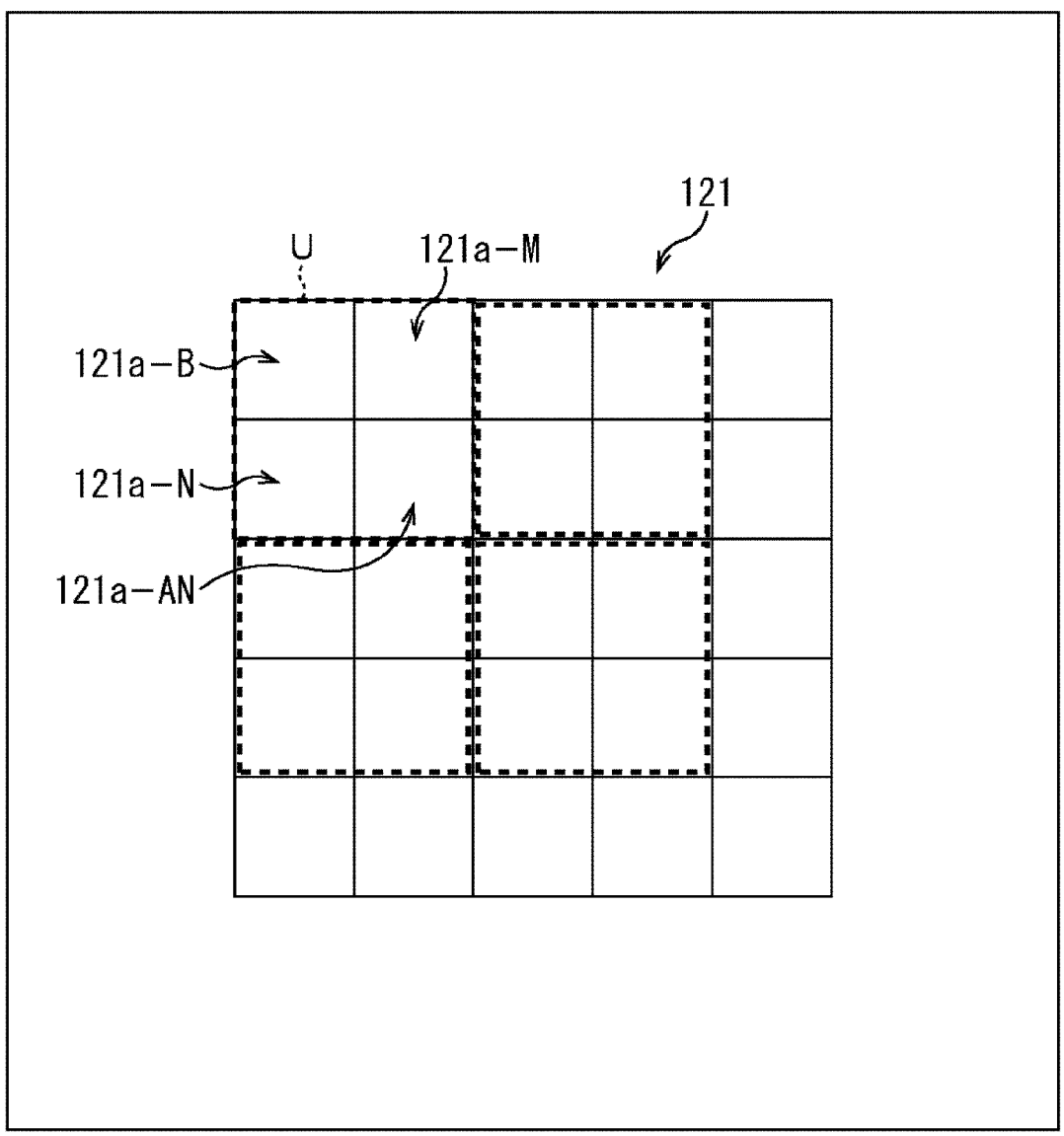
FIG. 18 is a diagram describing an example of combining pixels of a plurality of angles of view when the angle of view is changed by applying the modification example.

For example, as illustrated in FIG. 18, four pixels including two pixels x two pixels depicted by dotted lines are set as one unit U, and each unit U includes four pixels, a pixel 121a-W with a wide angle of view, a pixel 121a-M with a medium angle of view, a pixel 121a-N with a narrow angle of view, and a pixel 121a-AN with a very narrow angle of view.

In this case, for example, when the number of pixels of all the pixels 121a is X, it is possible to restore the restored image using the detection image of X/4 pixels for every one of the four types of angles of view. At this time, four different types of coefficient sets are used for every angle of view, and restored images having different angles of view are respectively restored by four different types of simultaneous equations.

For this reason, by restoring the restored image of an angle of view to be restored using the detection image acquired from a pixel suitable for capturing an image of the angle of view to be restored, the appropriate restored image corresponding to the four types of angles of view can be restored.

Further, an image of an intermediate angle of view of the four angles of view and images before and after the intermediate angle of view may be generated by interpolation from images of four different angles of view, and images with various angles of view may be generated seamlessly to thereby achieve pseudo optical zoom.

Although the light shielding film has been described above, the description of this example can also be applied to a case where the incident angle directivity is provided by selectively using a plurality of photodiodes arranged in the pixel. That is, for example, by appropriately setting a dividing position (size and shape of each partial region), a position, a size, a shape, and the like of each photodiode, and appropriately selecting a photodiode, an incident light directivity equivalent to the incident light directivity by the light shielding film 121b having the above-described rectangular opening can be achieved. Of course, also in this case, the imaging element 121 can be achieved by combining the pixels 121a having various angles of view. Furthermore, an image of an intermediate angle of view and images before and after the intermediate angle of view may be generated by interpolation from images of a plurality of types of angle of view, and images with various angles of view may be generated seamlessly to thereby achieve pseudo optical zoom.

<Third Modification Example>

Incidentally, in a case where the light-shielding ranges of the light shielding films 121b of the pixel 121a in the imaging element 121 have randomness, the greater the degree of randomness of difference among the light-shielding regions of the light shielding films 121b, the larger the load of processing on the restoration unit 124 and the like. Therefore, a part of the difference in the light-shielding ranges of the light shielding films 121b of the pixel 121a may be made regular, and the processing load may be reduced by reducing this randomness of difference.

For example, horizontal strip-type light shielding films 121b having the same width are combined in a predetermined column direction, and vertical strip-type light shielding films 121b having the same height are combined in a predetermined row direction, so as to form L-type light shielding films 121b combining a vertical strip-type and a horizontal strip-type. In this manner, while the light-shielding ranges of the light shielding films 121b of each pixel 121a have regularity in the column direction and the row direction, they are set to randomly different values in pixel units. As a result, difference in the light-shielding ranges of the light shielding films 121b of each pixel 121a, that is, randomness of difference in the incident angle directivity of each pixel can be reduced, and a processing load external to the imaging element 121 such as the restoration unit 124 can be reduced.

Figure 19:
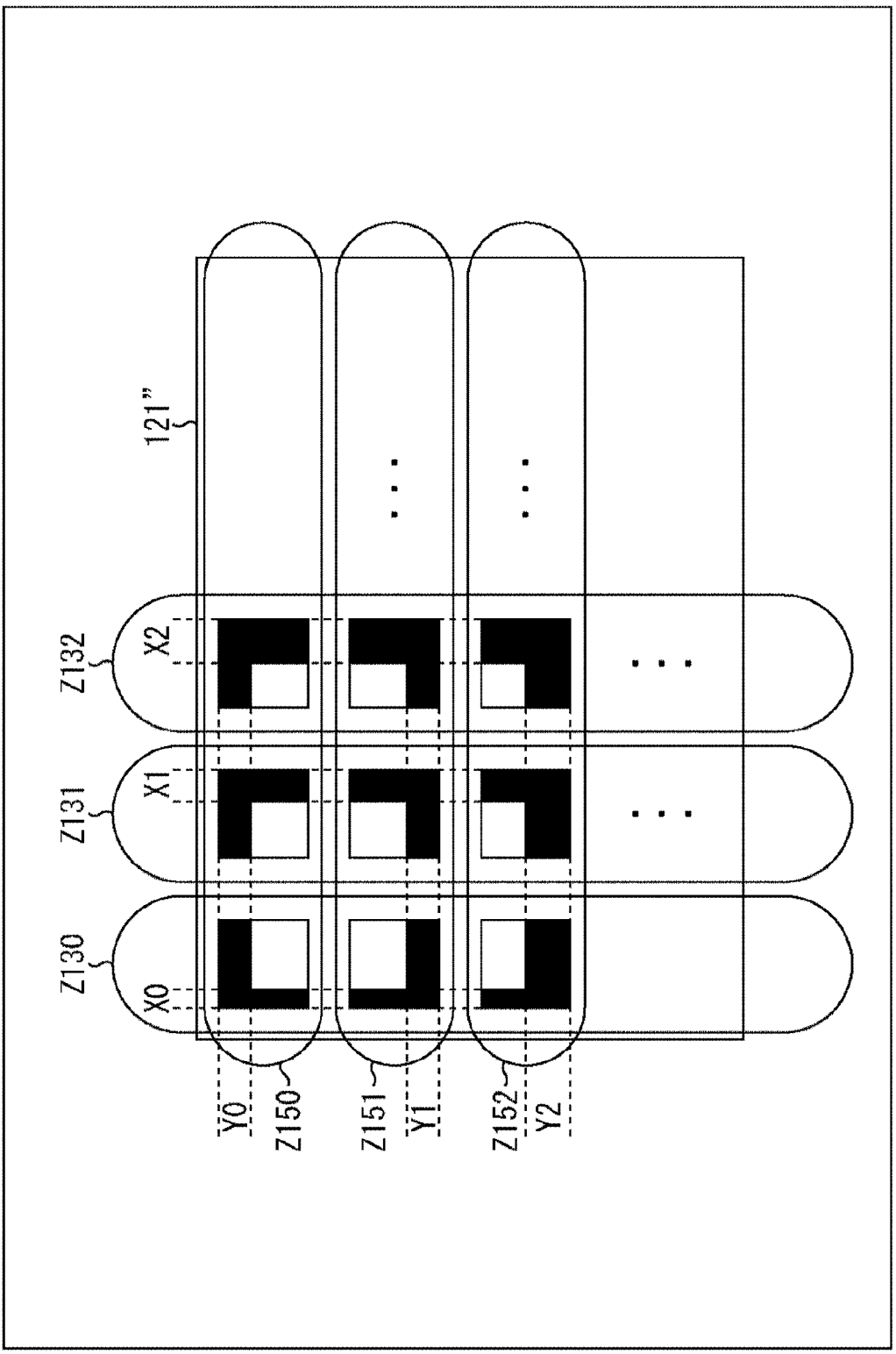
FIG. 19 is a diagram describing a modification example.

For example, in a case of the imaging element 121" of FIG. 19, horizontal strip-type light shielding films 121b having the same width X0 are used for all pixels in the same column illustrated in a range 2130, vertical strip-type light shielding films 121b having the same height Y0 are used for pixels in the same row illustrated in a range 2150, and L-type light shielding films 121b in which these are combined are set to pixels 121a specified in each matrix.

Similarly, horizontal strip-type light shielding films 121b having the same width X1 are used for all pixels in the same column illustrated in a range 2131 adjacent to the range 2130, vertical strip-type light shielding films 121b having the same height Y1 are used for pixels in the same row illustrated in a range 2151 adjacent to the range 2150, and L-type light shielding films 121b in which these are combined are set to pixels 121a specified in each matrix.

Moreover, horizontal strip-type light shielding films having the same width X2 are used for all pixels in the same column illustrated in a range 2132 adjacent to the range 2131, vertical strip-type light shielding films having the same height Y2 are used for pixels in the same row illustrated in a range 2152 adjacent to the range Z151, and L-type light shielding films 121b in which these are combined are set to pixels 121a specified in each matrix.

In this manner, while horizontal widths and positions and vertical heights and positions of the light shielding films 121b have regularity, the ranges of the light shielding films can be set to different values in units of pixels. Thus, randomness of difference in the incident angle directivity can be suppressed. Consequently, it is possible to reduce a pattern of coefficient sets, and it is possible to reduce a processing load of arithmetic processing in the subsequent stage (for example, the restoration unit 124 and the like).

<Fourth Modification Example>

Variations in shapes of the light shielding films 121b in pixel units are arbitrary, and are not limited to the respective examples described above. For example, the light shielding films 121b may be set to have triangular shapes with different ranges to thereby give (set) different incident angle directivities, or the light shielding films 121b may be set to have circular shapes with different ranges to thereby give (set) different incident angle directivities Furthermore, for example, a linear light shielding film in an oblique direction may be used.

Further, a variation (pattern) of the light shielding films 121b may be set for each of a plurality of pixels constituting a unit including a predetermined number of plural pixels. This one unit may be configured by any pixel. For example, the imaging element 121 may include a color filter, and may include pixels that form a unit of a color array of the color filter. Further, a pixel group in which pixels having different exposure times are combined may be the unit. Note that it is desirable that randomness of a pattern of ranges where the light shielding films 121b shield light in each pixel forming the unit is high, that is, it is desirable that the pixels constituting the unit have different incident angle directivities.

Further, an arrangement pattern of the light shielding films 121b may be set among units. For example, the widths and positions of the light shielding films may be changed for every unit. Moreover, a pattern of ranges where the light shielding films 121b shield light may be set within a unit including a plurality of pixels classified into different categories or among units.

Although the light shielding film has been described above, the description of this example can also be applied to a case where the incident angle directivity is provided by selectively using a plurality of photodiodes arranged in the pixel. That is, for example, by appropriately setting a dividing position (size and shape of each partial region), a position, a size, a shape, and the like of each photodiode, and appropriately selecting a photodiode, an incident light directivity equivalent to the incident light directivity in a case where a part of changes in the light shielding ranges of the light shielding films 121b of the above-described pixels 121*a* can be achieved. With this configuration, it is possible to reduce randomness of the incident angle directivities of respective pixels and reduce a processing load outside the imaging element 121, such as the restoration unit 124.

Although the light shielding film has been described above, the description of this example can also be applied to a case where the incident angle directivity is provided by selectively using a plurality of photodiodes arranged in the pixel. That is, by appropriately setting a dividing position (size and shape of each partial region), a position, a size, a shape, and the like of each photodiode, and appropriately selecting the photodiode, for example, an incident light directivity equivalent to an incident light directivity by a light shielding film having an arbitrary shape such as a triangle, a circle, or a line in an oblique direction can be achieved.

Further, for example, setting of a dividing position (size and shape of each partial region), setting of a position, a size, a shape, and the like of each photodiode, selecting a photodiode, and the like may be set in every unit similarly to the case of the light shielding films 121*b* described above.

<Control of Photodiode>

In a case of selectively using the plurality of photodiodes arranged in the pixel as described above with reference to FIG. 6, the presence or absence or the degree of contribution of each of the plurality of photodiodes 121*f* to the output pixel value of the pixel output unit may be switched, to thereby variously change the incident angle directivity of the output pixel value of the pixel output unit.

Figure 20:
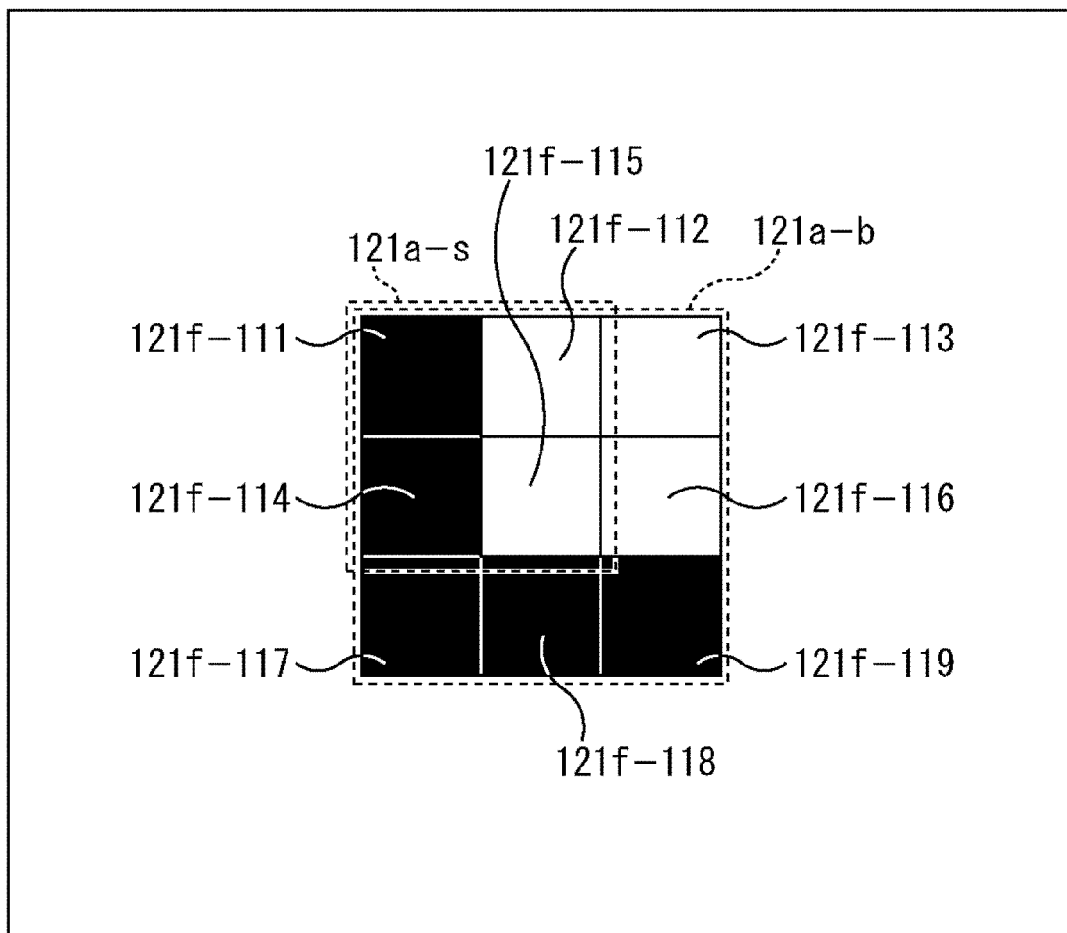
FIG. 20 is a diagram describing a modification example.

For example, as illustrated in FIG. 20, it is assumed that nine (three vertical x three horizontal) photodiodes 121*f* of photodiodes 121*f*-111 to 121*f*-119 are arranged in the pixel 121*a*. In this case, this pixel 121*a* may be used as a pixel 121*a*-*b* having the photodiodes 121*f*-111 to 121*f*-119, or used as a pixel 121*a*-*s* having the photodiodes 121*f*-111, 121*f*-112, 121*f*-114, and 121*f*-115.

For example, in a case where the pixel 121*a* is the pixel 121*a*-*b*, the presence or absence or the degree of contribution of the photodiodes 121*f*-111 to 121*f*-119 to the output pixel value of the pixel 121*a* is controlled to thereby control the incident angle directivity of the output pixel value. On the other hand, in a case where the pixel 121*a* is the pixel 121*a*-*s*, the presence or absence or the degree of contribution of the photodiodes 121*f*-111, 121*f*-112, 121*f*-114, and 121*f*-115 to the output pixel value of the pixel 121*a* is controlled to thereby control the incident angle directivity of the output pixel value. In this case, the other photodiodes 121*f* (photodiodes 121*f*-113, 121*f*-116, and 121*f*-117 to 121*f*-119) are controlled so as not to contribute to the output pixel value.

That is, for example, in a case where the incident angle directivities of the output pixel values are different from each other among the plurality of pixels 121*a*-*b*, the presence or absence or the degree of contribution of at least one of the photodiodes 121*f*-111 to 121*f*-119 to the output pixel value is different. On the other hand, for example, in a case where the incident angle directivities of the output pixel values are different from each other among the plurality of pixels 121*a*-*s*, the presence or absence or the degree of contribution of at least one of the photodiodes 121*f*-111, 121*f*-112, 121*f*-114, and 121*f*-115 to the output pixel value is different, and the other photodiodes 121*f*-113, 121*f*-116, and 121*f*-117 to 121*f*-119 do not contribute to the output pixel values in common among these pixels.

Note that whether the pixel 121*a* is the pixel 121*a*-*b* or the pixel 121*a*-*s* can be set in every pixel. Furthermore, this setting may be made for every unit (a plurality of pixels).

Figure 21:
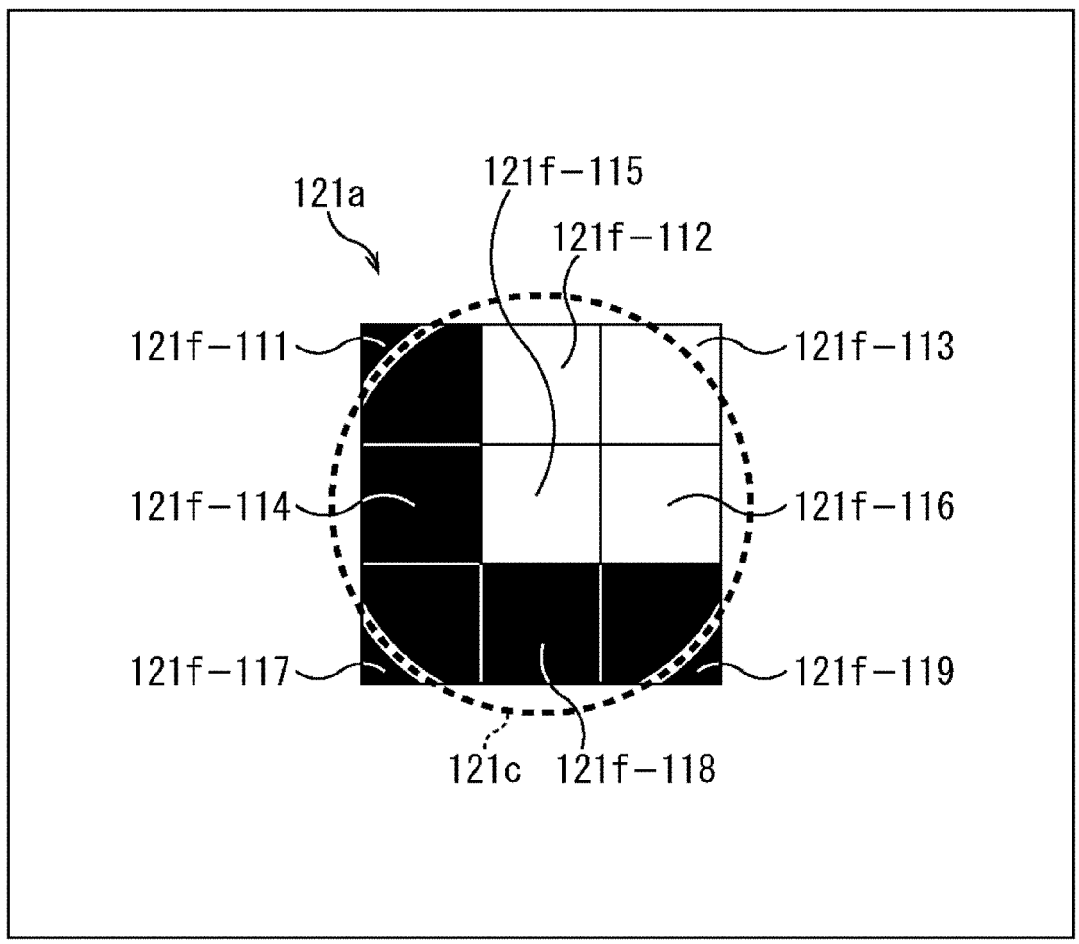
FIG. 21 is a diagram describing a modification example.

Further, as described above, one on-chip lens is formed on each pixel (each pixel output unit) of the imaging element 121. That is, in the case where the pixel 121*a* has a configuration similar to the example illustrated in FIG. 20, one on-chip lens 121*c* is provided on the photodiodes 121*f*-111 to 121*f*-119, as illustrated in FIG. 21. Therefore, as described with reference to FIG. 20, either in a case where the pixel 121*a* is the pixel 121*a*-*b* or in a case where it is the pixel 121*a*-*s*, one pixel (one pixel output unit) and one on-chip lens 121*c* correspond one to one.

<WB Pixel>

In a case of the imaging element 121 as described above, the detection signal of each pixel includes information on a wide range of objects, and includes information substantially equivalent to the sum of all pixel values of an imaging element using an imaging lens. Therefore, it is not necessary to integrate the detection signal to calculate the WB coefficient. That is, the number of pixels (WB pixels) for acquiring the detection signal used for calculating the WB coefficient should be at least one pixel or more for each color.

That is, the WB pixel is only required to be a part of the pixel matrix formed in the light receiving unit 111. Then, any pixel in the pixel matrix may be used as the WB pixel. For example, a pixel from which the detection signal is first read (that is, a pixel from which the detection signal is read before other pixels) may be the WB pixel.

Figure 22:
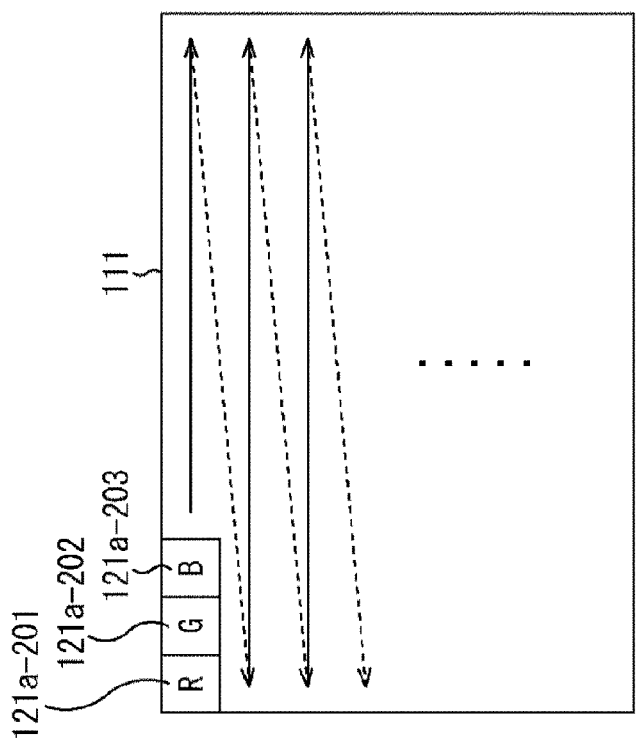
FIG. 22 is a diagram illustrating an arrangement example of pixel output units used for the white balance control.

For example, in the pixel matrix of the light receiving unit 111, it is assumed that the detection signal of each pixel is read in a raster scan order as depicted by a practical arrow and a dotted arrow in FIG. 22. In such a case, a leftmost R pixel 121*a*-201, G pixel 121*a*-202, and B pixel 121*a*-203 of a top row of the pixel matrix (that is, three pixels of R pixel, G pixel, and B pixel to be read first) may be used as the WB pixels. Furthermore, for example, in a case where the detection signal is read in row units, pixels in a row that is read first may be the WB pixels.

In this manner, the detection signal can be acquired earlier. Further, since the WB coefficient can be calculated in parallel with reading of the detection signal from another pixel, it is possible to suppress an increase in the delay time due to calculation of the WB coefficient. Furthermore, since it is not necessary to read detection signals from all pixels to calculate the WB coefficient, the calculated WB coefficient can be immediately (in real time) reflected in the detection signals read thereafter (performing the white balance control). For example, even when restoring a part of an image, such as restoring the restored image for every block, the white balance control can be performed immediately.

Further, the position of the WB pixel is arbitrary. For example, the pixel at a predetermined position in the pixel matrix (for example, near the center or the like) may be the WB pixel. Furthermore, for example, a plurality of WB pixels may be uniformly distributed in the pixel matrix.

Further, the WB pixel may also serve as a pixel (also referred to as an effective pixel) that generates a detection signal forming the detection image, or may be divided (the pixels may be different pixels). For example, as illustrated in A of FIG. 23, the WB pixels may be formed outside an effective pixel region in which effective pixels are formed.

Figure 23:
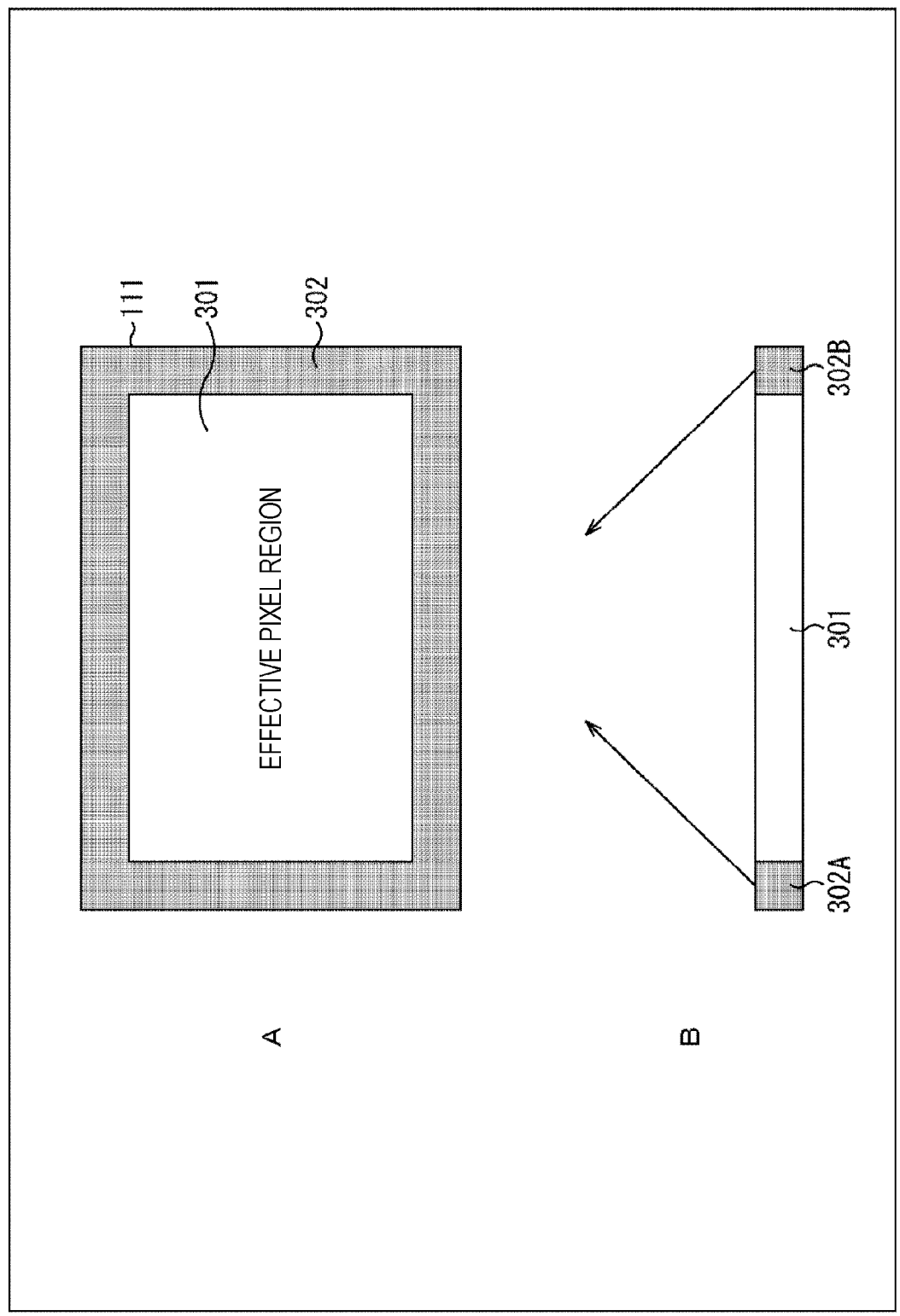
FIG. 23 is a diagram illustrating an arrangement example of pixel output units used for the white balance control.

In a case in A of FIG. 23, a region near a center of the light receiving unit 111 (white region in the diagram) is an effective pixel region 301, and a surrounding region (gray region in the diagram) is a WB pixel region 302 where WB pixels are formed.

Generally, pixels near a center of the pixel region have less error (individual difference) than pixels in a peripheral portion. Therefore, by employing the configuration as illustrated in A of FIG. 23 and by restoring the restored image from a detection signal read from the effective pixel region near the center of the pixel region, reduction of image quality of the restored image is suppressed.

Note that the incident angle directivities of the WB pixels are arbitrary. For example, the incident angle directivities of the WB pixels may be made to have a bias. For example, a pixel (or pixel group) having an incident angle directivity with a peak in a predetermined direction may be used as the WB pixel.

On the contrary, the incident angle directivities of the WB pixels may be made to have no bias. For example, a pixel group having incident angle directivities with peaks in various directions may be used as the WB pixels. In that case, for example, by making it possible to select the WB pixel used for calculating the WB coefficient, it is possible to perform the white balance control with emphasis on a desired direction.

For example, when the user or the like gives an instruction to perform the white balance control with emphasis on a center within the angle of view of a captured image, as in arrows illustrated in B of FIG. 23, a WB pixel having an incident angle directivity that has a peak in a direction toward the center of the angle of view (the direction toward a front of the center of the imaging element 121 (light receiving unit 111)) may be selected and used for calculating the WB coefficient.

Of course, the direction in which the white balance control is emphasized is arbitrary and is not limited to the center of the angle of view. For example, the white balance control may be emphasized in a direction toward a region specified by the user. In that case, it is only required that the WB pixel having an incident angle directivity that has a peak in the direction toward the region specified by the user is selected and used for calculating the WB coefficient.

In this manner, more diverse white balance control can be performed.

<Adding WB Information>

Figure 24:
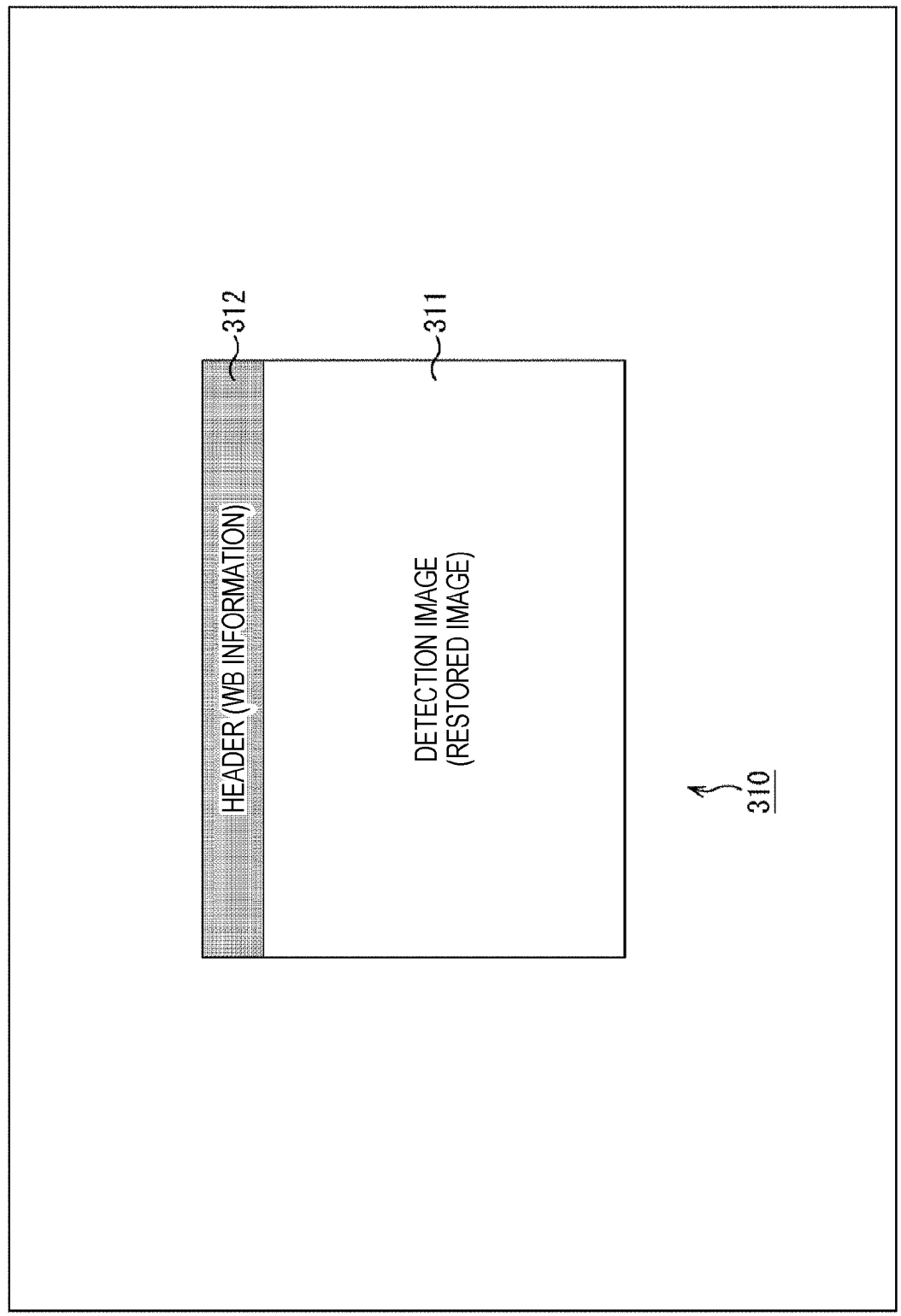
FIG. 24 is a diagram illustrating a main configuration example of output data.

Further, the association unit 104 may add the WB coefficient to data (detection signal or the like) related to the detection image, as illustrated in FIG. 24, for example. FIG. 24 illustrates a main configuration example of output data 310 output from the output unit 105. In a case of the example in FIG. 24, WB information, which is information regarding the WB coefficient, is added to detection image data 311 as a header 312. That is, in this case, it is output without performing the white balance control of the detection image. That is, the white balance control is performed outside the imaging element 121. At this time, by the WB information added to the detection image as a header as in the example of FIG. 24, the processing unit that performs the white balance control can easily acquire the WB coefficient corresponding to the detection image to be processed.

Note that, as described above, by using the pixels from which the detection image is read before other pixels as the WB pixels, the detection image can be generated after the header including the WB information is generated according to a reading order of detection signals. Thus, the WB information can be added to the detection image more easily. In other words, it is possible to suppress an increase in the amount of buffer required to add the WB information to the detection image.

Note that the WB coefficient added to the detection image in this manner is not limited to the WB coefficient of the entire image, and the WB coefficient of any region may be added (included in the WB information). That is, as described above, the WB coefficient for the white balance control with emphasis on the predetermined direction (the WB coefficient calculated as a WB pixel having an incident angle directivity that has a peak in the predetermined direction) may be added to the detection image (included in the WB information).

Moreover, a plurality of types of WB coefficients may be added to the detection image (included in the WB information). For example, both the WB coefficient of the entire image and the WB coefficient of a predetermined region may be added to the detection image (included in the WB information). For example, the WB coefficient of the entire image, the WB coefficient of an upper left part of the image, and the WB coefficient of a lower right part of the image may be added to the detection image (included in the WB information). In this manner, it is possible to select the WB coefficient to be used when performing the white balance control, and thus it is possible to easily achieve more diverse white balance control.

Note that the WB coefficient is not limited to the detection image and may be added to the restored image that has been restored.

<Flow of Imaging Process>

Figure 25:
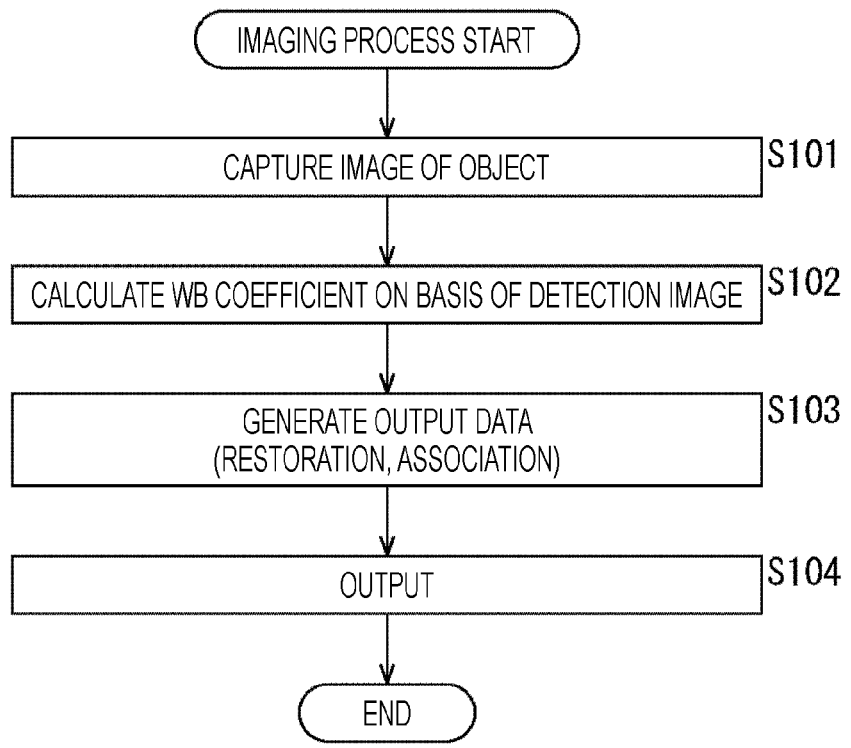
FIG. 25 is a flowchart describing an example of a flow of an imaging process.

An example of a flow of an imaging process executed by the imaging element 121 as described above will be described with reference to a flowchart in FIG. 25.

When the imaging process is started, the light receiving unit 111 of the imaging element 121 captures an image of an object and generates a detection signal (detection image) in step S101. The A-D conversion unit 101 performs A-D conversion on the detection signal (detection image).

In step S102, the WB coefficient setting unit 102 calculates the WB coefficient on the basis of the detection signal.

In step S103, the restoration unit 103 and the association unit 104 generate output data. For example, the restoration unit 103 restores a restored image from the detection image, performs the white balance control, and generates output data. Further, the association unit 104, for example, associates the detection image with the WB coefficient to generate output data.

In step S104, the output unit 105 outputs the output data generated by the process of step S103 to the outside of the imaging element 121.

When the process of step S104 ends, the imaging process ends. By performing the imaging process in this manner, the imaging element 121 can more easily perform the white balance control.

3. Second Embodiment

<Imaging Device>

The present technology can be applied to other than the imaging element. For example, the present technology can be applied to an imaging device.

For example, an imaging device may include an imaging element that includes a plurality of pixel output units that receives incident light that is incident without passing through either of an imaging lens and a pinhole and each outputs one detection signal indicating an output pixel value modulated by an incident angle of the incident light, and a coefficient setting unit that, on the basis of a detection signal acquired in the pixel output units of the imaging element, sets a white balance coefficient that is used for correcting a white balance of a restored image restored from a detection image formed by the detection signal.

That is, an image of an object may be captured by an imaging element that includes a plurality of pixel output units that receives incident light that is incident without passing through either of an imaging lens and a pinhole and each outputs one detection signal indicating an output pixel value modulated by an incident angle of the incident light, and on the basis of a detection signal acquired by the image capturing and acquired in the pixel output units of the imaging element, a white balance coefficient that is used for correcting a white balance of a restored image restored from a detection image formed by the detection signal may be set.

In this manner, the imaging device can more easily perform the white balance control.

Figure 26:
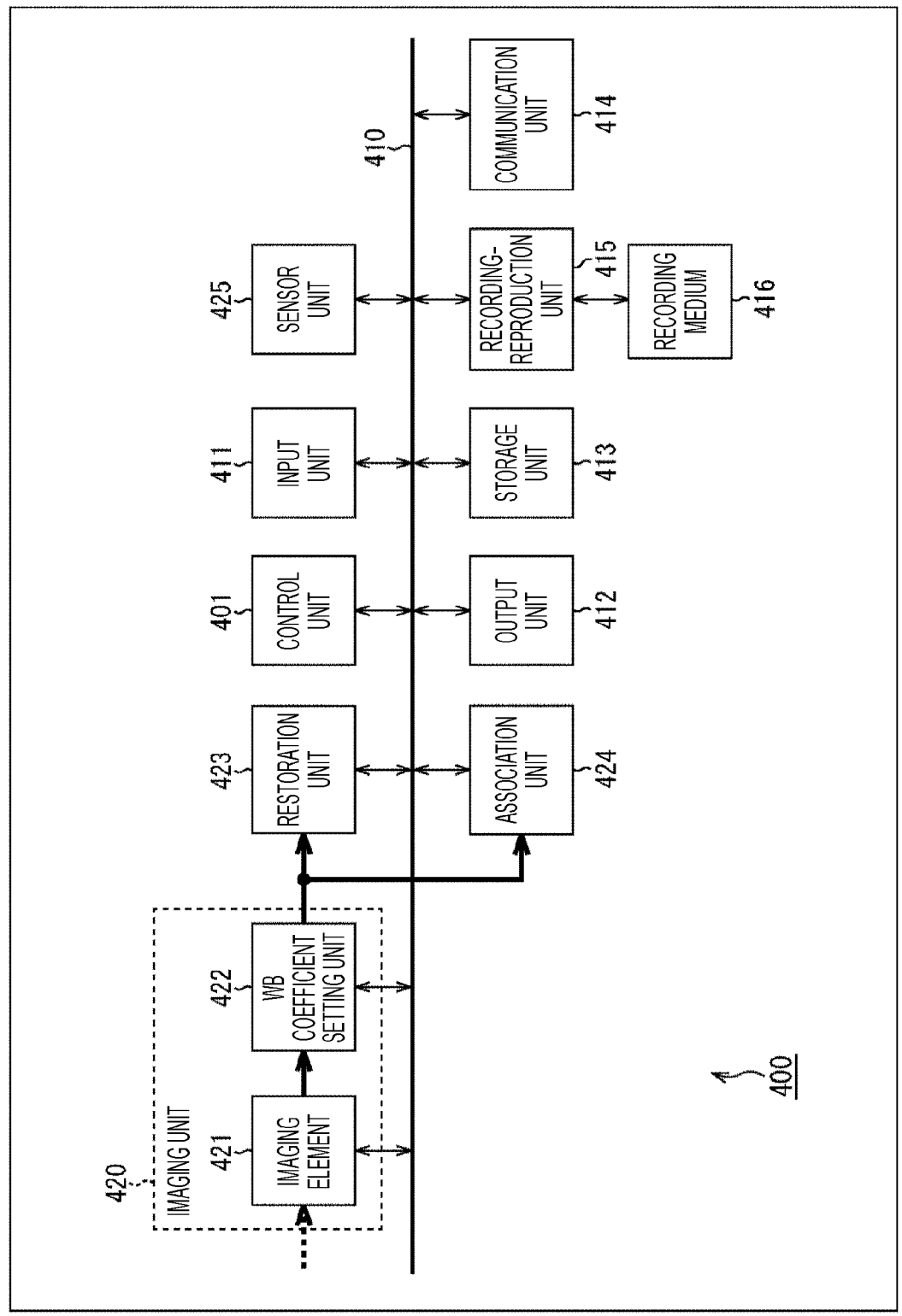
FIG. 26 is a block diagram illustrating a main configuration example of an imaging device.

FIG. 26 is a diagram illustrating a main configuration example of one embodiment of an imaging device to which the present technology is applied. The imaging device 400 illustrated in FIG. 26 is a device that captures an image of an object and acquires electronic data regarding a captured image thereof.

As illustrated in FIG. 26, the imaging device 400 has a control unit 401, an input unit 411, an output unit 412, a storage unit 413, a communication unit 414, and a recording-reproduction unit 415. Further, the imaging device 400 also has an imaging element 421, a WB coefficient setting unit 422, a restoration unit 423, an association unit 424, and a sensor unit 425. The processing units and the like are connected to each other via a bus 410 and can exchange information and instructions with each other.

Note that the imaging element 421 and the WB coefficient setting unit 422 may be integrated into the imaging unit 420. The imaging unit 420 may be implemented by any physical configuration. For example, the imaging unit 420 may be implemented as a processor such as system large scale integration (LSI). Further, the imaging unit 420 may be implemented as, for example, a module using a plurality of processors or the like, a unit using a plurality of modules or the like, or a set or the like in which other functions are added to the unit (that is, a part of the configuration of the device). Furthermore, the imaging unit 420 may be implemented as a device.

The control unit 401 is configured to perform processing related to control of each processing unit and the like in the imaging device 400. For example, the control unit 401 has a central processing unit (CPU), a read only memory (ROM), a random access memory (RAM), and the like, and executes the above-described processing by executing a program using the CPU and the like.

The input unit 411 is configured to perform processing related to input of information. For example, the input unit 411 has input devices such as an operating button, a dial, a switch, a touch panel, a remote controller, and a sensor, and an external input terminal. For example, the input unit 411 receives an instruction (information corresponding to an input operation) from the outside such as a user by using those input devices. Further, for example, the input unit 411 acquires arbitrary information (program, command, data, or the like) supplied from an external device via the external input terminal. Further, for example, the input unit 411 supplies received information (acquired information) to another processing unit or the like via the bus 410.

Note that the sensor included in the input unit 411 may be any sensor as long as it can accept an instruction from the outside such as a user, such as an acceleration sensor, for example. Further, the input devices included in the input unit 411 are arbitrary, and the number thereof is also arbitrary. The input unit 411 may have a plurality of types of input devices. For example, the input unit 411 may include a part or all of the above examples. Further, the input unit 411 may have an input device other than the above examples. Moreover, for example, the input unit 411 may acquire control information of itself (input device or the like) supplied via the bus 410 and drive on the basis of the control information.

The output unit 412 is configured to perform processing related to output of information. For example, the output unit 412 has an image display device such as a monitor, an image projection device such as a projector, an audio output device such as a speaker, an external output terminal, and the like. For example, the output unit 412 outputs information supplied from another processing unit or the like via the bus 410 by using these output devices or the like. For example, the output unit 412 displays a captured image (restored image as described later) on a monitor, projects a captured image (restored image described later) from a projector, outputs audio (for example, audio corresponding to an input operation, a processing result, or the like), or outputs arbitrary information (program, command, data, or the like) to the outside (other device).

Note that the output devices and the like included in the output unit 412 are arbitrary, and the number thereof is also arbitrary. The output unit 412 may have a plurality of types of output devices and the like. For example, the output unit 412 may include a part or all of the above-described examples. Further, the output unit 412 may have an output device or the like other than the examples described above. Moreover, for example, the output unit 412 may acquire control information of itself (output device or the like) supplied via the bus 410 and drive on the basis of the control information.

The storage unit 413 is configured to perform processing related to storage of information. For example, the storage unit 413 has an arbitrary storage medium such as a hard disk or a semiconductor memory. For example, the storage unit 413 stores information (programs, commands, data, and the like) supplied from other processing units or the like via the bus 410 in the storage medium. Further, the storage unit 413 may store arbitrary information (program, command, data, and the like) at the time of shipment. Furthermore, the storage unit 413 reads information stored in the storage medium at any timing or in response to a request from another processing unit or the like, and supplies the read information to another processing unit or the like via the bus 410.

Note that the storage medium included in the storage unit 413 is arbitrary, and the number thereof is also arbitrary. The storage unit 413 may have a plurality of types of storage media. For example, the storage unit 413 may include a part or all of the examples of the storage medium described above. Further, the storage unit 413 may have a storage medium or the like other than the examples described above. Furthermore, for example, the storage unit 413 may acquire control information of itself supplied via the bus 410 and drive on the basis of the control information.

The communication unit 414 is configured to perform processing related to communication with another device. For example, the communication unit 414 has a communication device that performs communication for exchanging information such as programs and data with an external device via a predetermined communication medium (for example, an arbitrary network such as the Internet). For example, the communication unit 414 communicates with another device, and supplies information (program, command, data, or the like) supplied from other processing units and the like via the bus 410 to the other device that is a communication partner. Further, for example, the communication unit 414 communicates with another device, acquires information supplied from the other device that is a communication partner, and supplies the information to the other processing unit or the like via the bus 410.

Any communication device may be included in the communication unit 414. For example, it may be a network interface. The communication method and communication standard are arbitrary. For example, the communication unit 414 may be capable of performing wired communication, may be capable of performing wireless communication, or may be capable of performing both of them. Further, for example, the communication unit 414 may acquire control information of itself (communication device or the like) supplied via the bus 410 and drive on the basis of the control information.

The recording-reproduction unit 415 is configured to perform processing related to recording and reproduction of information using the recording medium 416 mounted therein. For example, the recording-reproduction unit 415 reads information (program, command, data, or the like) recorded in the recording medium 416 attached to itself, and supplies the information to another processing unit or the like via the bus 410. Further, for example, the recording-reproduction unit 415 acquires information supplied from another processing unit or the like via the bus 140, and writes (records) the information in the recording medium 416 attached to itself. Note that, for example, the recording-reproduction unit 415 may acquire control information of itself supplied via the bus 410, and drive on the basis of the control information.

Note that the recording medium 416 may be of any type. For example, it may be a magnetic disk, an optical disk, a magneto-optical disk, a semiconductor memory, or the like.

The imaging element 421 is an imaging element similar to the imaging element 121. That is, the imaging element 121 can be applied as the imaging element 421. However, in a case of the imaging element 421, the WB coefficient setting unit 102, the restoration unit 103, and the association unit 104 can be omitted.

The imaging element 421 captures an image of an object, generates a detection signal in each pixel, outputs a detection image formed by the detection signal, and supplies the detection image to the WB coefficient setting unit 422.

The WB coefficient setting unit 422 is a processing unit similar to the above-described WB coefficient setting unit 102, has a similar configuration, and performs similar processing. For example, the WB coefficient setting unit 422 uses the detection image (detection signal) supplied from the imaging element 421 to set a WB coefficient used for white balance control of the detection image. The WB coefficient setting unit 422 supplies the set WB coefficient to the restoration unit 423 and the association unit 424 together with the detection image.

The restoration unit 423 is a processing unit similar to the restoration unit 103 described above, has a similar configuration, and performs similar processing. For example, the restoration unit 423 restores a restored image from the detection image supplied from the WB coefficient setting unit 422. At that time, the restoration unit 423 uses the WB coefficient supplied from the WB coefficient setting unit 422 to perform white balance control of the restored image. The restoration unit 423 supplies output data (restored image subjected to the white balance control) generated in this manner to any one or more of the output unit 412 to the recording-reproduction unit 415.

The association unit 424 is a processing unit similar to the above-described association unit 104, has a similar configuration, and performs similar processing. For example, the association unit 424 associates the WB coefficient supplied from the WB coefficient setting unit 422 with the detection image supplied from the WB coefficient setting unit 422. The association unit 424 supplies output data (detection image associated with the WB coefficient) generated in this manner to any one or more of the output unit 412 to the recording-reproduction unit 415.

The sensor unit 425 is configured to perform processing related to detection. For example, the sensor unit 425 has an arbitrary sensor and detects a predetermined parameter. For example, the sensor unit 425 detects a parameter related to a state around the imaging device 400, a parameter related to a state of the imaging device 400, and the like. For example, the sensor unit 425 detects a parameter related to a state of the imaging element 421. Further, for example, the sensor unit 425 supplies the detected information to another processing unit or the like via the bus 410.

As described above, the imaging device 400 can more easily perform the white balance control similarly to the case of the imaging element 121. Note that the imaging element 421 to the sensor unit 426 may acquire control information of themselves supplied via the bus 410, and drive on the basis of the control information.

Further, as described above, in the case of the imaging device 400, processing such as the WB coefficient setting and the white balance control is performed outside the imaging element 421. That is, the WB coefficient setting and the white balance control to which the present technology is applied can be performed inside the imaging element or can be performed outside.

Note that the flow of imaging processing executed by the imaging device 400 is similar to that in the case of the imaging processing by the imaging element 121 described with reference to FIG. 25, and thus description thereof is omitted.

4. Third Embodiment

<Image Processing Device>

Further, a detection image (detection signal) corresponding to a restored image for which the white balance control is performed may be supplied from the outside of the device. That is, the imaging element 421 (imaging element 121) may be provided outside the device (other device) that performs the WB coefficient setting and the white balance control to which the present technology is applied.

In other words, the present technology can also be applied to an image processing device. For example, an image processing device may include a coefficient setting unit that sets a white balance coefficient on the basis of a detection signal acquired by capturing an image of an object by an imaging element that includes a plurality of pixel output units that receives incident light that is incident without passing through either of an imaging lens and a pinhole and each outputs one detection signal indicating an output pixel value modulated by an incident angle of the incident light, in which the detection signal is acquired in the pixel output units, and the white balance coefficient is used for correcting a white balance of a restored image restored from a detection image formed by the detection signal.

That is, a white balance coefficient may be set on the basis of a detection signal acquired by capturing an image of an object by an imaging element that includes a plurality of pixel output units that receives incident light that is incident without passing through either of an imaging lens and a pinhole and each outputs one detection signal indicating an output pixel value modulated by an incident angle of the incident light, in which the detection signal is acquired in the pixel output units, and the white balance coefficient is used for correcting a white balance of a restored image restored from a detection image formed by the detection signal.

In this manner, the image processing device can more easily perform the white balance control.

Figure 27:
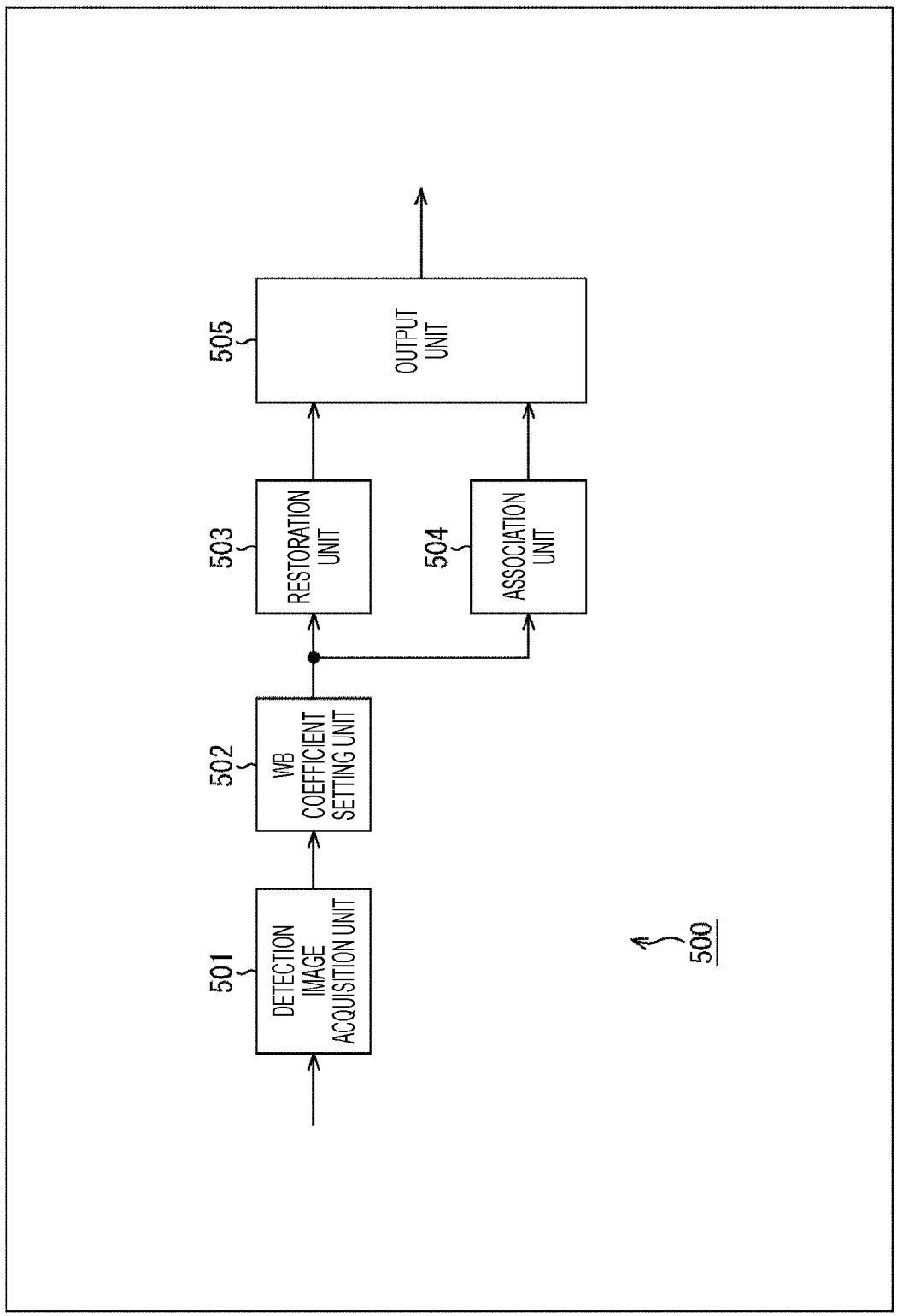
FIG. 27 is a block diagram illustrating a main configuration example of an image processing device.

FIG. 27 is a diagram illustrating a main configuration example of one embodiment of an imaging device to which the present technology is applied. An image processing device 500 illustrated in FIG. 27 is a device that calculates a WB coefficient from a detection image (detection signal) supplied from the outside and performs image processing such as the white balance control.

As illustrated in FIG. 27, the image processing device 500 has a detection image acquisition unit 501, a WB coefficient setting unit 502, a restoration unit 503, an association unit 504, and an output unit 505.

The detection image acquisition unit 501 performs processing related to acquisition of the detection image (detection signal). The detection image acquisition unit 501 acquires the detection image (detection signal) output from the external imaging element 421 (imaging element 121). Further, the detection image acquisition unit 501 also supplies the acquired detection image (detection signal) to the WB coefficient setting unit 502.

The WB coefficient setting unit 502 is a processing unit similar to the WB coefficient setting unit 102, has a similar configuration, and performs similar processing. That is, the WB coefficient setting unit 502 acquires the detection image (detection signal) supplied from the detection image acquisition unit 501, sets a WB coefficient on the basis of the detection image, and sets the WB coefficient together with the detection image in the restoration unit 503 or the association unit 504 or the both.

The restoration unit 503 is a processing unit similar to the restoration unit 103, has a similar configuration, and performs similar processing. That is, the restoration unit 503 restores a restored image from the detection image supplied from the WB coefficient setting unit 502 using a predetermined restoration coefficient. Further, at that time, the restoration unit 503 uses the WB coefficient supplied from the WB coefficient setting unit 502 to perform the white balance control of the restored image. The restoration unit 503 supplies the restored image subjected to the white balance control as output data to the output unit 505.

The association unit 504 is a processing unit similar to the association unit 104, has a similar configuration, and performs similar processing. That is, the association unit 504 associates the WB coefficient supplied from the WB coefficient setting unit with the detection image supplied from the WB coefficient setting unit 502. The association unit 504 supplies the detection image associated with the WB coefficient as output data to the output unit 505.

The output unit 505 is a processing unit similar to the output unit 105, and outputs the output data supplied from the restoration unit 503 or the association unit 504 to the outside of the image processing device 500.

In this manner, the image processing device 500 can more easily perform the white balance control similarly to the case of the imaging element 121 or the imaging device 400.

<Flow of Image Processing>

Figure 28:
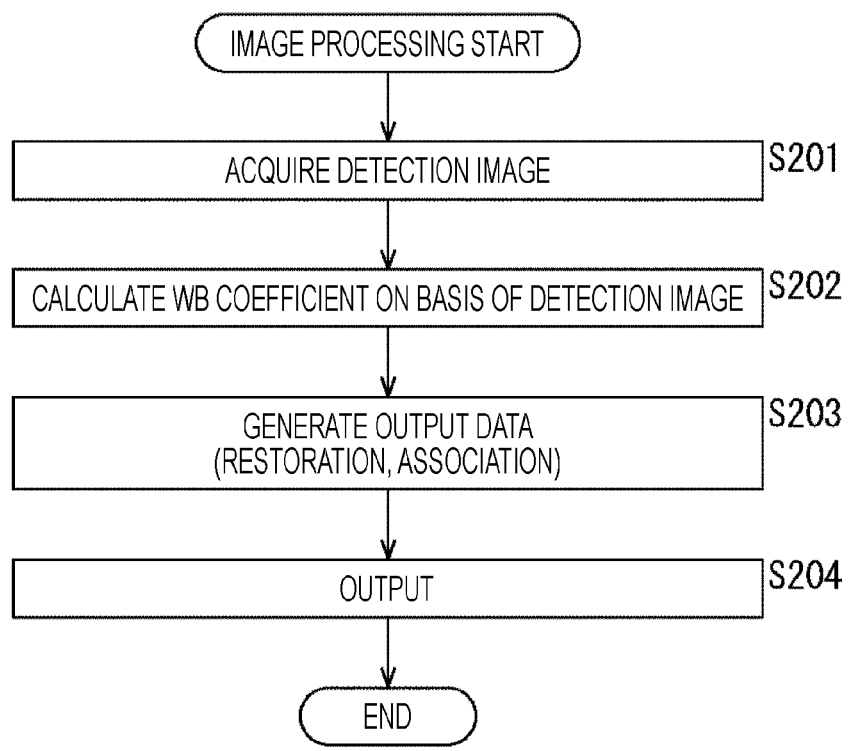
FIG. 28 is a flowchart describing an example of a flow of image processing.

Next, an example of a flow of image processing executed by the image processing device 500 will be described with reference to a flowchart of FIG. 28.

When the image processing is started, the detection image acquisition unit 501 of the image processing device 500 acquires a detection image (detection signal) from outside the device in step S201.

In step S202, the WB coefficient setting unit 502 calculates a WB coefficient on the basis of the detection signal.

In step S203, the restoration unit 503 and the association unit 504 generate output data. For example, the restoration unit 503 restores a restored image from the detection image, performs the white balance control, and generates output data. Further, the association unit 504, for example, associates the WB coefficient with the detection image to generate output data.

In step S204, the output unit 505 outputs the output data generated by the process of step S203 to the outside of the image processing device 500.

When the process of step S204 ends, the image processing ends. By executing the image processing in this manner, the image processing device 500 can more easily perform the white balance control.

5. Fourth Embodiment

<Image Processing System>

The present technology can be applied to a system including a plurality of devices. For example, the device that generates the detection image and calculates the WB coefficient may be different from the device that generates the restored image and performs the white balance control.

Figure 29:
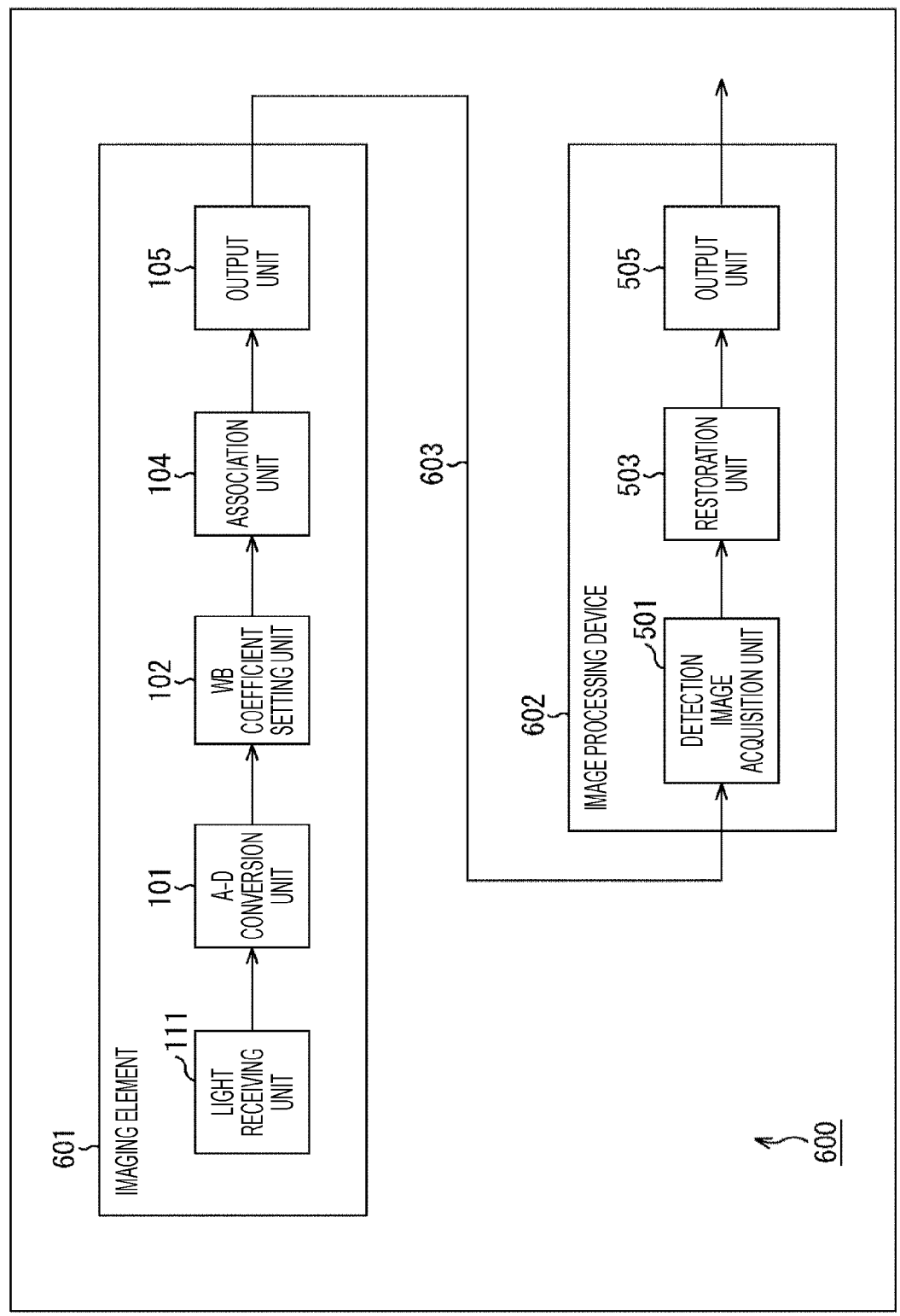
FIG. 29 is a block diagram illustrating a main configuration example of an image processing system.

FIG. 29 is a diagram illustrating a main configuration example of one embodiment of an image processing system to which the present technology is applied. An image processing system 600 illustrated in FIG. 29 is a system that generates a detection image and generates a restored image from the detection image. As illustrated in FIG. 29, the image processing system 600 has an imaging element 601 and an image processing device 602.

The imaging element 601 is an imaging element basically similar to the imaging element 121 described above, and performs processing related to imaging of an object, generation of a detection image, and the like. For example, the imaging element 601 captures an image of an object, generates a detection signal in each pixel, and outputs a detection image formed by the detection signal.

The imaging element 601 and the image processing device 602 are communicably connected to each other via a cable 603. The detection image generated by the imaging element 601 is supplied to the image processing device 602 via the cable 603.

The image processing device 602 is a device basically similar to the image processing device 500 described above, and performs processing related to restoration of the restored image. For example, the image processing device 602 acquires the detection image supplied from the imaging element 601 via the cable 603, and restores the restored image from the detection image. Further, the image processing device 602 outputs the generated restored image to the outside of the image processing device 602 (for example, a processing unit in a subsequent stage).

As illustrated in FIG. 29, the imaging element 601 includes a light receiving unit 111, an A-D conversion unit 101, a WB coefficient setting unit 102, an association unit 104, and an output unit 105.

As described in the first embodiment, the light receiving unit 111 has a pixel matrix formed by a plurality of pixels (pixel output units) and, in each pixel, receives light from an object and photoelectrically converts the light, accumulates charges according to the incident light, and outputs the charges as a detection signal at a predetermined timing.

The A-D conversion unit 101 performs A-D conversion of the detection signal of an analog signal output from the light receiving unit 111 and supplies it to the WB coefficient setting unit 102 as a detection signal of digital data.

The WB coefficient setting unit 102 sets a WB coefficient on the basis of the supplied detection signal. That is, the WB coefficient setting unit 102 sets the WB coefficient (white balance coefficient) on the basis of the detection signal acquired in a part of the plurality of pixels (pixel output units) included in the light receiving unit 111. The WB coefficient setting unit 102 sets the value calculated as described above as the WB coefficient, and supplies the set WB coefficient to the association unit 104 together with the detection signal (detection image).

The association unit 104 is configured to perform processing related to data association. For example, the association unit 104 associates the WB coefficient supplied from the WB coefficient setting unit 102 with data (detection signal or the like) related to the detection image supplied from the WB coefficient setting unit 102.

Here, the term "associate" is similar to that in the case of the first embodiment.

The association unit 104 supplies the associated data as output data to the output unit 105. Note that the association unit 104 may further associate data related to the detection image with information used in a predetermined calculation for generating the restored image, such as the restoration matrix for example.

The output unit 105 outputs the output data supplied from the association unit 104 to the outside of the imaging element 601. This output data is supplied to the image processing device 602 via the cable 603.

Further, as illustrated in FIG. 29, the image processing device 602 has a detection image acquisition unit 501, a restoration unit 503, and an output unit 505.

As described in the third embodiment, the detection image acquisition unit 501 performs processing related to acquisition of a detection image (detection signal). For example, the detection image acquisition unit 501 acquires a detection image (detection signal) supplied via the cable 603. Further, the detection image acquisition unit 501 supplies the acquired detection image (detection signal) to the restoration unit 503. Note that the WB coefficient is associated with this detection image.

The restoration unit 503 restores a restored image from the detection image supplied from the detection image acquisition unit 501 using a predetermined restoration coefficient. Further, at that time, the restoration unit 503 can extract the WB coefficient associated with the detection image, and perform the white balance control on the restored image using the WB coefficient. The method for this white balance control is arbitrary.

For example, the restoration unit 503 may correct a coefficient of the restoration matrix using the WB coefficient associated with the detection image (for example, multiply the coefficient of the restoration matrix by the WB coefficient), and may restore the restored image with a white balance corrected from the detection image by using the restoration matrix with the corrected coefficient.

Further, for example, the restoration unit 503 may restore the restored image from the detection image using the restoration matrix, and correct a pixel value of the restored image, which has been restored, using the WB coefficient associated with the detection image (for example, multiply each pixel value of the restored image by the WB coefficient), to thereby perform the white balance control of the restored image.

The restoration unit 503 supplies the generated restored image as output data to the output unit 505.

The output unit 505 is a processing unit similar to the output unit 105, and outputs the output data supplied from the restoration unit 503 to the outside of the image processing device 500.

As described above, the imaging element 601 is the device that generates the detection image and calculates the WB coefficient, and the image processing device 602 is the device that uses the detection image and the WB coefficient to generate the restored image and perform the white balance control. Even in such a case, the image processing system 600 can more easily perform the white balance control, similarly to the cases of the other embodiments described above.

<Flow of Image Processing>

Figure 30:
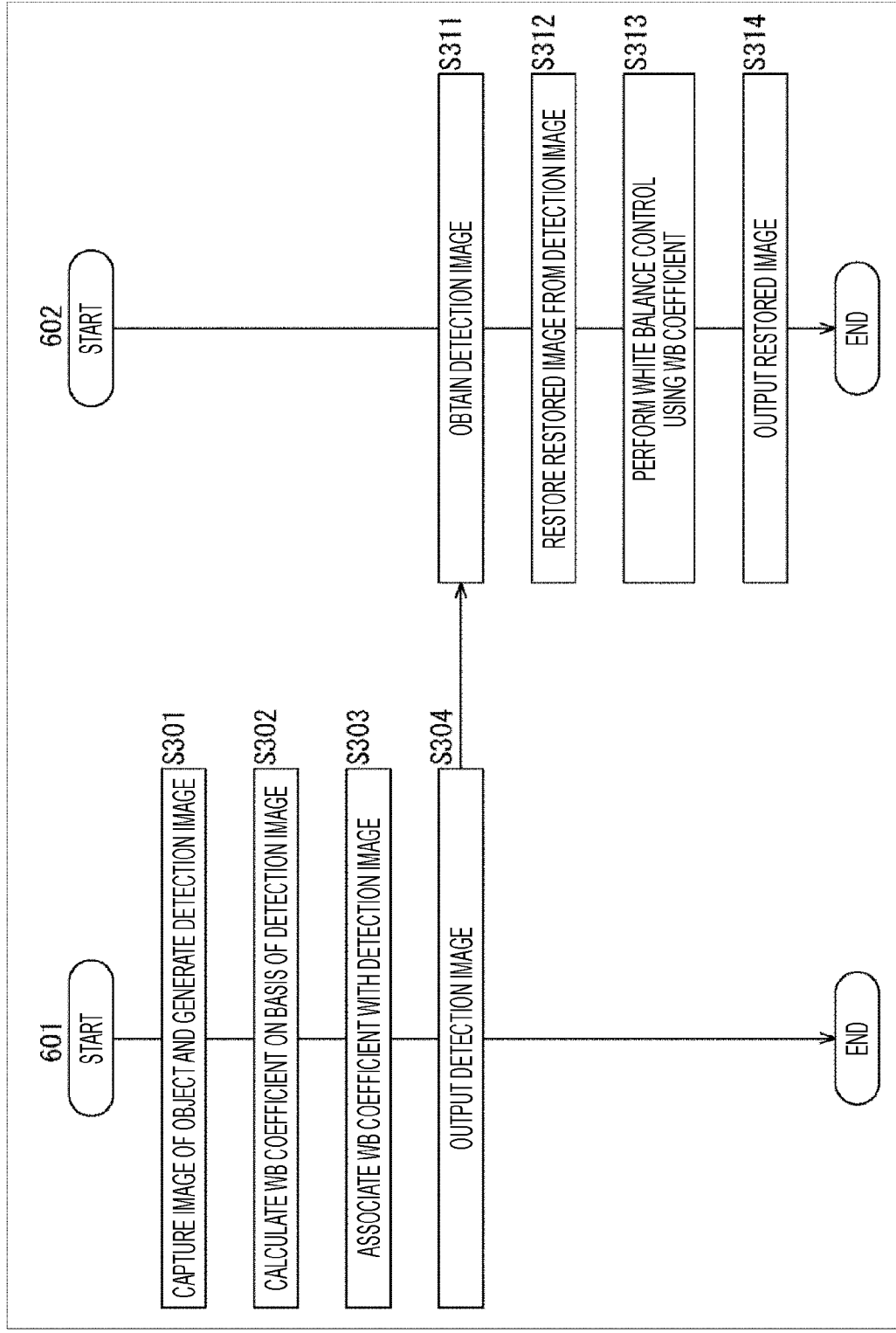
FIG. 30 is a flowchart describing an example of a flow of image processing.

Next, an example of a flow of image processing executed by the image processing system 600 will be described with reference to a flowchart in FIG. 30.

When the image processing is started, the light receiving unit 111 of the imaging element 601 captures an image of an object and generates a detection signal (detection image) in step S301. The A-D conversion unit 101 performs A-D conversion on the detection signal (detection image).

In step S302, the WB coefficient setting unit 102 calculates the WB coefficient on the basis of the detection signal.

In step S303, the association unit 104 generates output data. For example, the association unit 104, for example, associates the WB coefficient with the detection image to generate output data.

In step S304, the output unit 105 outputs the output data generated by the process of step S303 to the outside of the imaging element 601.

This output data is supplied to the image processing device 602 via the cable 603, for example.

The detection image acquisition unit 501 of the image processing device 602 acquires a detection image (detection signal) supplied via the cable 603 in step S311.

In step S312, the restoration unit 503 restores a restored image from the detection image acquired in step S311. Further, the restoration unit 503 also performs the white balance control on the restored image using the WB coefficient associated with the detection image.

In step S314, the output unit 505 outputs the restored image (output data) restored in step S312 to the outside of the image processing device 500.

When the process of step S314 ends, the image processing ends. By executing the image processing in this manner, each device of the image processing system 600 can more easily perform the white balance control. That is, for example, even when the device that generates the detection image and calculates the WB coefficient is different from the device that generates the restored image and performs the white balance control, each device of the image processing system 600 can more easily perform the white balance control.

Note that the configuration of the image processing system 600 is arbitrary and is not limited to the example of FIG. 29. For example, the configuration of the imaging element 601 in FIG. 29 may be further configured as a plurality of devices. For example, the device that generates the detection image and the device that calculates the WB coefficient may be different from each other.

6. Fifth Embodiment

<Another Configuration Example of Imaging Element>

Although the examples of the imaging element 121 (FIG. 2), the imaging element 421 (FIG. 26), and the imaging element 601 (FIG. 29) have been described above, these imaging elements are only required to include a plurality of pixel output units that receives incident light that is incident without passing through either of an imaging lens and a pinhole, and each outputs one detection signal indicating an output pixel value modulated by an incident angle of the incident light, and may have any configuration.

For example, the imaging element 121, the imaging element 421, and the imaging element 601 may use a random black-and-white pattern mask or a light interference mask as a modulation element to modulate light incident on the imaging plane according to the black-and-white pattern or light interference.

Figure 31:
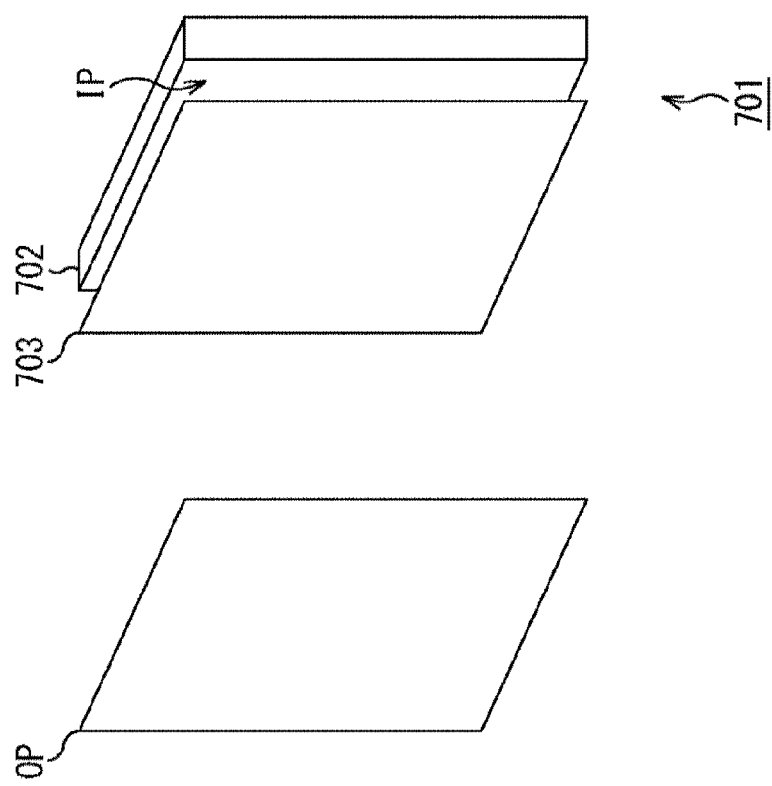
FIG. 31 is a diagram illustrating a main configuration example of an imaging element.

FIG. 31 illustrates another configuration of an imaging element. An imaging element 701 is configured such that a mask 703, which is a modulation element, is fixed to an imaging element 702 so as to have a predetermined interval from an imaging plane IP of the imaging element 702, and light from the object plane OP is modulated by the mask 703 and is thereafter incident on the imaging plane IP of the imaging element 702.

Figure 32:
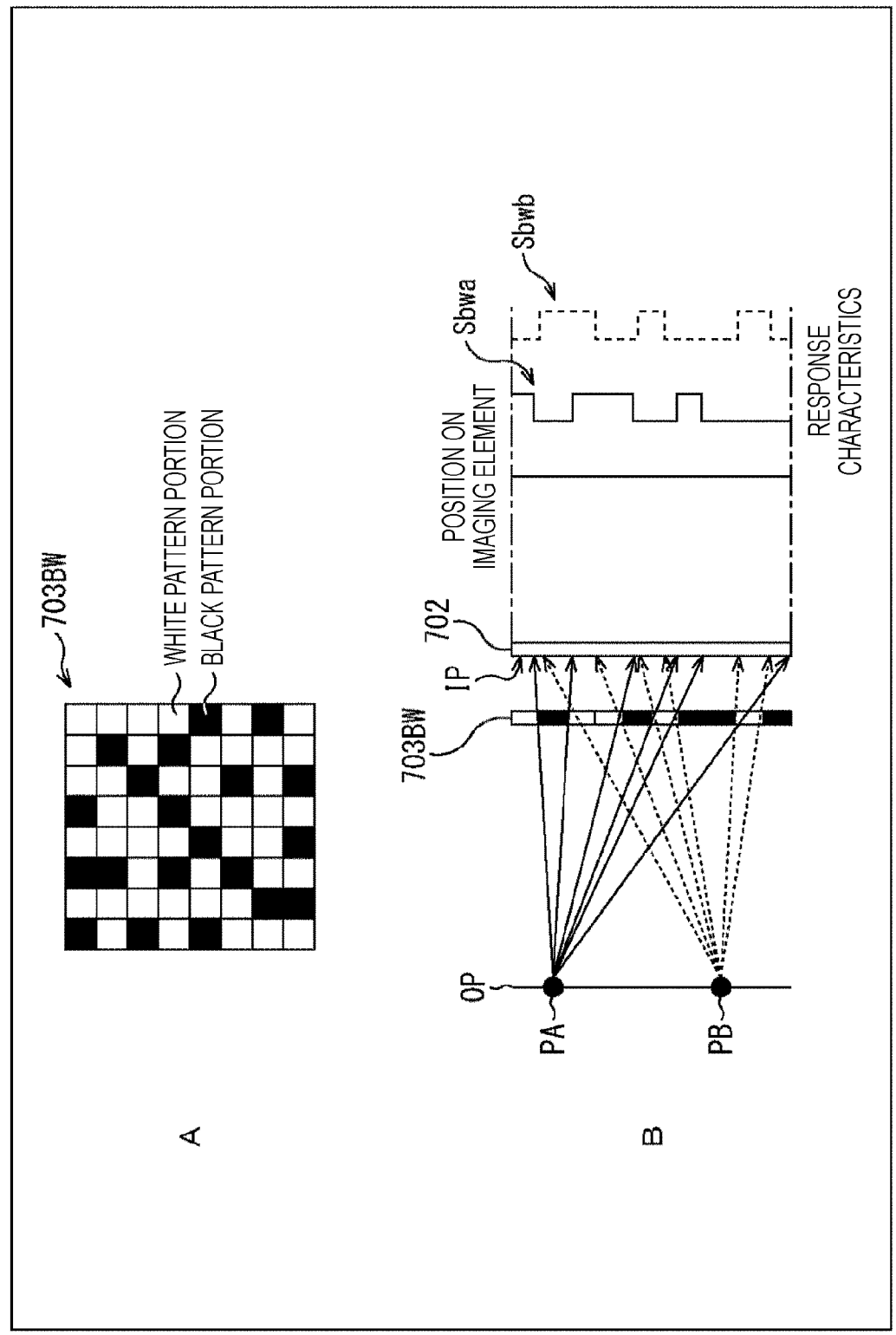
FIG. 32 is a diagram illustrating a case where a black-and-white pattern mask is used.

FIG. 32 illustrates a case where a black-and-white pattern mask is used. In A of FIG. 32, a black-and-white pattern mask is illustrated. A black-and-white pattern mask 703BW has a configuration in which white pattern portions that transmit light and black pattern portions that shield light are randomly arranged, and has a pattern size set independently of the pixel size of the imaging element 702. In B of FIG. 32, with respect to light emitted from a point light source PA and light emitted from a point light source PB, a state of irradiating the imaging plane IP is schematically illustrated. Further, in B of FIG. 32, an example of responses of the imaging element when the black-and-white pattern mask 703BW is used is also schematically illustrated individually with respect to the light emitted from the point light source PA and the light emitted from the point light source PB. The light from the object plane OP is incident on the imaging plane IP of the imaging element 702 after being modulated by the black-and-white pattern mask 703BW. Therefore, a response of the imaging element corresponding to the light emitted from the point light source PA on the object plane OP is Sbwa. Further, a response of the imaging element corresponding to the light emitted from the point light source PB on the object plane OP is Sbwb. Therefore, the pixel output information output from the imaging element 702 is information of one image acquired by combining responses of the respective point light sources for every pixel output unit. In the case of this configuration, the incident angle directivity cannot be set independently for every pixel output unit, and pixel output units at close positions have incident angle directivities close to each other.

Figure 33:
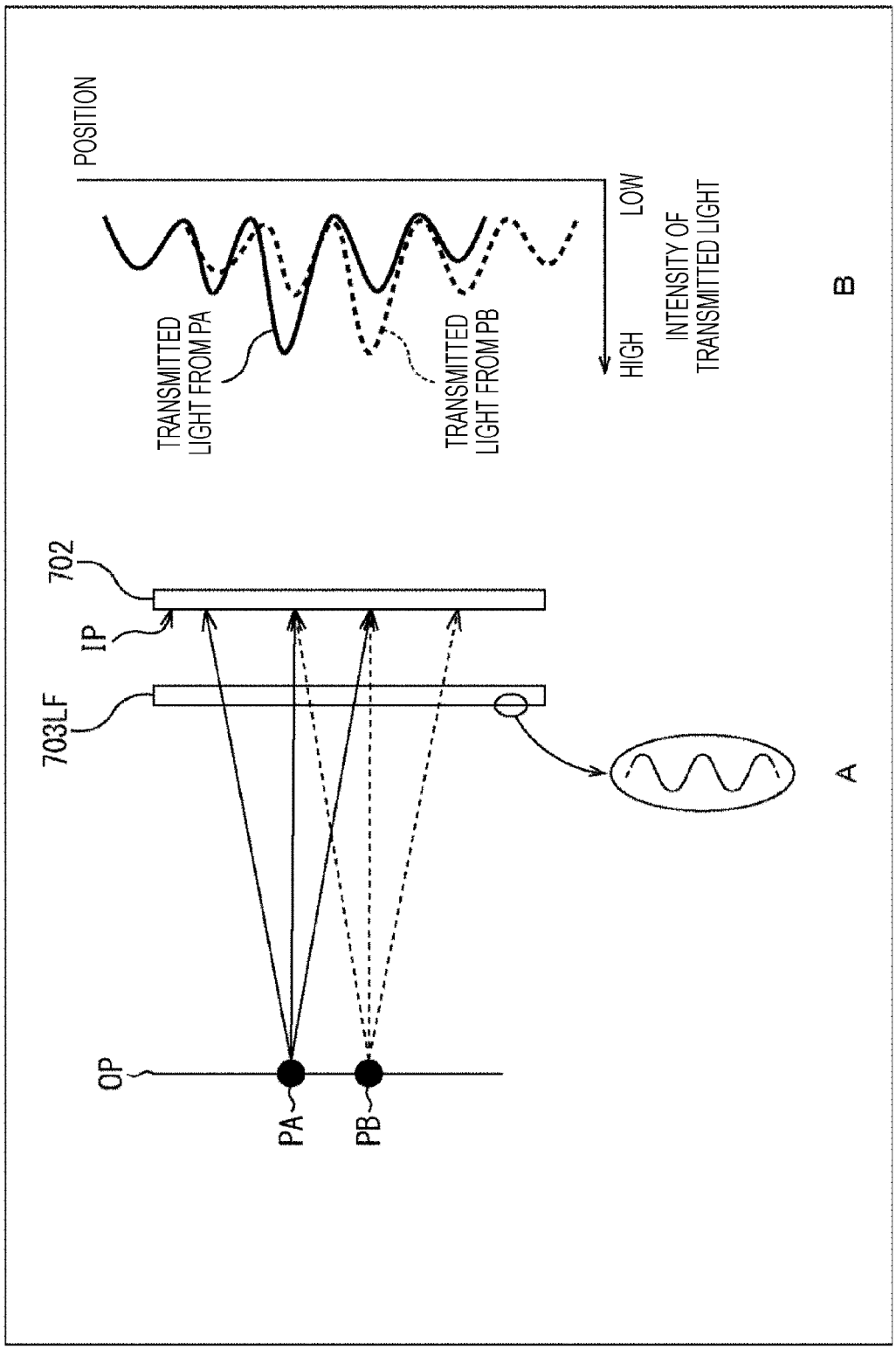
FIG. 33 is a diagram illustrating a case where a light interference mask is used.

FIG. 33 illustrates a case where a light interference mask is used. As illustrated in A of FIG. 33, lights emitted from the point light sources PA and PB on the object plane OP are emitted to the imaging plane IP of the imaging element 702 via a light interference mask 703LF. As illustrated in A of FIG. 33, for example, a light incident surface of the light interference mask 703LF is provided with irregularities of approximately a wavelength of light. Further, the light interference mask 703LF maximizes transmission of light of a specific wavelength emitted from a vertical direction. As changes in incident angles (inclinations with respect to the vertical direction) of the light of specific wavelengths emitted from the point light sources PA and PB of the object plane OP to the light interference mask 703LF becomes large, the optical path length changes. Here, when the optical path length is an odd multiple of a half wavelength, the light is weakened with each other, and when the optical path length is an even multiple of the half wavelength, the light is enhanced with each other. That is, the intensity of the transmitted light of the specific wavelength emitted from the point light sources PA and PB and transmitted through the light interference mask 703LF is modulated according to the incident angle with respect to the light interference mask 703LF as illustrated in B of FIG. 33 and is incident on the imaging plane IP of the imaging element 702. Therefore, the pixel output information output from each output pixel unit of the imaging element 702 is information acquired by combining light intensities after modulation of the point light sources transmitted through the light interference mask 823LF. In the case of this configuration, the incident angle directivity cannot be set independently for every pixel output unit, and pixel output units at close positions have incident angle directivities close to each other.

Figure 34:
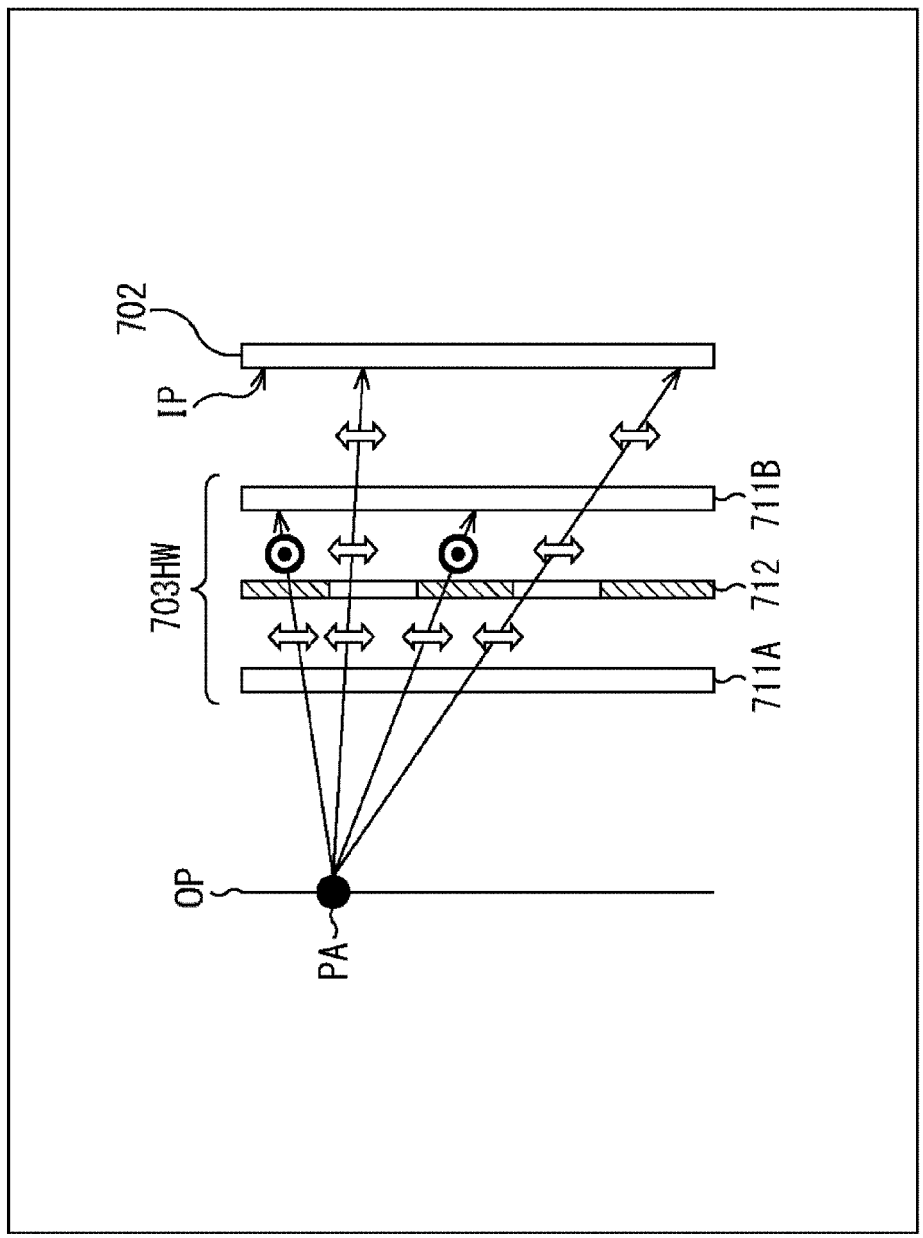
FIG. 34 is a diagram illustrating a modification example of the imaging element.

Note that an optical filter 703HW of FIG. 34 may be used instead of the optical filter 703BW. The optical filter 703HW includes a linear polarization element 711A, a linear polarization element 711B, and a half wavelength plate 712, whose polarization directions are equal to each other, and the half wavelength plate 712 is sandwiched between the linear polarization element 711A and the linear polarization element 711B. Instead of the black pattern portions of the optical filter 703BW, the half wavelength plate 712 is provided with polarizing portions indicated by hatchings, and white pattern portions and polarizing portions are randomly arranged.

The linear polarization element 711A transmits only the light component in a predetermined polarization direction of substantially non-polarized light emitted from the point light source PA. Hereinafter, it is assumed that the linear polarization element 711A transmits only a light component whose polarization direction is parallel to the diagram. Among the polarized lights transmitted through the linear polarization element 711A, the polarized light transmitted through a polarizing portion of the half wavelength plate 712 has a polarization direction changed to a direction perpendicular to the plane of the diagram by rotating the polarization plane. On the other hand, among the polarized lights transmitted through the linear polarization element 711A, the polarized light transmitted through a white pattern portion of the half wavelength plate 712 remains unchanged in the polarization direction parallel to the plane of the diagram. Then, the linear polarization element 711B transmits the polarized light transmitted through the white pattern portion and hardly transmits the polarized light transmitted through the polarizing portion. Therefore, the amount of the polarized light transmitted through the polarizing portion is smaller than that of the polarized light transmitted through the white pattern portion. Thus, a gradation pattern mostly similar to that in a case of using the optical filter 703BW is generated on the light receiving surface (imaging plane) IP of the imaging element 702.

The imaging element 701 having such a configuration may be applied. However, in a case of these configurations, since it is necessary to add another component such as a mask to the imaging element, the imaging element 121 (FIG. 2), the imaging element 421 (FIG. 26), and the imaging element 601 (FIG. 29) described above can be more reduced in size.

As described above, each of the imaging element 121, the imaging element 421, and the imaging element 601 is only required to have any one of the configuration as described with reference to FIG. 5, the configuration as described with reference to FIG. 6, the configuration as described with reference to FIG. 31 or FIG. 32, or the configuration as described with reference to FIG. 33. That is, the present technology can be applied to an imaging element having any one of these configurations, or to a device having the imaging element, or the like.

Further, each of the imaging element 121, the imaging element 421, and the imaging element 601 is only required to have the configuration as described with reference to FIG. 5 or the configuration as described with reference to FIG. 6. That is, the present technology can be applied to an imaging element having any one of these configurations, or to a device having the imaging element, or the like. That is, the plurality of pixel output units of the imaging element may have a configuration in which an incident angle directivity indicating a directivity of the output pixel value with respect to an incident angle of incident light from an object is independently settable in each of the pixel output units.

For example, each of the imaging element 121, the imaging element 421, and the imaging element 601 is only required to have the configuration as described with reference to FIG. 5. That is, the present technology can be applied to an imaging element having such a configuration, a device having the imaging element, or the like. That is, the plurality of pixel output units of the imaging element may have a configuration in which an incident angle directivity indicating a directivity with respect to an incident angle of incident light from an object is independently settable in each of the pixel output units.

Further, for example, each of the imaging element 121, the imaging element 421, and the imaging element 601 is only required to have the configuration as described with reference to FIG. 6. That is, the present technology can be applied to an imaging element having such a configuration, a device having the imaging element, or the like. That is, by making the plurality of pixel output units of the imaging element have different photodiodes (PD) from each other that contribute to output, an incident angle directivity indicating a directivity of the output pixel value with respect to an incident angle of incident light from an object may be independently settable in each of the pixel output units.

7. Appendix

<Computer>

The series of processes described above can be executed by hardware or can be executed by software. In a case where the series of processes is executed by software, a program constituting the software is installed in a computer. Here, the computer includes a computer incorporated in dedicated hardware, a general-purpose personal computer for example that can execute various functions by installing various programs, and the like.

Figure 35:
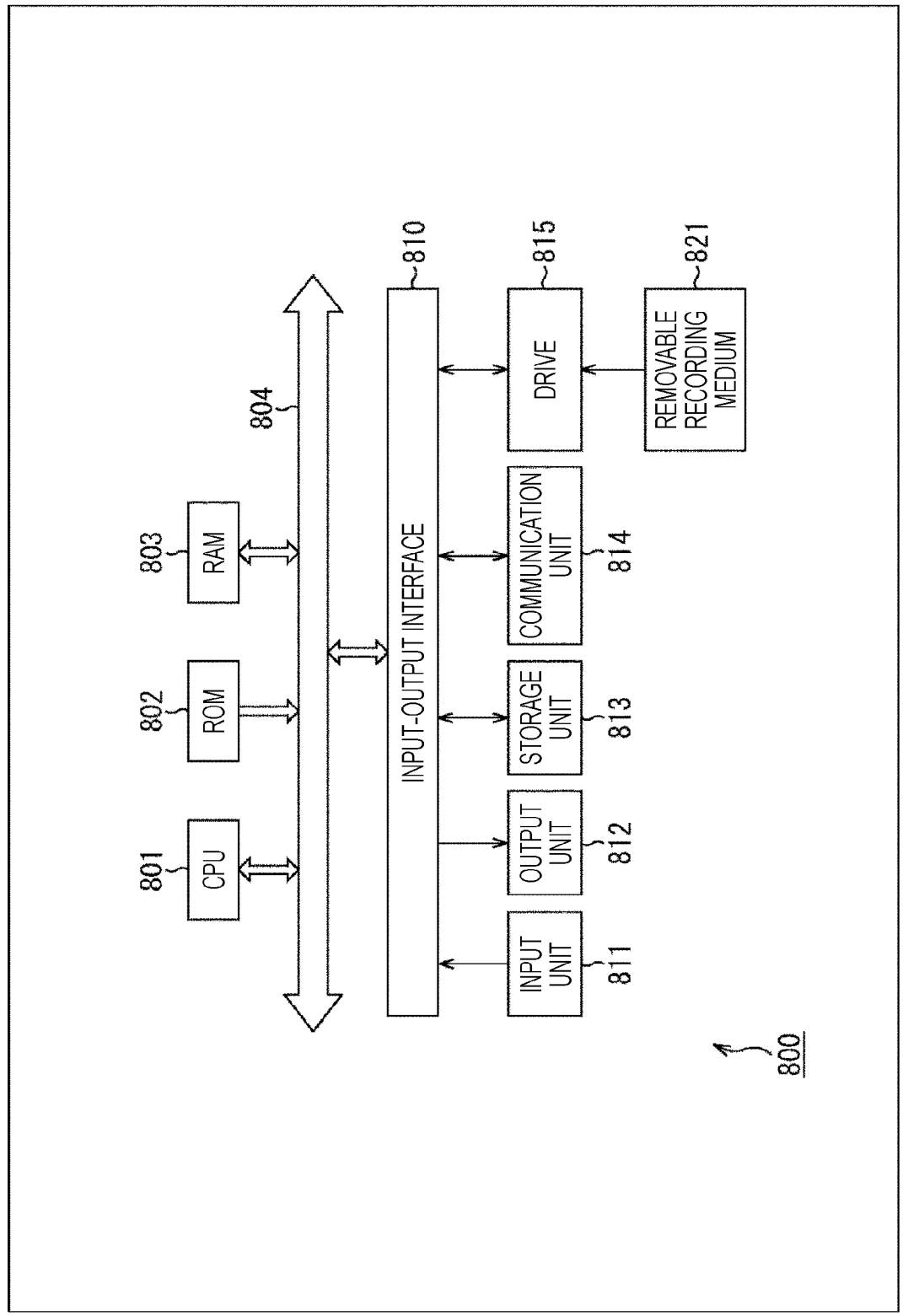
FIG. 35 is a block diagram illustrating a main configuration example of a computer.

FIG. 35 is a block diagram illustrating a configuration example of hardware of a computer that executes the above-described series of processes by a program.

In a computer 800 illustrated in FIG. 35, a central processing unit (CPU) 801, a read only memory (ROM) 802, and a random access memory (RAM) 803 are interconnected via a bus 804.

An input-output interface 810 is also connected to the bus 804. An input unit 811, an output unit 812, a storage unit 813, a communication unit 814, and a drive 815 are connected to the input-output interface 810.

The input unit 811 includes, for example, a keyboard, a mouse, a microphone, a touch panel, an input terminal, and the like. The output unit 812 includes, for example, a display, a speaker, an output terminal, and the like. The storage unit 813 includes, for example, a hard disk, a RAM disk, a nonvolatile memory, and the like. The communication unit 814 includes, for example, a network interface. The drive 815 accesses (drives) a removable recording medium 821 such as a magnetic disk, an optical disk, a magneto-optical disk, or a semiconductor memory.

In the computer configured as described above, the CPU 801 loads, for example, a program stored in the storage unit 813 into the RAM 803 via the input-output interface 810 and the bus 804, and executes the program, so as to perform the above-described series of processes. The RAM 803 also appropriately stores data necessary for the CPU 801 to execute various processes, and the like.

The program executed by the computer (CPU 801) can be recorded to, for example, a removable recording medium 821 as a package medium or the like for application. In that case, the program can be installed in the storage unit 813 via the input-output interface 810 by attaching the removable recording medium 821 to the drive 815.

Furthermore, this program can be provided via a wired or wireless transmission medium such as a local area network, the Internet, or digital satellite broadcasting. In that case, the program can be received by the communication unit 814 and installed in the storage unit 813.

In addition, this program can be installed in the ROM 802 or the storage unit 813 in advance.

<Applicable Target of the Present Technology>

Note that the system, device, processing unit, and the like to which the present technology is applied can be used in any fields, for example, traffic, medical care, crime prevention, agriculture, livestock industry, mining, beauty, factory, household appliance, weather, nature monitoring, and the like. Furthermore, its use is arbitrary.

For example, the present technology can be applied to systems and devices used for providing contents for appreciation and the like. Further, for example, the present technology can also be applied to systems and devices used for traffic, such as traffic condition management and autonomous driving control. Moreover, for example, the present technology can also be applied to systems and devices used for security. Further, for example, the present technology can be applied to systems and devices used for automatic control of a machine or the like. Moreover, for example, the present technology can also be applied to systems and devices provided for use in agriculture and livestock industry. Furthermore, the present technology can also be applied to systems and devices that monitor, for example, a state of natural such as a volcano, a forest, and the ocean, wildlife, and the like. Moreover, for example, the present technology can also be applied to systems and devices used for sports.

<Others>

Note that the embodiments of the present technology are not limited to the above-described embodiments, and various modifications are possible without departing from the gist of the present technology.

For example, the present technology can be implemented as any component that constitutes a device or a system, for example, a processor as system large scale integration (LSI) or the like, a module using a plurality of processors or the like, a unit using a plurality of modules or the like, a set acquired by further adding other functions to the unit, and the like (that is, a configuration of a part of the device).

Further, each of the processing units described above can be implemented by an arbitrary configuration. For example, it may be configured by a circuit, LSI, system LSI, a processor, a module, a unit, a set, a device, an apparatus, a system, or the like. Further, a plurality of them may be combined. At that time, for example, the same types of components such as a plurality of circuits and a plurality of processors may be combined, or different types of components such as a circuit and an LSI may be combined.

Note that in the present description, the system means a set of a plurality of components (devices, modules (parts), and the like), and it does not matter whether or not all the components are in the same housing. Therefore, a plurality of devices housed in separate housings and connected via a network, and one device in which a plurality of modules is housed in one housing are all systems.

Further, for example, a configuration described as one device (or processing unit) may be divided and configured as a plurality of devices (or processing units). Conversely, configurations described above as a plurality of devices (or processing units) may be combined and configured as one device (or processing unit). Furthermore, a configuration other than those described above may of course be added to the configuration of each device (or each processing unit).

Moreover, if the configuration and operation of the entire system are substantially the same, a part of the configuration of a certain device (or processing unit) may be included in the configuration of another device (or another processing unit).

Furthermore, for example, the present technology can take a cloud computing configuration in which one function is processed in a shared and collaborative manner by a plurality of devices via a network. For example, application to a cloud service that provides a service related to a captured image (moving image) is possible for any terminal such as a computer, an audio visual (AV) device, a portable information processing terminal, an Internet of Things (IoT) device, and the like.

Furthermore, for example, the above-described program can be executed by an arbitrary device. In that case, it is sufficient if the device has necessary functions (functional blocks and the like) and can acquire necessary information.

Furthermore, for example, respective steps described in the above-described flowcharts can be executed by one device or can be executed in a shared manner by a plurality of devices. Moreover, in a case where a plurality of processes is included in one step, the plurality of processes included in the one step can be executed in a shared manner by a plurality of devices in addition to being executed by one device. In other words, a plurality of processes included in one step can be executed as a plurality of steps. Conversely, a process described as a plurality of steps can be collectively executed as one step.

The program executed by the computer may be configured so that the processes in the steps for describing the program are executed in chronological order according to the order described in the present description, or may be executed in parallel or individually at a necessary timing such as when a call is made. That is, as long as no contradiction occurs, the processes in the respective steps may be executed in an order different from the above-described orders. Moreover, the processes in steps for describing this program may be executed in parallel with processes in another program, or may be executed in combination with processes in another program.

The plurality of present technologies which has been described in the present description can be each implemented independently as a single unit as long as no contradiction occurs. Of course, any plurality of the present technologies can also be used and implemented in combination. For example, part or all of the present technologies described in any of the embodiments can be implemented in combination with part or all of the present technologies described in other embodiments. Furthermore, part or all of any of the above-described present technologies can be implemented by using together with another technology that is not described above.

The present technology can have configurations as follows.

(1) An imaging device including:

an imaging element that includes a plurality of pixel output units that receives incident light that is incident without passing through either of an imaging lens and a pinhole and each outputs one detection signal indicating an output pixel value modulated by an incident angle of the incident light; and a coefficient setting unit that, on the basis of a detection signal acquired in the pixel output units of the imaging element, sets a white balance coefficient that is used for correcting a white balance of a restored image restored from the detection signal.

(2) The imaging device according to (1), in which the plurality of pixel output units has a configuration in which an incident angle directivity indicating a directivity of the output pixel value with respect to an incident angle of incident light from an object is independently settable in each of the pixel output units.

(3) The imaging device according to (1) or (2), in which the plurality of pixel output units has a configuration in which an incident angle directivity indicating a directivity with respect to an incident angle of incident light from an object is independently settable in each of the pixel output units.

(4) The imaging device according to any one of (1) to (3), in which the coefficient setting unit sets the white balance coefficient on the basis of the detection signal acquired in a part of the pixel output units of the imaging element.

(5) The imaging device according to (4), in which the part of the pixel output units includes at least one pixel output unit of each color.

(6) The imaging device according to (4), in which the part of the pixel output units includes a single pixel output unit for each color.

(7) The imaging device according to any one of (4) to (6), in which the part of the pixel output units includes a single pixel output unit or a plurality of pixel output units in which the detection signal is read out before other pixel output units of the plurality of pixel output units.

(8) The imaging device according to any one of (4) to (7), in which the part of the pixel output units includes a plurality of pixel output units, and the coefficient setting unit sets the white balance coefficient on the basis of a value of the detection signal read from each of the part of the pixel output units.

(9) The imaging device according to any one of (4) to (8), in which the part of the pixel output units is formed outside an effective pixel region where the detection signal is acquired.

(10) The imaging device according to (9), in which the part of the pixel output units is formed in a region around the effective pixel region.

(11) The imaging device according to any one of (4) to (10), in which the part of the pixel output units includes a pixel output unit having a directivity in a predetermined direction.

(12) The imaging device according to (11), in which
the part of the pixel output units includes a pixel output unit having a directivity in a forward direction in a center of the imaging element.

(13) The imaging device according to any one of (1) to (12), further including
an association unit that associates the white balance coefficient set by the coefficient setting unit with the detection signal as metadata.

(14) The imaging device according to any one of (1) to (13), further including
a restoration unit that restores the restored image with a corrected white balance from the detection signal using a restoration matrix.

(15) The imaging device according to (14), in which
the restoration unit restores the restored image with a corrected white balance from the detection signal by using the restoration matrix with a coefficient corrected by the white balance coefficient.

(16) The imaging device according to (14) or (15), in which
the restoration unit corrects using the white balance coefficient a pixel value of the restored image restored from the detection signal using the restoration matrix, to generate the restored image with a corrected white balance.

(17) An imaging method including:
capturing an image of an object by an imaging element that includes a plurality of pixel output units that receives incident light that is incident without passing through either of an imaging lens and a pinhole and each outputs one detection signal indicating an output pixel value modulated by an incident angle of the incident light; and
on the basis of a detection signal acquired by the image capturing and acquired in the pixel output units of the imaging element, setting a white balance coefficient that is used for correcting a white balance of a restored image restored from the detection signal.

(18) An image processing device including
a coefficient setting unit that sets a white balance coefficient on the basis of a detection signal acquired by capturing an image of an object by an imaging element that includes a plurality of pixel output units that receives incident light that is incident without passing through either of an imaging lens and a pinhole and each outputs one detection signal indicating an output pixel value modulated by an incident angle of the incident light, in which the detection signal is acquired in the pixel output units, and the white balance coefficient is used for correcting a white balance of a restored image restored from the detection signal.

(19) An image processing method including
setting a white balance coefficient on the basis of a detection signal acquired by capturing an image of an object by an imaging element that includes a plurality of pixel output units that receives incident light that is incident without passing through either of an imaging lens and a pinhole and each outputs one detection signal indicating an output pixel value modulated by an incident angle of the incident light, in which the detection signal is acquired in the pixel output units, and the white balance coefficient is used for correcting a white balance of a restored image restored from the detection signal.

(20) An imaging element including:
a plurality of pixel output units that receives incident light that is incident without passing through either of an imaging lens and a pinhole and each outputs one detection signal indicating an output pixel value modulated by an incident angle of the incident light; and a coefficient setting unit that, on the basis of a detection signal acquired in the pixel output units, sets a white balance coefficient that is used for correcting a white balance of a restored image restored from the detection signal.

REFERENCE SIGNS LIST

102 WB coefficient setting unit
103 Restoration unit
104 Association unit
111 Light receiving unit
121 Imaging element
400 Imaging device
421 Imaging element
422 WB coefficient setting unit
423 Restoration unit
424 Association unit
500 Image processing device
501 Detection image acquisition unit
502 WB coefficient setting unit
503 Restoration unit
504 Association unit

The invention claimed is:

1. An imaging device comprising:
an imaging element that includes a plurality of pixel output units that receives incident light that is incident without passing through either of an imaging lens and a pinhole and each outputs one detection signal indicating an output pixel value modulated by an incident angle of the incident light; and
a coefficient setting unit that, on a basis of a detection signal acquired in the pixel output units of the imaging element, sets a white balance coefficient that is used for correcting a white balance of a restored image restored from the detection signal.

2. The imaging device according to claim 1, wherein
the plurality of pixel output units has a configuration in which an incident angle directivity indicating a directivity of the output pixel value with respect to an incident angle of incident light from an object is independently settable in each of the pixel output units.

3. The imaging device according to claim 1, wherein
the plurality of pixel output units has a configuration in which an incident angle directivity indicating a directivity with respect to an incident angle of incident light from an object is independently settable in each of the pixel output units.

4. The imaging device according to claim 1, wherein
the coefficient setting unit sets the white balance coefficient on a basis of the detection signal acquired in a part of the pixel output units of the imaging element.

5. The imaging device according to claim 4, wherein
the part of the pixel output units includes at least one pixel output unit of each color.

6. The imaging device according to claim 4, wherein
the part of the pixel output units includes a single pixel output unit for each color.

7. The imaging device according to claim 4, wherein
the part of the pixel output units includes a single pixel output unit or a plurality of pixel output units in which the detection signal is read out before other pixel output units of the plurality of pixel output units.

8. The imaging device according to claim 4, wherein
the part of the pixel output units includes a plurality of pixel output units, and the coefficient setting unit sets the white balance coefficient on a basis of a value of the detection signal read from each of the part of the pixel output units.

9. The imaging device according to claim 4, wherein the part of the pixel output units is formed outside an effective pixel region where the detection signal is acquired.

10. The imaging device according to claim 9, wherein the part of the pixel output units is formed in a region around the effective pixel region.

11. The imaging device according to claim 4, wherein the part of the pixel output units includes a pixel output unit having a directivity in a predetermined direction.

12. The imaging device according to claim 11, wherein the part of the pixel output units includes a pixel output unit having a directivity in a forward direction in a center of the imaging element.

13. The imaging device according to claim 1, further comprising
an association unit that associates the white balance coefficient set by the coefficient setting unit with the detection signal as metadata.

14. The imaging device according to claim 1, further comprising
a restoration unit that restores the restored image with a corrected white balance from the detection signal using a restoration matrix.

15. The imaging device according to claim 14, wherein the restoration unit restores the restored image with a corrected white balance from the detection signal by using the restoration matrix with a coefficient corrected by the white balance coefficient.

16. The imaging device according to claim 14, wherein the restoration unit corrects using the white balance coefficient a pixel value of the restored image restored from the detection signal using the restoration matrix, to generate the restored image with a corrected white balance.

17. An imaging method comprising:
capturing an image of an object by an imaging element that includes a plurality of pixel output units that receives incident light that is incident without passing through either of an imaging lens and a pinhole and each outputs one detection signal indicating an output pixel value modulated by an incident angle of the incident light; and on a basis of a detection signal acquired by the image capturing and acquired in the pixel output units of the imaging element, setting a white balance coefficient that is used for correcting a white balance of a restored image restored from the detection signal.

18. An image processing device comprising
a coefficient setting unit that sets a white balance coefficient on a basis of a detection signal acquired by capturing an image of an object by an imaging element that includes a plurality of pixel output units that receives incident light that is incident without passing through either of an imaging lens and a pinhole and each outputs one detection signal indicating an output pixel value modulated by an incident angle of the incident light, in which the detection signal is acquired in the pixel output units, and the white balance coefficient is used for correcting a white balance of a restored image restored from the detection signal.

19. An image processing method comprising
setting a white balance coefficient on a basis of a detection signal acquired by capturing an image of an object by an imaging element that includes a plurality of pixel output units that receives incident light that is incident without passing through either of an imaging lens and a pinhole and each outputs one detection signal indicating an output pixel value modulated by an incident angle of the incident light, in which the detection signal is acquired in the pixel output units, and the white balance coefficient is used for correcting a white balance of a restored image restored from the detection signal.

20. An imaging element comprising:
a plurality of pixel output units that receives incident light that is incident without passing through either of an imaging lens and a pinhole and each outputs one detection signal indicating an output pixel value modulated by an incident angle of the incident light; and a coefficient setting unit that, on a basis of a detection signal acquired in the pixel output units, sets a white balance coefficient that is used for correcting a white balance of a restored image restored from the detection signal.

* * * * *